United States Patent
Sasada et al.

(10) Patent No.: US 11,515,477 B2
(45) Date of Patent: Nov. 29, 2022

(54) LIGHT EMITTING DEVICE HAVING THERMALLY ACTIVATED DELAYED FLUORESCENT (TADF) COMPOUND

(71) Applicant: Sumitomo Chemical Company, Limited, Tokyo (JP)

(72) Inventors: Toshiaki Sasada, Tsukuba (JP); Shin-Ya Tanaka, Tsukuba (JP); Daisuke Fukushima, Tsukuba (JP); Atsushi Asano, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 314 days.

(21) Appl. No.: 16/642,412

(22) PCT Filed: Sep. 6, 2017

(86) PCT No.: PCT/JP2017/032043
§ 371 (c)(1),
(2) Date: Feb. 27, 2020

(87) PCT Pub. No.: WO2019/049225
PCT Pub. Date: Mar. 14, 2019

(65) Prior Publication Data
US 2021/0159416 A1 May 27, 2021

(51) Int. Cl.
*H01L 51/00* (2006.01)
*C09K 11/06* (2006.01)
*H01L 51/50* (2006.01)

(52) U.S. Cl.
CPC .......... *H01L 51/0039* (2013.01); *C09K 11/06* (2013.01); *H01L 51/0043* (2013.01); *H01L 51/0067* (2013.01); *H01L 51/0072* (2013.01); *H01L 51/0085* (2013.01); *C09K 2211/1007* (2013.01); *C09K 2211/1029* (2013.01); *C09K 2211/185* (2013.01); *H01L 51/5016* (2013.01); *H01L 51/5056* (2013.01); *H01L 51/5072* (2013.01); *H01L 51/5088* (2013.01); *H01L 51/5092* (2013.01)

(58) Field of Classification Search
CPC ............. H01L 51/0039; H01L 51/0043; H01L 51/0067; H01L 51/0072; H01L 51/0085; C09K 11/06
See application file for complete search history.

(56) References Cited

U.S. PATENT DOCUMENTS

| | | | |
|---|---|---|---|
| 2012/0199825 A1 | 8/2012 | Soga et al. | |
| 2013/0184458 A1* | 7/2013 | Sawada | C07D 519/00 546/276.7 |
| 2014/0145151 A1* | 5/2014 | Xia | H01L 51/0067 438/46 |
| 2015/0028313 A1* | 1/2015 | Pillow | C08G 61/02 570/183 |
| 2015/0115245 A1* | 4/2015 | Archer | H01L 51/5016 438/46 |
| 2015/0333262 A1* | 11/2015 | Stackhouse | H01L 51/0035 528/8 |
| 2016/0043325 A1 | 2/2016 | Gorohmaru et al. | |
| 2016/0190477 A1 | 6/2016 | Kawakami et al. | |

(Continued)

FOREIGN PATENT DOCUMENTS

| | | |
|---|---|---|
| EP | 3235891 A1 | 10/2017 |
| JP | 2015191978 A | 11/2015 |

(Continued)

OTHER PUBLICATIONS

Int'l Search Report and Written Opinion dated Nov. 28, 2017 in Int'l Application No. PCT/JP2017/032043, English translation of ISR only.
Office Action dated Feb. 20, 2019 in JP Application No. 2017564138.
English Translation of Written Opinion dated Nov. 28, 2017 in Int'l Application No. PCT/JP2017/032043.
Extended European Search Report dated Mar. 22, 2021 in EP Application No. 17924326.6.
Kang et al., "High-performance bipolar host materials for blue TADF devices with excellent external quantum efficiencies," Journal of Materials Chemistry C, vol. 4, pp. 4512-4520 (2016).

(Continued)

*Primary Examiner* — Michael Jung
(74) *Attorney, Agent, or Firm* — Panitch Schwarze Belisario & Nadel LLP

(57) ABSTRACT

A light emitting device having excellent external quantum efficiency contains an anode, a cathode, and two organic layers disposed therebetween. One layer contains a phosphorescent transition metal complex and a low molecular weight compound containing no transition metal, and the second layer contains a crosslinked body of a polymer compound (having an energy level of the lowest triplet excited state of 2.30 eV or more) containing a constitutional unit having a crosslinking group. The low molecular weight compound has formula (T-1) and the absolute value of the difference between the energy levels of the lowest triplet excited state and the lowest singlet excited state is less than 0.25 eV.

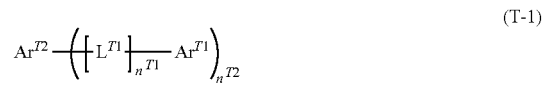

(T-1)

$n^{T1}$ represents an integer of 0 to 5, $n^{T2}$ represents an integer of 1 to 10, $Ar^{T1}$ represents a substituted amino group or a monovalent hetero ring group, $L^{T1}$ represents an alkylene group, and $Ar^{T2}$ represents a hetero ring group.

14 Claims, No Drawings

(56) References Cited

U.S. PATENT DOCUMENTS

| | | |
|---|---|---|
| 2016/0233424 A1* | 8/2016 | Kwong ............... H01L 51/0085 |
| 2017/0117491 A1 | 4/2017 | Sasada et al. |
| 2017/0141328 A1 | 5/2017 | Hayer et al. |
| 2017/0141329 A1 | 5/2017 | Koenen et al. |
| 2017/0186973 A1* | 6/2017 | Ren ..................... C07D 209/86 |
| 2017/0194584 A1 | 7/2017 | Anryu et al. |
| 2017/0250353 A1 | 8/2017 | Koenen et al. |
| 2017/0324044 A1 | 11/2017 | Joosten et al. |
| 2019/0214577 A1* | 7/2019 | Pan ..................... C07D 209/86 |
| 2020/0216480 A1 | 7/2020 | Sasada et al. |

FOREIGN PATENT DOCUMENTS

| | | |
|---|---|---|
| JP | 2016-175849 A | 10/2016 |
| WO | 2011/049241 A1 | 4/2011 |
| WO | 2012096263 A1 | 7/2012 |
| WO | 2015020217 A1 | 2/2015 |
| WO | 2015/156235 A1 | 10/2015 |
| WO | 2015144298 A1 | 10/2015 |
| WO | 2015/186539 A1 | 12/2015 |
| WO | 2015192939 A1 | 12/2015 |
| WO | 2015192941 A1 | 12/2015 |
| WO | 2016000803 A1 | 1/2016 |
| WO | 2016015815 A1 | 2/2016 |
| WO | 2016/125560 A1 | 8/2016 |
| WO | 2017/154882 A1 | 9/2017 |

OTHER PUBLICATIONS

Office Action dated Jul. 26, 2021 in KR Application No. 1020207009438.

* cited by examiner

LIGHT EMITTING DEVICE HAVING THERMALLY ACTIVATED DELAYED FLUORESCENT (TADF) COMPOUND

CROSS-REFERENCE TO RELATED APPLICATIONS

This application is a Section 371 of International Application No. PCT/JP2017/032043, filed Sep. 6, 2017, which was published in the Japanese language on Mar. 14, 2019 under International Publication No. WO 2019/049225 A1, the disclosure of which is incorporated herein by reference in its entirety.

TECHNICAL FIELD

The present invention relates to a light emitting device.

BACKGROUND ART

Organic electroluminescent devices (hereinafter, referred to also as light emitting device) can be suitably used for display and lighting applications, and are being researched and developed. For example, Patent Document 1 describes a light emitting device having an organic layer containing a polymer compound (PO) represented by the following formula and a light emitting layer containing a host material and an iridium complex.

[Chemical Formula 1]

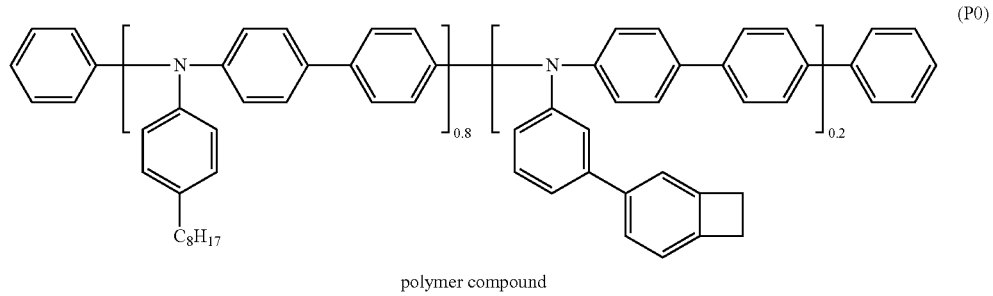

polymer compound (PO)

PRIOR ART DOCUMENT

Patent Document

[Patent Document 1] International Publication WO 2015/020217

SUMMARY OF THE INVENTION

Problem to be Solved by the Invention

However, the above-described light emitting device is not necessarily sufficient in external quantum efficiency.

Then, the present invention has an object of providing a light emitting device excellent in external quantum efficiency.

Means for Solving the Problem

The present invention provides the following [1] to [14].

[1] A light emitting device having an anode, a cathode, a first organic layer disposed between the anode and the cathode, and a second organic layer disposed between the anode and the cathode, wherein the first organic layer is a layer containing a phosphorescent transition metal complex and a low molecular compound satisfying at least one requirement selected from the group consisting of Requirement (I) and Requirement (II) and containing no transition metal, the second organic layer is a layer containing a cross-linked body of a polymer compound containing a constitutional unit having a crosslinking group, and the energy level of the lowest triplet excited state of the polymer compound is 2.30 eV or more:

(I) the absolute value of the difference between the energy level of the lowest triplet excited state and the energy level of the lowest singlet excited state is less than 0.25 eV, (II) represented by the formula (T-1),

[Chemical Formula 2]

(T-1)

[wherein, $n^{T1}$ represents an integer of 0 or more and 5 or less. When a plurality of $n^{T1}$ are present, they may be the same or different.

$n^{T2}$ represents an integer of 1 or more and 10 or less.

$Ar^{T1}$ represents a substituted amino group or a monovalent hetero ring group, and the monovalent hetero ring group is a monovalent hetero ring group containing a nitrogen atom having no double bond in the ring and not containing a group represented by =N—, a group represented by —C(=O)—, a group represented by —S(=O)— and a group represented by —S(=O)$_2$— in the ring, and the foregoing groups optionally have a substituent. When a plurality of $Ar^{T1}$ are present, they may be the same or different.

$L^{T1}$ represents an alkylene group, a cycloalkylene group, an arylene group, a divalent hetero ring group, a group represented by —NR$^{T1'}$—, an oxygen atom or a sulfur atom, and the foregoing groups optionally have a substituent. R$^{T1'}$ represents a hydrogen atom, an alkyl group, a cycloalkyl group, an aryl group or a monovalent hetero ring group, and the foregoing groups optionally have a substituent. When a plurality of $L^{T1}$ are present, they may be the same or different.

$Ar^{T2}$ represents an aromatic hydrocarbon group or a hetero ring group, and the foregoing groups optionally have a substituent.

When all of $Ar^{T1}$ are each a substituted amino group or a group represented by the formula (T1-1A), $Ar^{T2}$ is a monocyclic hetero ring group containing two or more groups represented by =N— in the ring, a condensed-cyclic hetero ring group containing at least one group selected from the group consisting of a group represented by —C(=O)—, a group represented by —S(=O)—, a group represented by —S(=O)$_2$— and a group represented by =N— in the ring, an aromatic hydrocarbon group containing a group represented by —C(=O)— in the ring or an aromatic hydrocarbon group having an electron attracting group, and the foregoing groups optionally have a substituent.]

[Chemical Formula 3]

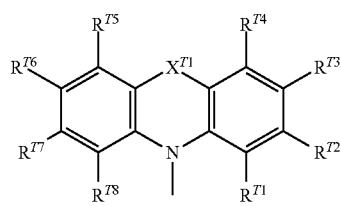

(T1-1A)

[wherein, $X^{T1}$ represents a single bond, an oxygen atom, a sulfur atom, a group represented by —N($R^{XT1}$)— or a group represented by —C($R^{XT1'}$)$_2$—. $R^{XT1}$ and $R^{XT1'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and the foregoing groups optionally have a substituent. A plurality of $R^{XT1'}$ may be the same or different and may be combined together to form a ring together with atoms to which they are attached.

$R^{T1}$, $R^{T2}$, $R^{T3}$, $R^{T4}$, $R^{T5}$, $R^{T6}$, $R^{T7}$ and $R^{T8}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and the foregoing groups optionally have a substituent.].

[2] The light emitting device according to [1], wherein the energy level of the lowest triplet excited state of the above-described polymer compound is 2.34 eV or more.

[3] The light emitting device according to [1] or [2], wherein the above-described crosslinking group is a crosslinking group selected from Group A of crosslinking group:
(Group A of crosslinking group)

[Chemical Formula 4]

 (XL-1)

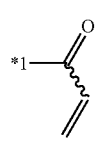 (XL-2)

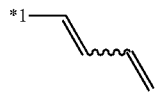 (XL-3)

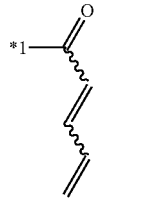 (XL-4)

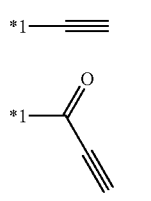 (XL-5)

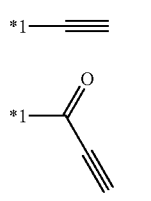 (XL-6)

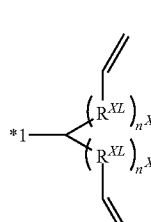 (XL-7)

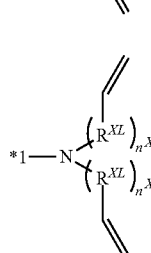 (XL-8)

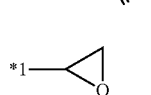 (XL-9)

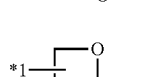 (XL-10)

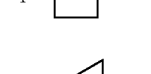 (XL-11)

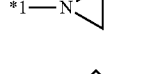 (XL-12)

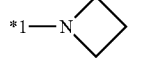 (XL-13)

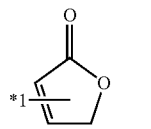 (XL-14)

(XL-15)
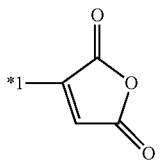

(XL-16)
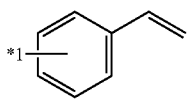

(XL-17)
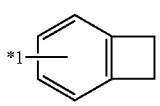

(XL-18)
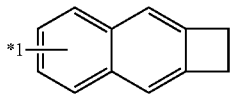

(XL-19)
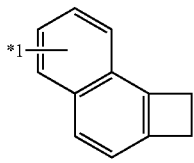

[wherein, $R^{XL}$ represents a methylene group, an oxygen atom or a sulfur atom, and $n^{XL}$ represents an integer of 0 to 5. When a plurality of $R^{XL}$ are present, they may be the same or different. When a plurality of $n^{XL}$ are present, they may be the same or different. *1 represents a binding position. The foregoing crosslinking groups optionally have a substituent, and when a plurality of the substituents are present, they may be combined together to form a ring together with carbon atoms to which they are attached.].

[4] The light emitting device according to [3], wherein the above-described constitutional unit having a crosslinking group is a constitutional unit represented by the formula (2) or the formula (2'):

[Chemical Formula 5]

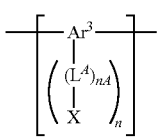
(2)

[wherein,
nA represents an integer of 0 to 5, and n represents 1 or 2. When a plurality of nA are present, they may be the same or different.

$Ar^3$ represents an aromatic hydrocarbon group or a hetero ring group, and the foregoing groups optionally have a substituent.

$L^A$ represents an alkylene group, a cycloalkylene group, an arylene group, a divalent hetero ring group, a group represented by —NR'—, an oxygen atom or a sulfur atom, and the foregoing groups optionally have a substituent. R' represents a hydrogen atom, an alkyl group, a cycloalkyl group, an aryl group or a monovalent hetero ring group, and the foregoing groups optionally have a substituent. When a plurality of $L^A$ are present, they may be the same or different.

X represents a crosslinking group selected from the above-described Group A of crosslinking group. When a plurality of X are present, they may be the same or different.]

[Chemical Formula 6]

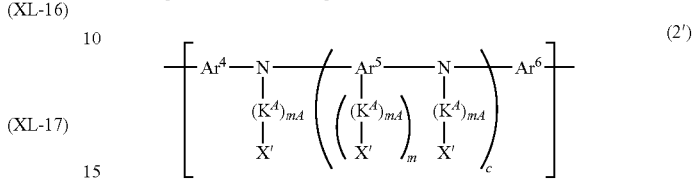
(2')

[wherein,
mA represents an integer of 0 to 5, m represents an integer of 1 to 4 and c represents 0 or 1. When a plurality of mA are present, they may be the same or different.

$Ar^5$ represents an aromatic hydrocarbon group, a hetero ring group or a group in which at least one aromatic hydrocarbon ring and at least one hetero ring are bonded directly, and the foregoing groups optionally have a substituent.

$Ar^4$ and $Ar^6$ each independently represent an arylene group or a divalent hetero ring group, and the foregoing groups optionally have a substituent.

$Ar^4$, $Ar^5$ and $Ar^6$ may be bonded directly or via an oxygen atom or a sulfur atom to groups other than these groups bonded to a nitrogen atom to which these groups are attached, to form a ring, respectively.

$K^A$ represents an alkylene group, a cycloalkylene group, an arylene group, a divalent hetero ring group, a group represented by —NR'—, an oxygen atom or a sulfur atom, and the foregoing groups optionally have a substituent. R' represents the same meaning as described above. When a plurality of $K^A$ are present, they may be the same or different.

X' represents a crosslinking group selected from the above-described Group A of crosslinking group, a hydrogen atom, an alkyl group, a cycloalkyl group, an aryl group or a monovalent hetero ring group, and the foregoing groups optionally have a substituent. When a plurality of X' are present, they may be the same or different. At least one X' is a crosslinking group selected from the above-described Group A of crosslinking group.].

[5] The light emitting device according to any one of [1] to [4], wherein at least one of the above-described $Ar^{T1}$ is a group represented by the formula (T1-1):

[Chemical Formula 7]

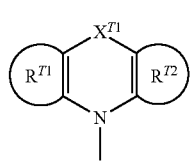
(T1-1)

[wherein,
$X^{T1}$ represents the same meaning as described above.
Ring $R^{T1}$ and Ring $R^{T2}$ each independently represent an aromatic hydrocarbon ring not containing a group represented by —C(=O)— in the ring or a hetero ring not containing a group represented by =N—, a group represented by —C(=O)—, a group represented by —S(=O)— and a group represented by —S(=O)$_2$— in the ring, and the foregoing rings optionally have a substituent.].

[6] The light emitting device according to [5], wherein the above-described group represented by the formula (T1-1) is a group represented by the formula (T1-1A), the formula (T1-1B), the formula (T1-1C) or the formula (T1-1D):

[Chemical Formula 8]

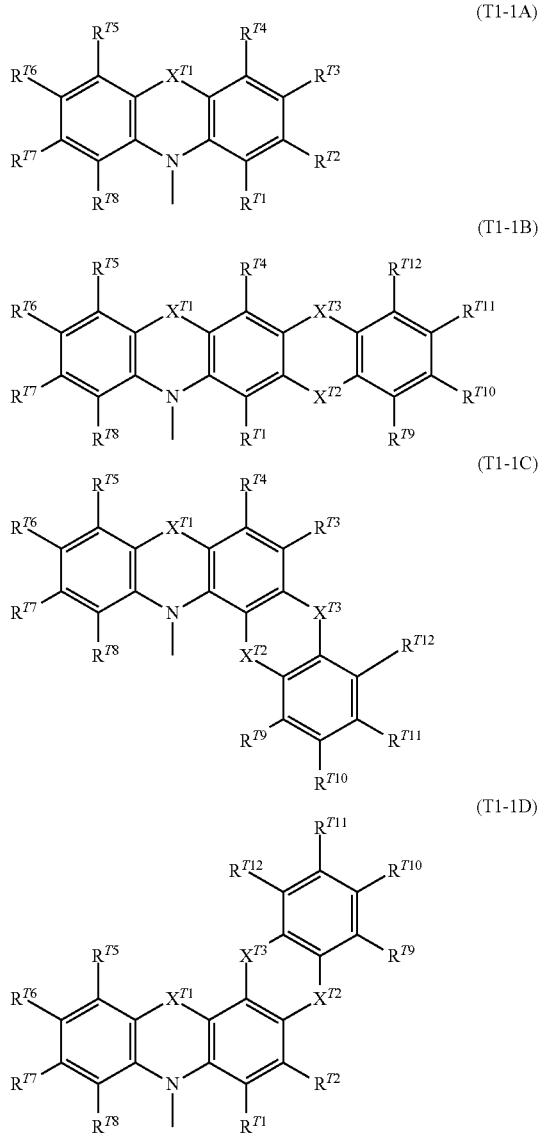

[wherein, $X^{T1}$ represents the same meaning as described above.

$X^{T2}$ and $X^{T3}$ each independently represent a single bond, an oxygen atom, a sulfur atom, a group represented by —N(R$^{XT2}$)— or a group represented by —C(R$^{XT2'}$)$_2$—. R$^{XT2}$ and R$^{XT2'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and the foregoing groups optionally have a substituent. A plurality of R$^{XT2'}$ may be the same or different and may be combined together to form a ring together with atoms to which they are attached.

$R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and the foregoing groups optionally have a substituent.].

[7] The light emitting device according to any one of [1] to [6], wherein the above-described Ar$^{T2}$ is a monocyclic hetero ring group containing two or more groups represented by =N— in the ring and optionally having a substituent.

[8] The light emitting device according to any one of [1] to [7], wherein the above-described low molecular compound containing no transition metal satisfies the above-described Requirement (I) and the above-described Requirement (II).

[9] The light emitting device according to any one of [1] to [8], wherein the above-described phosphorescent transition metal complex is a metal complex represented by the formula (1):

[Chemical Formula 9]

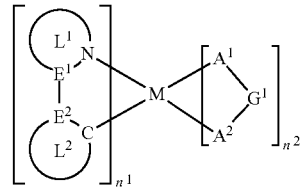

[wherein,

M represents a ruthenium atom, a rhodium atom, a palladium atom, an iridium atom or a platinum atom.

n$^1$ represents an integer of 1 or more, and n$^2$ represents an integer of 0 or more. n$^1$+n$^2$ is 3 when M is a ruthenium atom, a rhodium atom or an iridium atom, while n$^1$+n$^1$ is 2 when M is a palladium atom or a platinum atom.

E$^1$ and E$^2$ each independently represent a carbon atom or a nitrogen atom. At least one of E$^1$ and E$^2$ is a carbon atom. When a plurality of E$^1$ and E$^2$ are present, they may be the same or different at each occurrence.

Ring L$^1$ represents an aromatic hetero ring, and this ring optionally has a substituent. When a plurality of the substituents are present, they may be combined together to form a ring together with atoms to which they are attached. When a plurality of Ring L$^1$ are present, they may be the same or different.

Ring L$^1$ represents an aromatic hydrocarbon ring or an aromatic hetero ring, and the foregoing rings optionally have a substituent. When a plurality of the substituents are present, they may be combined together to form a ring together with atoms to which they are attached. When a plurality of Ring L$^2$ are present, they may be the same or different.

The substituent which Ring L$^1$ optionally has and the substituent which Ring L$^2$ optionally has may be combined together to form a ring together with atoms to which they are attached.

A$^1$-G$^1$-A$^2$ represents an anionic bidentate ligand. A$^1$ and A$^2$ each independently represent a carbon atom, an oxygen atom or a nitrogen atom, and these atoms may be ring-constituent atoms. G$^1$ represents a single bond or an atomic group constituting a bidentate ligand together with $A^1$ and $A^2$. When a plurality of $A^1$-$G^1$-$A^2$ are present, they may be the same or different.].

[10] The light emitting device according to [9], wherein the above-described metal complex represented by the formula (1) is a metal complex represented by the formula (1-A):

[Chemical Formula 10]

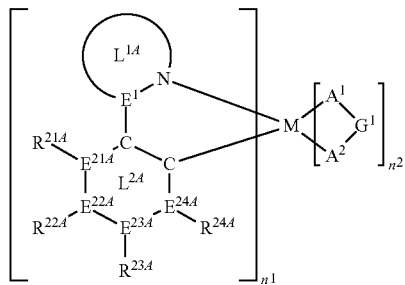

(1-A)

[wherein,

M, $n^1$, $n^2$, $E^1$ and $A^1$-$G^1$-$A^2$ represent the same meaning as described above.

Ring $L^{1A}$ represents a pyridine ring, a diazabenzene ring, an azanaphthalene ring, a diazanaphthalene ring, a triazole ring or a diazole ring, and the foregoing rings optionally have a substituent. When a plurality of the substituents are present, they may be combined together to form a ring together with atoms to which they are attached. When a plurality of Ring $L^{1A}$ are present, they may be the same or different.

$E^{21A}$, $E^{22A}$, $E^{23A}$ and $E^{24A}$ each independently represent a nitrogen atom or a carbon atom. When a plurality of $E^{21A}$, $E^{22A}$, $E^{23A}$ and $E^{24A}$ are present, they may be the same or different at each occurrence. When $E^{21A}$ is a nitrogen atom, $R^{21A}$ is absent. When $E^{22A}$ is a nitrogen atom, $R^{22A}$ is absent. When $E^{23A}$ is a nitrogen atom, $R^{23A}$ is absent. When $E^{24A}$ is a nitrogen atom, $R^{24A}$ is absent.

$R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and the foregoing groups optionally have a substituent. When a plurality of $R^{21A}$, $R^{22A}$, $R^{23A}$ and $R^{24A}$ are present, they may be the same or different at each occurrence. $R^{21A}$ and $R^{22A}$, $R^{22A}$ and $R^{23A}$, $R^{23A}$ and $R^{24A}$, and a substituent which Ring $L^{1A}$ optionally has and $R^{21A}$ each may be combined together to form a ring together with atoms to which they are attached.

Ring $L^{2A}$ represents a benzene ring, a pyridine ring or a diazabenzene ring.].

[11] The light emitting device according to [10], wherein the above-described metal complex represented by the formula (1-A) is a metal complex represented by the formula (1-B1), the formula (1-B2), the formula (1-B3), the formula (1-B4) or the formula (1-B5):

[Chemical Formula 11]

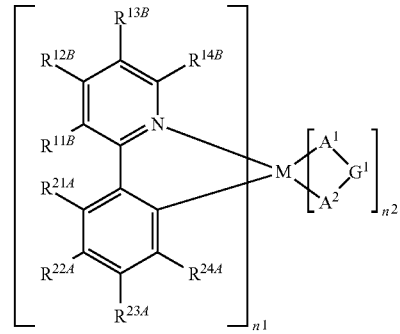

(1-B1)

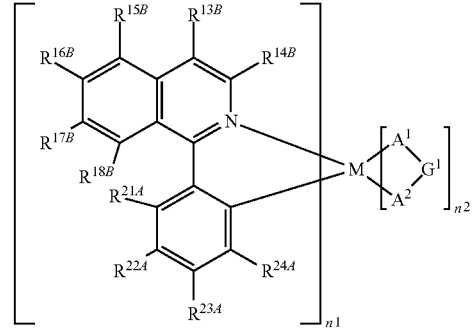

(1-B2)

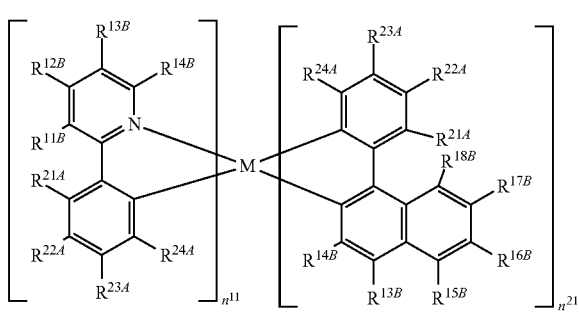

(1-B3)

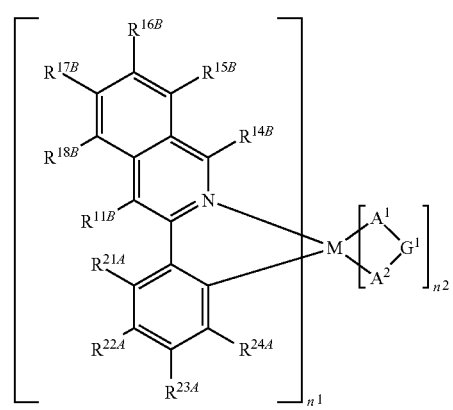

(1-B4)

-continued (1-B5)

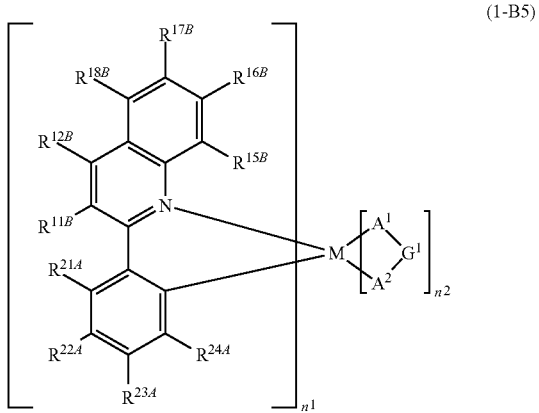

[wherein,

M, $n^1$, $n^2$, $R^{21A}$, $R^{22A}$, $R^{23A}$, $R^{24A}$ and $A^1$-$G^1$-$A^2$ represent the same meaning as described above.

$n^{11}$ and $n^{12}$ each independently represent 1 or 2. $n^{11}+n^{12}$ is 3 when M is a ruthenium atom, a rhodium atom or an iridium atom, while $n^{11}+n^{12}$ is 2 when M is a palladium atom or a platinum atom.

$R^{11B}$, $R^{12B}$, $R^{13B}$, $R^{14B}$, $R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and the foregoing groups optionally have a substituent. When a plurality of $R^{11B}$, $R^{12B}$, $R^{13B}$, $R^{14B}$, $R^{15B}$, $R^{16B}$, $R^{17B}$ and $R^{18B}$ are present, they may be the same or different at each occurrence.

In the formula (1-B1), $R^{11B}$ and $R^{12B}$, $R^{12B}$ and $R^{13B}$, $R^{13B}$ and $R^{14B}$, and, $R^{11B}$ and $R^{21A}$ each may be combined together to form a ring together with atoms to which they are attached. In the formula (1-B2), $R^{13B}$ and $R^{14B}$, $R^{13B}$ and $R^{15B}$, $R^{15B}$ and $R^{16B}$, $R^{16B}$ and $R^{17B}$, $R^{17B}$ and $R^{18B}$, and, RIB and $R^{21A}$ each may be combined together to form a ring together with atoms to which they are attached. In the formula (1-B3), $R^{11B}$ and $R^{12B}$, $R^{12B}$ and $R^{13B}$, $R^{13B}$ and $R^{14B}$, $R^{11B}$ and $R^{21A}$, $R^{13B}$ and $R^{15B}$, $R^{15B}$ and $R^{16B}$ and $R^{17B}$, $R^{17B}$ and $R^{18B}$, and, $R^{15B}$ and $R^{21A}$ each may be combined together to form a ring together with atoms to which they are attached. In the formula (1-B4), $R^{11B}$ and $R^{18B}$, $R^{14B}$ and $R^{15B}$, $R^{15B}$ and $R^{16B}$ and $R^{17B}$, $R^{17B}$ and $R^{18B}$, and, $R^{11B}$ and $R^{21A}$ each may be combined together to form a ring together with atoms to which they are attached. In the formula (1-B5), $R^{11B}$ and $R^{12B}$, $R^{12B}$ and $R^{18B}$, $R^{15B}$ and $R^{16B}$, $R^{16B}$ and $R^{17B}$, $R^{17B}$ and $R^{18B}$, and, $R^{11B}$ and $R^{21A}$ each may be combined together to form a ring together with atoms to which they are attached.].

[12] The light emitting device according to any one of [1] to [11], wherein the above-described first organic layer further contains at least one selected from the group consisting of a hole transporting material, a hole injection material, an electron transporting material, an electron injection material, a fluorescent compound and an antioxidant.

[13] The light emitting device according to any one of [1] to [12], wherein the above-described first organic layer and the above-described second organic layer are adjacent.

[14] The light emitting device according to any one of [1] to [13], wherein the above-described second organic layer is a layer disposed between the above-described anode and the above-described first organic layer.

Effect of the Invention

According to the present invention, a light emitting device excellent in external quantum efficiency can be provided.

MODES FOR CARRYING OUT THE INVENTION

Suitable embodiments of the present invention will be illustrated in detail below.

Explanation of Common Terms

Terms commonly used in the present specification have the following meanings unless otherwise stated.

Me represents a methyl group, Et represents an ethyl group, Bu represents a butyl group, i-Pr represents an isopropyl group and t-Bu represents a tert-butyl group.

A hydrogen atom may be a heavy hydrogen atom or a light hydrogen atom.

In the formula representing a metal complex, the solid line representing a bond with the central metal means a covalent bond or a coordination bond.

"Polymer compound" means a polymer having molecular weight distribution and having a polystyrene-equivalent number-average molecular weight of $1\times10^3$ to $1\times10^8$.

The polymer compound may be any of a block copolymer, a random copolymer, an alternating copolymer and a graft copolymer, and may also be another form.

The end group of the polymer compound is preferably a stable group since if a polymerization active group remains intact there, there is a possibility of a decrease in a light emitting property or luminance life when the polymer compound is used for fabrication of a light emitting device. The end group of the polymer compound is preferably a group conjugatively bonded to the main chain and includes, for example, an aryl group or a monovalent hetero ring group bonding to the main chain of the polymer compound via a carbon-carbon bond.

"Low molecular compound" means a compound having no molecular weight distribution and having a molecular weight of $1\times10^4$ or less.

"Constitutional unit" means a unit occurring once or more times in the polymer compound.

"Alkyl group" may be any of linear and branched. The number of carbon atoms of the linear alkyl group, not including the number of carbon atoms of the substituent, is usually 1 to 50, preferably 3 to 30, more preferably 4 to 20. The number of carbon atoms of the branched alkyl group, not including the number of carbon atoms of the substituent, is usually 3 to 50, preferably 3 to 30, more preferably 4 to 20.

The alkyl group optionally has a substituent and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom and the like (for example, a trifluoromethyl group, a pentafluoroethyl group, a perfluorobutyl group, a perfluorohexyl group, a perfluorooctyl group, a 3-phenylpropyl group, a 3 (4-methylphenyl)propyl group, a 3 (3,5-di-hexylphenyl)propyl group, a 6-ethyloxyhexyl group).

The number of carbon atoms of "cycloalkyl group", not including the number of carbon atoms of the substituent, is usually 3 to 50, preferably 3 to 30, more preferably 4 to 20.

The cycloalkyl group optionally has a substituent and examples thereof include a cyclohexyl group, a cyclohexylmethyl group and a cyclohexylethyl group.

"Aryl group" means an atomic group remaining after removing from an aromatic hydrocarbon one hydrogen atom bonding directly to a carbon atom constituting the ring. The number of carbon atoms of the aryl group, not including the number of carbon atoms of the substituent, is usually 6 to 60, preferably 6 to 20, more preferably 6 to 10.

The aryl group optionally has a substituent and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom in these groups with an alkyl group, a cycloalkyl group, an alkoxy group, a cycloalkoxy group, an aryl group, a fluorine atom and the like.

"Alkoxy group" may be any of linear and branched. The number of carbon atoms of the linear alkoxy group, not including the number of carbon atoms of the substituent, is usually 1 to 40, preferably 4 to 10. The number of carbon atoms of the branched alkoxy group, not including the number of carbon atoms of the substituent, is usually 3 to 40, preferably 4 to 10.

The alkoxy group optionally has a substituent and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of the "cycloalkoxy group", not including the number of carbon atoms of the substituent, is usually 3 to 40, preferably 4 to 10.

The cycloalkoxy group optionally has a substituent and examples thereof include a cyclohexyloxy group.

The number of carbon atoms of the "aryloxy group", not including the number of carbon atoms of the substituent, is usually 6 to 60, preferably 6 to 48.

The aryloxy group optionally has a substituent and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom in these groups with an alkyl group, a cycloalkyl group, an alkoxy group, a cycloalkoxy group, a fluorine atom or the like.

"p-valent hetero ring group" (p represents an integer of 1 or more) means an atomic group remaining after removing from a heterocyclic compound p hydrogen atoms among hydrogen atoms bonding directly to carbon atoms or hetero atoms constituting the ring. Of the p-valent hetero ring groups, "p-valent aromatic hetero ring group" as an atomic group remaining after removing from an aromatic heterocyclic compound p hydrogen atoms among hydrogen atoms bonding directly to carbon atoms or hetero atoms constituting the ring is preferable.

"Aromatic heterocyclic compound" means a compound in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and a compound in which an aromatic ring is condensed to the hetero ring even if the hetero ring itself shows no aromaticity such as phenoxazine, phenothiazine, dibenzoborole, dibenzosilole, benzopyran and the like.

The number of carbon atoms of the monovalent hetero ring group, not including the number of carbon atoms of the substituent, is usually 2 to 60, preferably 4 to 20.

The monovalent hetero ring group optionally has a substituent and examples thereof include a thienyl group, a pyrrolyl group, a furyl group, a pyridinyl group, a piperidinyl group, a quinolinyl group, an isoquinolinyl group, a pyrimidinyl group and a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferred. The substituent which the amino group has is preferably an alkyl group, a cycloalkyl group, an aryl group or a monovalent hetero ring group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl)amino group and a bis(3,5-di-tert-butylphenyl)amino group.

"Alkenyl group" may be any of linear and branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of the "cycloalkenyl group", not including the number of carbon atoms of the substituent, is usually 3 to 30, preferably 4 to 20.

The alkenyl group and the cycloalkenyl group optionally have a substituent and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

"Alkynyl group" may be any of linear and branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of the "cycloalkynyl group", not including the number of carbon atoms of the substituent, is usually 4 to 30, preferably 4 to 20.

The alkynyl group and the cycloalkynyl group optionally have a substituent and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

"Arylene group" means an atomic group remaining after removing from an aromatic hydrocarbon two hydrogen atoms bonding directly to carbon atoms constituting the ring. The number of carbon atoms of the arylene group, not including the number of carbon atoms of the substituent, is usually 6 to 60, preferably 6 to 30, more preferably 6 to 18.

The arylene group optionally has a substituent and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, and groups represented by the formula (A-1) to the formula (A-20) are preferable. The arylene group includes groups obtained by bonding a plurality of these groups.

[Chemical Formula 12]

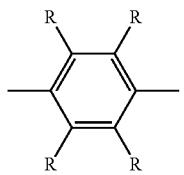
(A-1)

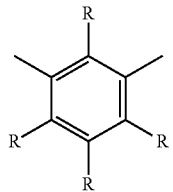
(A-2)

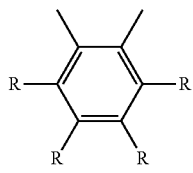
(A-3)

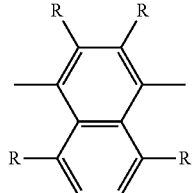
(A-4)

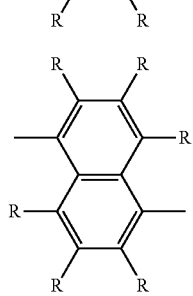
(A-5)

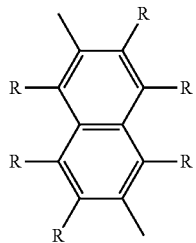
(A-6)

[Chemical Formula 13]

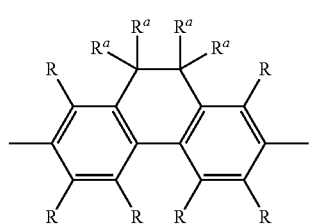
(A-7)

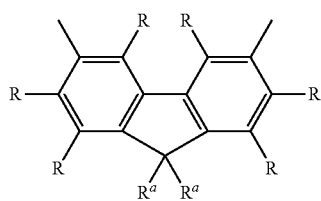
(A-8)

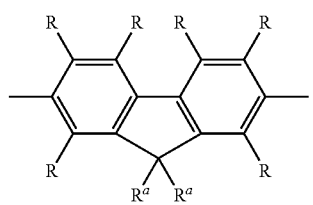
(A-9)

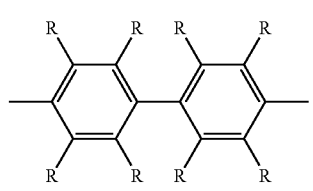
(A-10)

[Chemical Formula 14]

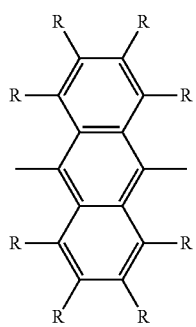
(A-11)

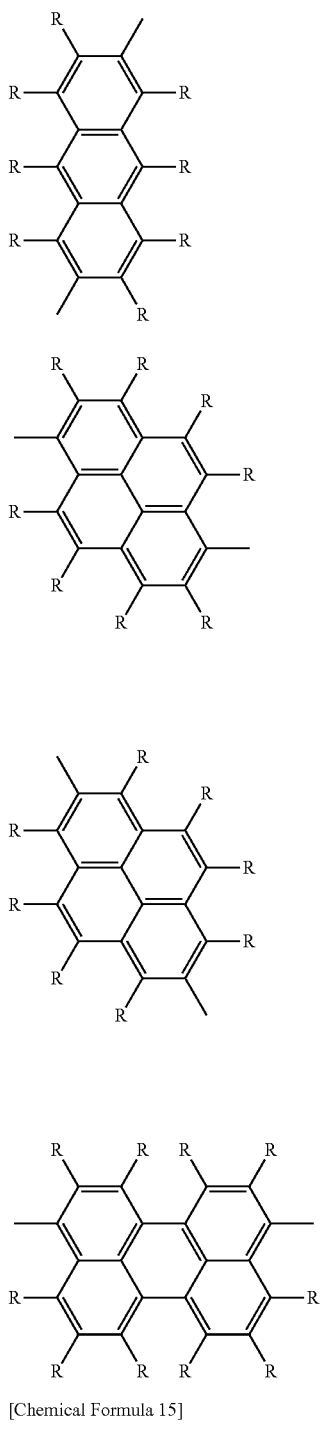

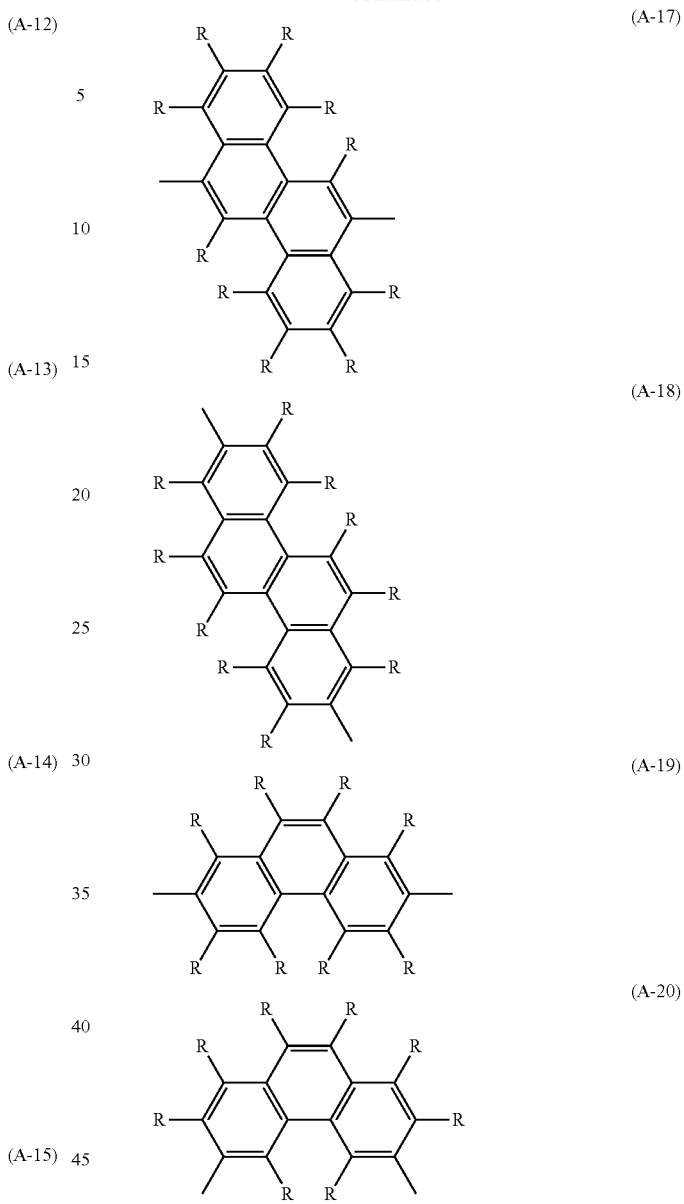

[wherein, R and $R^a$ each independently represent a hydrogen atom, an alkyl group, a cycloalkyl group, an aryl group or a monovalent hetero ring group. A plurality of R and $R^a$ each may be the same or different, and the plurality of $R^a$ may be combined together to form a ring together with atoms to which they are attached.]

The number of carbon atoms of the divalent hetero ring group, not including the number of carbon atoms of the substituent, is usually 2 to 60, preferably 3 to 20, more preferably 4 to 15.

The divalent hetero ring group optionally has a substituent and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, preferably groups represented by the formula (AA-1) to the formula (AA-34). The divalent hetero ring group includes groups obtained by bonding a plurality of these groups.
[Chemical Formula 16]
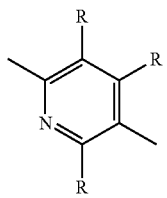
(AA-1)
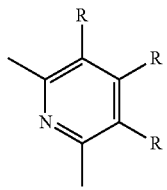
(AA-2)
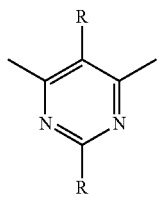
(AA-3)
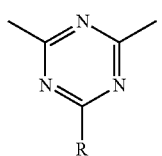
(AA-4)
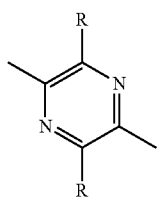
(AA-5)
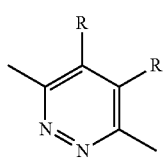
(AA-6)
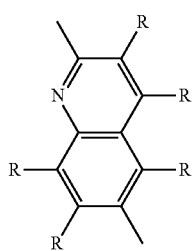
(AA-7)
[Chemical Formula 17]
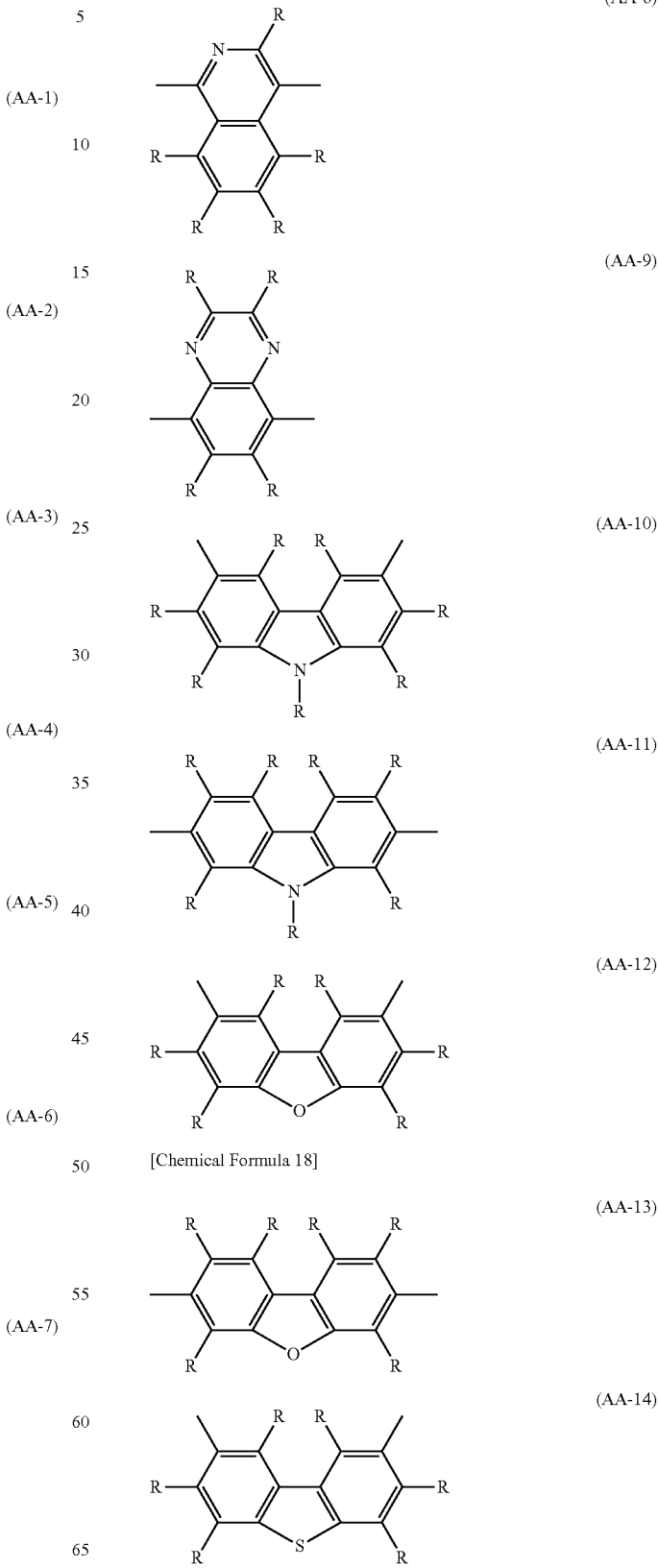

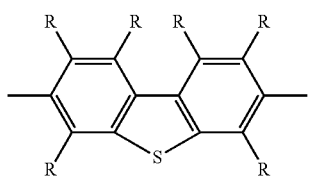 (AA-15)
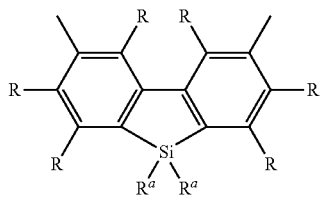 (AA-16)
[Chemical Formula 19]
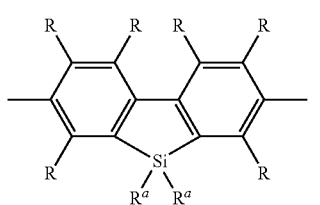 (AA-17)
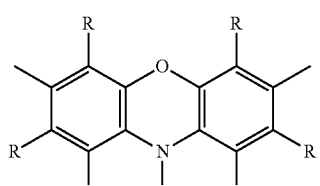 (AA-18)
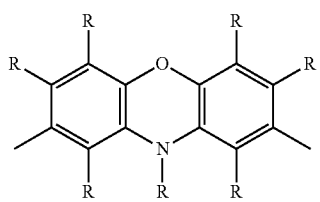 (AA-19)
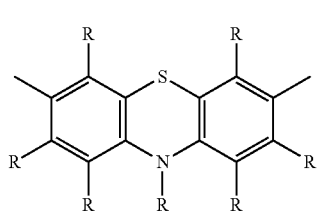 (AA-20)
[Chemical Formula 20]
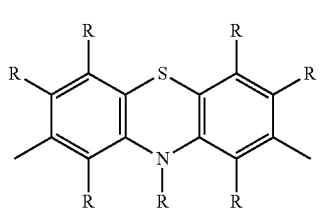 (AA-21)
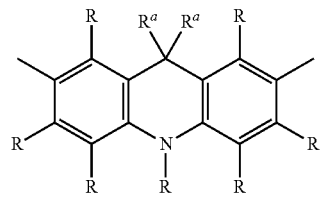 (AA-22)
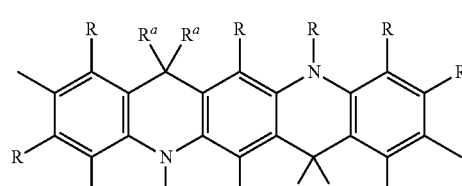 (AA-23)
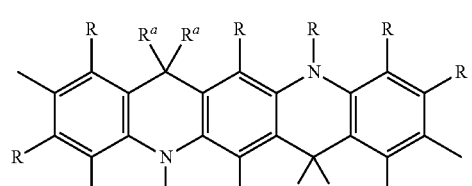 (AA-24)
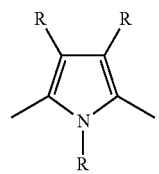 (AA-25)
[Chemical Formula 21]
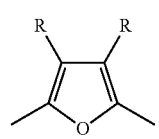 (AA-26)
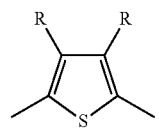 (AA-27)
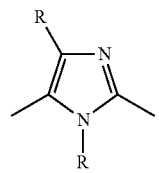 (AA-28)
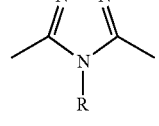 (AA-29)
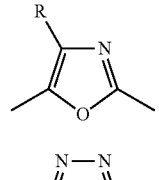 (AA-30)
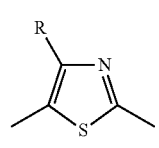 (AA-31)

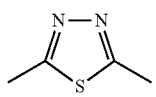
(AA-32)

[Chemical Formula 22]

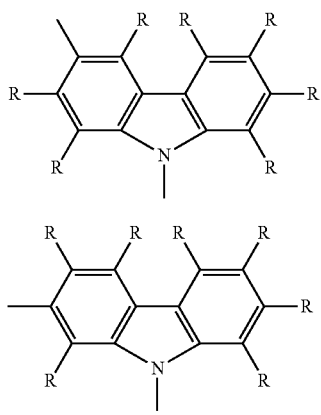
(AA-33)

(AA-34)

[wherein, R and $R^a$ represent the same meaning as described above.]

"Crosslinking group" refers to a group capable of generating a new bond by being subjected to a heating treatment, an ultraviolet irradiation treatment, a near-ultraviolet irradiation treatment, a visible light irradiation treatment, an infrared irradiation treatment, a radical reaction and the like, preferably includes crosslinking groups represented by the formula (XL-1) to the formula (XL-19) in Group A of crosslinking group.

"Substituent" denotes a halogen atom, a cyano group, an alkyl group, a cycloalkyl group, an aryl group, a monovalent hetero ring group, an alkoxy group, a cycloalkoxy group, an aryloxy group, an amino group, a substituted amino group, an alkenyl group, a cycloalkenyl group, an alkynyl group or a cycloalkynyl group. The substituent may also be a crosslinking group.

<Light Emitting Device>

The light emitting device of the present invention is a light emitting device having an anode, a cathode, a first organic layer disposed between the anode and the cathode, and a second organic layer disposed between the anode and the cathode, wherein the first organic layer is a layer containing a phosphorescent transition metal complex and a low molecular compound satisfying at least one requirement selected from the group consisting of Requirement (I) and Requirement (II) and containing no transition metal, the second organic layer is a layer containing a cross-linked body of a polymer compound containing a constitutional unit having a crosslinking group, and the energy level of the lowest triplet excited state of the polymer compound is 2.30 eV or more.

The method for forming the first organic layer and the second organic layer includes, for example, dry methods such as a vacuum vapor deposition method and the like and wet methods such as a spin coat method, an inkjet printing method and the like, and wet methods are preferable.

When the first organic layer is formed by a wet method, it is preferable to use a first ink described later.

When the second organic layer is formed by a wet method, it is preferable to use a second ink described later.

After formation of the second organic layer, a polymer compound containing a constitutional unit having a cross-linking group contained in the second organic layer can be crosslinked by heating or light irradiation. It is preferable that, after formation of the second organic layer, a polymer compound containing a constitutional unit having a cross-linking group contained in the second organic layer is crosslinked by heating. Since the second organic layer contains a polymer compound containing a constitutional unit having a crosslinking group in cross-linked state (cross-linked body of a polymer compound containing a constitutional unit having a crosslinking group), the second organic layer is substantially insolubilized in a solvent. Hence, the second organic layer can be suitably used for lamination of a light emitting device.

The temperature of heating for causing crosslinking is usually 25° C. to 300° C., preferably 50° C. to 260° C., more preferably 130° C. to 230° C., further preferably 180° C. to 210° C.

The time of heating is usually 0.1 minute to 1000 minutes, preferably 0.5 minutes to 500 minutes, more preferably 1 minute to 120 minutes, further preferably 10 minutes to 60 minutes.

The kind of the light used for irradiation includes, for example, ultraviolet, near-ultraviolet and visible light.

The method for analyzing components contained in the first organic layer and the second organic layer includes, for example, chemical separation and analysis methods such as extraction and the like, instrumental analysis methods such as infrared spectroscopy (IR), nuclear magnetic resonance spectroscopy (NMR), mass spectrometry (MS) and the like, and analysis methods combining chemical separation and analysis methods with instrumental analysis methods.

By performing solid-liquid extraction on the first organic layer and the second organic layer using an organic solvent such as toluene, xylene, chloroform, tetrahydrofuran and the like, the components can be separated into components substantially insoluble in an organic solvent (insoluble component) and components soluble in an organic solvent (soluble component). The insoluble component can be analyzed by infrared spectroscopy or nuclear magnetic resonance spectroscopy and the soluble component can be analyzed by nuclear magnetic resonance spectroscopy or mass spectrometry.

<Phosphorescent Transition Metal Complex>

The phosphorescent transition metal complex contained in the first organic layer in the light emitting device of the present invention will be explained.

"Phosphorescent transition metal complex" means usually a compound showing phosphorescence at room temperature (25° C.), preferably a metal complex showing light emission from triplet excited state at room temperature. This metal complex showing light emission from triplet excited state has a central metal atom and a ligand.

The central metal atom includes, for example, metal atoms having an atomic number of 40 or more, having the spin-orbital interaction to the complex and capable of causing intersystem crossing between singlet state and triplet state. The metal atom includes, for example, a ruthenium atom, a rhodium atom, a palladium atom, an iridium atom and a platinum atom, and is preferably an iridium atom or a platinum atom, since the light emitting device of the present invention is more excellent in external quantum efficiency.

The ligand includes neutral or anionic monodentate ligands or neutral or anionic polydentate ligands forming at least one bond selected from the group consisting of a coordination bond and a covalent bond with a central metal atom. The bond between a central metal atom and a ligand includes, for example, a metal-nitrogen bond, a metal-carbon bond, a metal-oxygen bond, a metal-phosphorus bond, a metal-sulfur bond and a metal-halogen bond. The polydentate ligand means usually a bidentate or more and hexadentate or less ligand.

[Metal Complex Represented by the Formula (1)]

The phosphorescent transition metal complex is preferably a metal complex represented by the formula (1), since the light emitting device of the present invention is more excellent in external quantum efficiency.

M is preferably an iridium atom or a platinum atom, more preferably an iridium atom, since the light emitting device of the present invention is more excellent in external quantum efficiency.

When M is a ruthenium atom, a rhodium atom or an iridium atom, $n^1$ is preferably 2 or 3, more preferably 3.

When M is a palladium atom or a platinum atom, $n^1$ is preferably 2.

$E^1$ and $E^2$ are each preferably a carbon atom.

The number of carbon atoms of the aromatic hetero ring represented by Ring $L^1$, not including the number of carbon atoms of the substituent, is usually 2 to 60, preferably 3 to 30, more preferably 4 to 15. Ring $L^1$ is preferably a 5-membered aromatic hetero ring or a 6-membered aromatic hetero ring, more preferably a 5-membered aromatic hetero ring having two or more and four or less nitrogen atoms as a constituent atom or a 6-membered aromatic hetero ring having one or more and four or less nitrogen atoms as a constituent atom, and the foregoing rings optionally have a substituent. When Ring $L^1$ is a 6-membered aromatic hetero ring, $E^1$ is preferably a carbon atom.

Ring $L^1$ includes, for example, a diazole ring, a triazole ring, a tetrazole ring, a pyridine ring, a diazabenzene ring, a triazine ring, an azanaphthalene ring and a diazanaphthalene ring, and is preferably a pyridine ring, a diazabenzene ring, an azanaphthalene ring, a diazanaphthalene ring, a triazole ring or a diazole ring, more preferably a pyridine ring, a diazabenzene ring, an azanaphthalene ring or a diazanaphthalene ring, further preferably a pyridine ring, a quinoline ring or an isoquinoline ring, and the foregoing rings optionally have a substituent.

The number of carbon atoms of the aromatic hydrocarbon ring represented by Ring $L^2$, not including the number of carbon atoms of the substituent, is usually 6 to 60, preferably 6 to 30, more preferably 6 to 18. The aromatic hydrocarbon ring represented by Ring $L^2$ includes a benzene ring, a naphthalene ring, an indene ring, a fluorene ring, a phenanthrene ring, a dihydrophenanthrene ring and rings obtained by condensing two or more and five or less these rings, and since the light emitting device of the present invention is more excellent in external quantum efficiency, it is preferably a benzene ring, a naphthalene ring, a fluorene ring, a phenanthrene ring or a dihydrophenanthrene ring, more preferably a benzene ring, a fluorene ring or a dihydrophenanthrene ring, further preferably a benzene ring, and the foregoing rings optionally have a substituent.

The number of carbon atoms of the aromatic hetero ring represented by Ring $L^2$, not including the number of carbon atoms of the substituent, is usually 2 to 60, preferably 3 to 30, more preferably 4 to 15. The aromatic hetero ring represented by Ring $L^2$ includes a pyrrole ring, a diazole ring, a furan ring, a thiophene ring, a pyridine ring, a diazabenzene ring and rings obtained by condensing one or more and five or less aromatic rings to these rings, and since the light emitting device of the present invention is more excellent in external quantum efficiency, it is preferably a pyridine ring, a diazabenzene ring, an azanaphthalene ring, a diazanaphthalene ring, an indole ring, a benzofuran ring, a benzothiophene ring, a carbazole ring, an azacarbazole ring, a diazacarbazole ring, a dibenzofuran ring or a dibenzothiophene ring, more preferably a pyridine ring, a diazabenzene ring, a carbazole ring, a dibenzofuran ring or a dibenzothiophene ring, further preferably a pyridine ring or a diazabenzene ring, and the foregoing rings optionally have a substituent. When Ring $L^2$ is a 6-membered aromatic hetero ring, $E^2$ is preferably a carbon atom.

Ring $L^2$ is preferably a benzene ring, a fluorene ring, a dihydrophenanthrene ring, a pyridine ring, a diazabenzene ring, a carbazole ring, a dibenzofuran ring or a dibenzothiophene ring, more preferably a benzene ring, a pyridine ring or a diazabenzene ring, further preferably a benzene ring, and the foregoing rings optionally have a substituent, since the light emitting device of the present invention is further excellent in external quantum efficiency.

The substituent which Ring $L^1$ and Ring $L^2$ optionally have is preferably an alkyl group, a cycloalkyl group, an alkoxy group, a cycloalkoxy group, an aryl group, an aryloxy group, a monovalent hetero ring group, a substituted amino group or a halogen atom, more preferably an alkyl group, a cycloalkyl group, an aryl group, a monovalent hetero ring group or a substituted amino group, further preferably an alkyl group, an aryl group or a monovalent hetero ring group, particularly preferably an aryl group or a monovalent hetero ring group, and the foregoing groups optionally further have a substituent.

In the metal complex represented by the formula (1), at least one of Ring $L^1$ and Ring $L^2$ preferably has a substituent, since the light emitting device of the present invention is more excellent in external quantum efficiency.

The aryl group as the substituent which Ring $L^1$ and Ring $L^2$ optionally have is preferably a phenyl group, a naphthyl group, a phenanthrenyl group, a dihydrophenanthrenyl group or a fluorenyl group, more preferably a phenyl group or a fluorenyl group, further preferably a phenyl group, and the foregoing groups optionally have a substituent.

The monovalent hetero ring group as the substituent which Ring $L^1$ and Ring $L^2$ optionally have is preferably a pyridyl group, a pyrimidinyl group, a triazinyl group, a quinolinyl group, an isoquinolinyl group, a dibenzofuranyl group, a dibenzothienyl group, a carbazolyl group, an azacarbazolyl group, a diazacarbazolyl group, a phenoxazinyl group or a phenothiazinyl group, more preferably a pyridyl group, a pyrimidinyl group, a triazinyl group, a dibenzofuranyl group, a dibenzothienyl group or a carbazolyl group, further preferably a pyridyl group, a pyrimidinyl group or a triazinyl group, and the foregoing groups optionally have a substituent.

In the substituted amino group as the substituent which Ring $L^1$ and Ring $L^2$ optionally have, the substituent which the amino group has is preferably an aryl group or a monovalent hetero ring group, more preferably an aryl group, and the foregoing groups optionally further have a substituent. The examples and preferable range of the aryl group as the substituent which the amino group has are the same as the examples and preferable range of the aryl group as the substituent which Ring $L^1$ and Ring $L^2$ optionally have. The examples and preferable range of the monovalent hetero ring group as the substituent which the amino group has are the same as the examples and preferable range of the monovalent hetero ring group as the substituent which Ring $L^1$ and Ring $L^2$ optionally have.

The substituent which the substituent which Ring $L^1$ and Ring $L^2$ optionally have optionally further has is preferably an alkyl group, a cycloalkyl group, an aryl group, a monovalent hetero ring group or a substituted amino group, more preferably an alkyl group, a cycloalkyl group or an aryl group, further preferably an alkyl group, and the foregoing groups optionally further have a substituent.

The aryl group, the monovalent hetero ring group or the substituted amino group as the substituent which Ring $L^1$ and Ring $L^2$ optionally have is preferably a group represented by the formula (D-A), the formula (D-B) or the formula (D-C), more preferably a group represented by the formula (D-A) or the formula (D-B), since the light emitting device of the present invention is more excellent in external quantum efficiency.

[Chemical Formula 23]

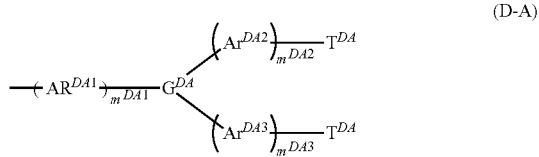

(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a hetero ring group, and the foregoing groups optionally have a substituent.

$Ar^{DA1}$, $Ar^{DA2}$ and $Ar^{DA3}$ each independently represent an arylene group or a divalent hetero ring group, and the foregoing groups optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent hetero ring group, and the foregoing groups optionally have a substituent. A plurality of $T^{DA}$ may be the same or different.]

[Chemical Formula 24]

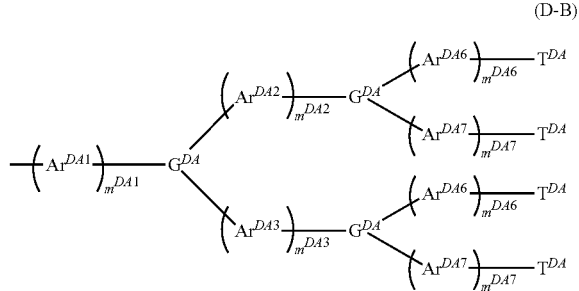

(D-B)

[wherein, $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA}$ represents a nitrogen atom, an aromatic hydrocarbon group or a hetero ring group, and the foregoing groups optionally have a substituent. A plurality of $G^{DA}$ may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent hetero ring group, and the foregoing groups optionally have a substituent. When a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence.

$T^{DA}$ represents an aryl group or a monovalent hetero ring group, and the foregoing groups optionally have a substituent. A plurality of $T^{DA}$ may be the same or different.]

[Chemical Formula 25]

(D-C)

[wherein, $m^{DA1}$ represents an integer of 0 or more.

$Ar^{DA1}$ represents an arylene group or a divalent hetero ring group, and the foregoing groups optionally have a substituent. When a plurality of $Ar^{DA1}$ are present, they may be the same or different.

$T^{DA}$ represents an aryl group or a monovalent hetero ring group, and the foregoing groups optionally have a substituent.]

$m^{DA1}$, $m^{DA2}$, $m^{DA3}$, $m^{DA4}$, $m^{DA5}$, $m^{DA6}$ and $m^{DA7}$ are each usually an integer of 10 or less, preferably an integer of 5 or less, more preferably an integer of 2 or less, further preferably 0 or 1. It is preferable that $m^{DA2}$, $m^{DA3}$, $m^{DA4}$, $m^{DA5}$, $m^{DA6}$ and $m^{DA7}$ are the same integer.

$G^{DA}$ is preferably an aromatic hydrocarbon group or a hetero ring group, more preferably a group obtained by removing from a benzene ring, a pyridine ring, a pyrimidine ring, a triazine ring or a carbazole ring three hydrogen atoms directly bonding to carbon atoms or nitrogen atoms constituting the ring, and the foregoing groups optionally have a substituent.

The substituent which $G^{DA}$ optionally has is preferably an alkyl group, a cycloalkyl group, an alkoxy group, a cycloalkoxy group, an aryl group or a monovalent hetero ring group, more preferably an alkyl group, a cycloalkyl group, an alkoxy group or a cycloalkoxy group, further preferably an alkyl group or a cycloalkyl group, and the foregoing groups optionally have a substituent.

$G^{DA}$ is preferably a group represented by the formula (GDA-11) to the formula (GDA-15), more preferably a group represented by the formula (GDA-11) to the formula (GDA-14), further preferably a group represented by the formula (GDA-11) or the formula (GDA-14).

[Chemical Formula 26]

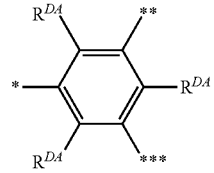

(GDA-11)

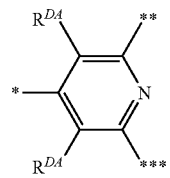

(GDA-12)

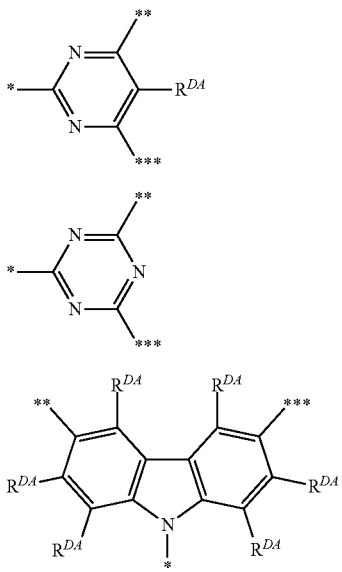

(GDA-13)

(GDA-14)

(GDA-15)

[wherein,

\* represents a bond to $Ar^{DA1}$ in the formula (D-A), to $Ar^{DA1}$ in the formula (D-B), to $Ar^{DA2}$ in the formula (D-B) or to $Ar^{DA3}$ in the formula (D-B).

\*\* represents a bond to $Ar^{DA2}$ in the formula (D-A), to $Ar^{DA2}$ in the formula (D-B), to $Ar^{DA4}$ in the formula (D-B) or to $Ar^{DA6}$ in the formula (D-B).

\*\*\* represents a bond to $Ar^{DA3}$ in the formula (D-A), to $Ar^{DA3}$ in the formula (D-B), to $Ar^{DA5}$ in the formula (D-B) or to $Ar^{DA7}$ in the formula (D-B).

$R^{DA}$ represents a hydrogen atom, an alkyl group, a cycloalkyl group, an alkoxy group, a cycloalkoxy group, an aryl group or a monovalent hetero ring group, and the foregoing groups optionally further have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or a cycloalkyl group, and the foregoing groups optionally have a substituent.

$Ar^{DA1}$, $Ar^{DA2}$, $Ar^{DA3}$, $Ar^{DA4}$, $Ar^{DA5}$, $Ar^{DA6}$ and $Ar^{DA7}$ are each preferably a phenylene group, a fluorenediyl group or a carbazolediyl group, more preferably a group represented by the formula (ArDA-1) to the formula (ArDA-5), further preferably a group represented by the formula (ArDA-1) to the formula (ArDA-3), particularly preferably a group represented by the formula (ArDA-2), and the foregoing groups optionally have a substituent.

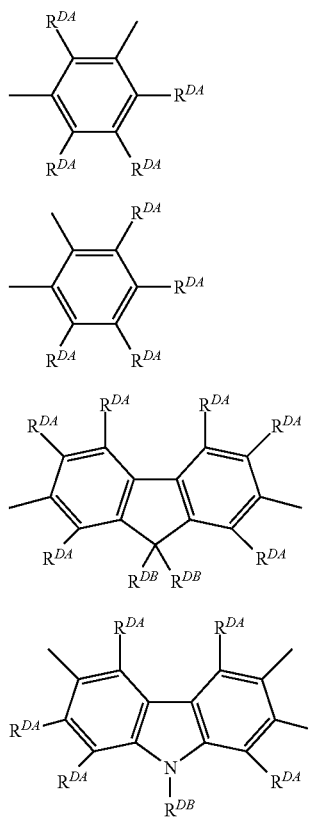

(ArDA-2)

(ArDA-3)

(ArDA-4)

(ArDA-5)

[wherein, $R^{DA}$ represents the same meaning as described above.

$R^{DB}$ represents a hydrogen atom, an alkyl group, a cycloalkyl group, an aryl group or a monovalent hetero ring group, and the foregoing groups optionally have a substituent. When a plurality of $R^{DS}$ are present, they may be the same or different.]

$R^{DB}$ is preferably an alkyl group, a cycloalkyl group, an aryl group or a monovalent hetero ring group, more preferably an aryl group or a monovalent hetero ring group, further preferably an aryl group, and the foregoing groups optionally have a substituent.

The examples and preferable ranges of the substituent which $Ar^{DA1}$, $Ar^{DA2}$, $Ar^{DA3}$, $Ar^{DA4}$, $Ar^{DA5}$, $Ar^{DA6}$ and $Ar^{DA7}$ optionally have are the same as the examples and preferable ranges of the substituent which $G^{D}A$ optionally has.

$T^{DA}$ is preferably a group represented by the formula (TDA-1) to the formula (TDA-3), more preferably a group represented by the formula (TDA-1).

[Chemical Formula 27]

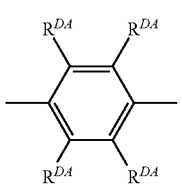

(ArDA-1)

[Chemical Formula 28]

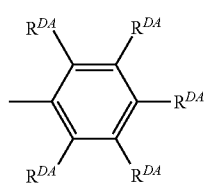

(TDA-1)

(TDA-2)

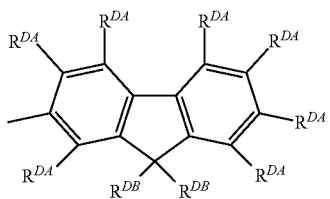

(TDA-3)

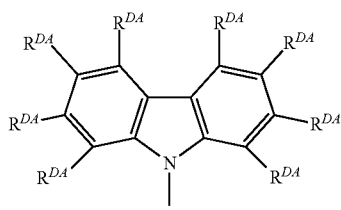

[wherein, $R^{DA}$ and $R^{DB}$ represent the same meaning as described above.]

The group represented by the formula (D-A) is preferably a group represented by the formula (D-A1) to the formula (D-A5), more preferably a group represented by the formula (D-A1) or the formula (D-A3) to the formula (D-A5), further preferably a group represented by the formula (D-A1), the formula (D-A3) or the formula (D-A5).

[Chemical Formula 29]

(D-A1)

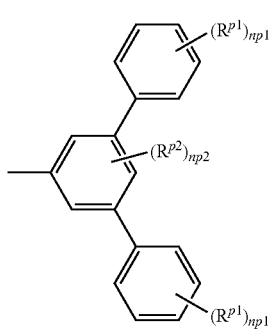

(D-A2)

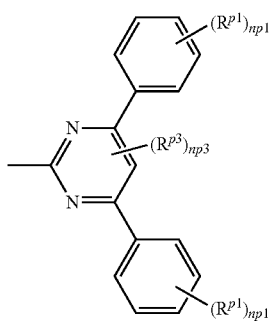

(D-A3)

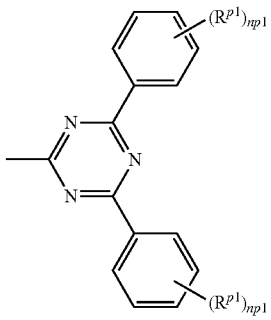

(D-A4)

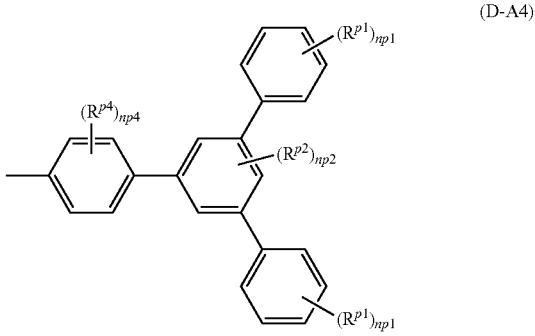

(D-A5)

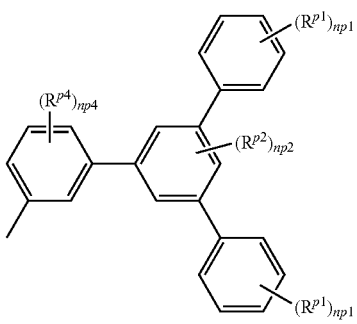

[wherein, $R^{p1}$, $R^{p2}$, $R^{p3}$ and $R^{p4}$ each independently represent an alkyl group, a cycloalkyl group, an alkoxy group, a cycloalkoxy group or a halogen atom. When a plurality of $R^{p1}$, $R^{p2}$ and $R^{p4}$ are present, they may be the same or different at each occurrence.

np1 represents an integer of 0 to 5, np2 represents an integer of 0 to 3, np3 represents 0 or 1 and np4 represents an integer of 0 to 4. A plurality of np1 may be the same or different.]

The group represented by the formula (D-B) is preferably a group represented by the formula (D-B1) to the formula (D-B3), more preferably a group represented by the formula (D-B1).

[Chemical Formula 30]

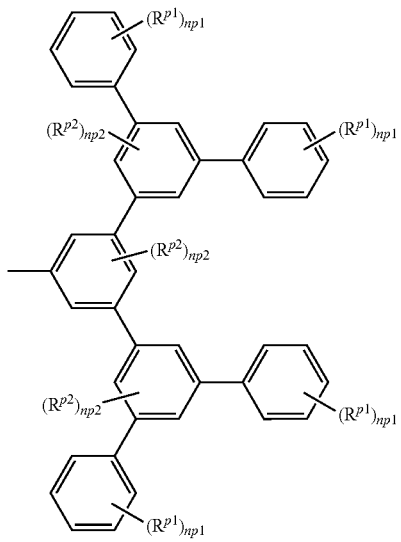
(D-B1)

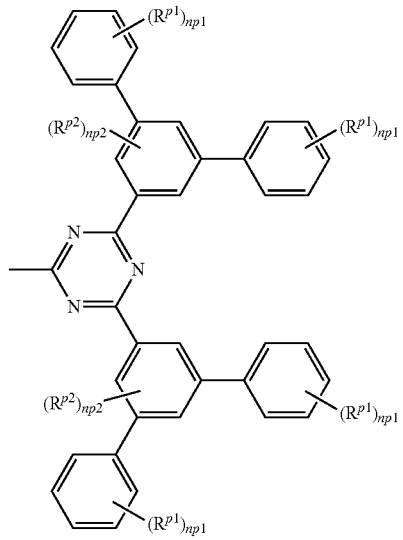
(D-B3)

[wherein, $R^{p1}$, $R^{p2}$ and $R^{p3}$ each independently represent, an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, np3 represents 0 or 1. When a plurality of np1 and np2 are present, they may be the same or different at each occurrence.

The group represented by the formula (D-C) is preferably a group represented by the formula (D-C1) to the formula (D-C4), more preferably a group represented by the formula (D-C1) to the formula (D-C3), further preferably a group represented by the formula (D-C1) or the formula (D-C2), particularly preferably a group represented by the formula (D-C1).

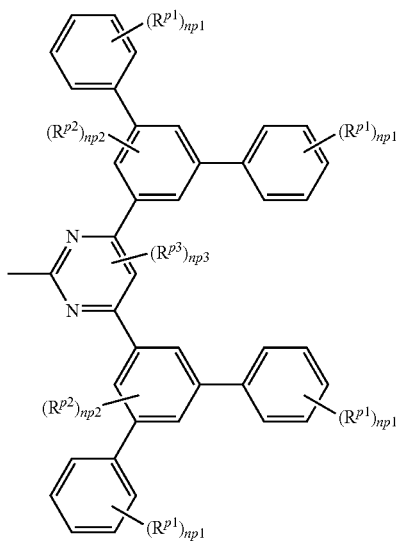
(D-B2)

[Chemical Formula 31]

(D-C1)

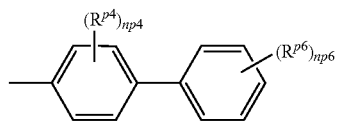
(D-C2)

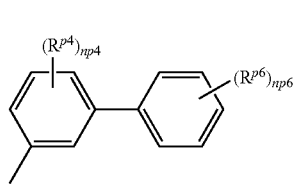
(D-C3)

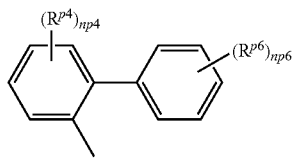

(D-C4)

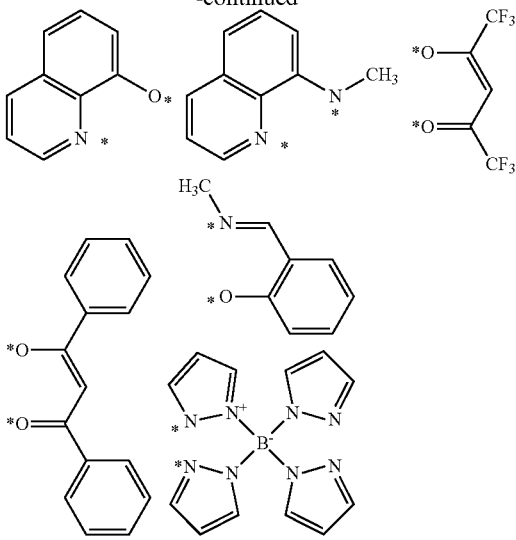

[wherein, * represents a site binding to M]

[wherein, $R^{p4}$, $R^{p5}$ and $R^{p6}$ each independently represent an alkyl group, a cycloalkyl group, an alkoxy group, a cycloalkoxy group or a halogen atom. When a plurality of $R^{p4}$, $R^{p5}$ and $R^{p6}$ are present, they may be the same or different at each occurrence.

np4 represents an integer of 0 to 4, np5 represents an integer of 0 to 5 and np6 represents an integer of 0 to 5.]

np1 is preferably an integer of 0 to 2, more preferably 0 or 1. np2 is preferably 0 or 1, more preferably 0. np3 is preferably 0. np4 is preferably an integer of 0 to 2, more preferably 0. np5 is preferably an integer of 0 to 3, more preferably 0 or 1. np6 is preferably an integer of 0 to 2, more preferably 0 or 1.

The alkyl group or the cycloalkyl group represented by $R^{p1}$, $R^{p2}$, $R^{p3}$, $R^{p4}$, $R^{p5}$ and $R^6$ is preferably a methyl group, an ethyl group, an isopropyl group, a tert-butyl group, a hexyl group, a 2-ethylhexyl group, a cyclohexyl group or a tert-octyl group.

The alkoxy group or the cycloalkoxy group represented by $R^{p1}$, $R^{p2}$, $R^{p3}$, $R^{p4}$, $R^{p5}$ and $R^{p6}$ is preferably a methoxy group, a 2-ethylhexyloxy group or a cyclohexyloxyl group.

$R^{p1}$, $R^{p2}$, $R^{p3}$, $R^{p4}$, $R^{p5}$ and $R^{p6}$ are each preferably an alkyl group optionally having a substituent or a cycloalkyl group optionally having a substituent, more preferably an alkyl group optionally having a substituent, further preferably a methyl group, an ethyl group, an isopropyl group, a tert-butyl group, a hexyl group, a 2-ethylhexyl group or a tert-octyl group.

When a plurality of the substituents which Ring $L^1$ optionally has are present, it is preferable that they are not combined together to form a ring together with atoms to which they are attached. When a plurality of the substituents which Ring $L^2$ optionally has are present, it is preferable that they are not combined together to form a ring together with atoms to which they are attached. It is preferable that the substituent which Ring $L^1$ optionally has and the substituent which Ring $L^2$ optionally has are not combined together to form a ring together with atoms to which they are attached.

[Anionic Bidentate Ligand]

The anionic bidentate ligand represented by $A^1$-$G^1$-$A^2$ includes, for example, ligands represented by the following formulae. However, the anionic bidentate ligand represented by $A^1$-$G^1$-$A^2$ is different from a ligand of which number is defined by subscript $n^1$.

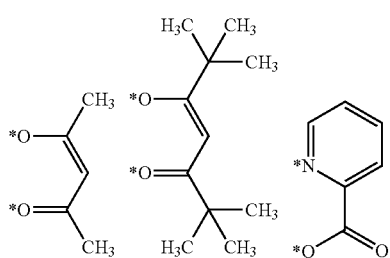

The metal complex represented by the formula (1) is preferably a metal complex represented by the formula (1-A), since the light emitting device of the present invention is more excellent in external quantum efficiency.

Ring $L^{1A}$ is preferably a pyridine ring, a diazabenzene ring, an azanaphthalene ring or a diazanaphthalene ring, more preferably a pyridine ring, a quinoline ring or an isoquinoline ring, and the foregoing rings optionally have a substituent, since the light emitting device of the present invention is more excellent in external quantum efficiency.

The examples and preferable ranges of the substituent which Ring $L^{1A}$ optionally has are the same as the examples and preferable ranges of the substituent which Ring $L^1$ and Ring $L^2$ optionally have.

When a plurality of the substituents which Ring $L^{1A}$ optionally has are present, it is preferable that they are not combined together to form a ring together with atoms to which they are attached.

When Ring $L^{2A}$ is a pyridine ring, a pyridine ring in which $E^{21A}$ is a nitrogen atom, a pyridine ring in which $E^{22A}$ is a nitrogen atom or a pyridine ring in which $E^{23A}$ is a nitrogen atom is preferable, a pyridine ring in which $E^{22A}$ is a nitrogen atom is more preferable.

When Ring $L^{2A}$ is a diazabenzene ring, a pyrimidine ring in which $E^{21A}$ and $E^{23A}$ are each a nitrogen atom or a pyrimidine ring in which $E^{22A}$ and $E^{24A}$ are each a nitrogen atom is preferable, a pyrimidine ring in which $E^{22A}$ and $E^{24A}$ are each a nitrogen atom is more preferable.

Ring $L^{2A}$ is preferably a benzene ring.

$E^{21A}$, $E^{22A}$, $E^{23A}$ and $E^{24A}$ are each preferably a carbon atom.

$R^{21A}$, $R^{22A}$, $R^{23A}$ and $R^{24A}$ are each preferably a hydrogen atom, an alkyl group, a cycloalkyl group, an aryl group, a monovalent hetero ring group or a substituted amino group, more preferably a hydrogen atom, an alkyl group or an aryl group, and the foregoing groups optionally have a substituent, since the light emitting device of the present invention is more excellent in external quantum efficiency.

$R^{21A}$ and $R^{24A}$ are each further preferably a hydrogen atom. $R^{22A}$ is further preferably a hydrogen atom or an aryl group optionally having a substituent. $R^{23A}$ is further preferably a hydrogen atom or an alkyl group optionally having a substituent.

It is preferable that, in the metal complex represented by the formula (1-A), at least one of Ring $L^A$ has a substituent, or at least one of $R^{21A}$, $R^{22A}$, $R^{23A}$ and $R^{24A}$ is an alkyl group, a cycloalkyl group, an alkoxy group, a cycloalkoxy group, an aryl group, an aryloxy group, a monovalent hetero ring group, a substituted amino group or a halogen atom, since the light emitting device of the present invention is more excellent in external quantum efficiency.

When at least one of $R^{21A}$, $R^{22A}$, $R^{23A}$ and $R^{24A}$ is an alkyl group, a cycloalkyl group, an alkoxy group, a cycloalkoxy group, an aryl group, an aryloxy group, a monovalent hetero ring group, a substituted amino group or a halogen atom, it is preferable that at least one of $R^{22A}$ and $R^{23A}$ is an alkyl group, a cycloalkyl group, an alkoxy group, a cycloalkoxy group, an aryl group, an aryloxy group, a monovalent hetero ring group, a substituted amino group or a halogen atom, it is more preferable that at least one of $R^{22A}$ and $R^{23A}$ is an alkyl group, a cycloalkyl group, an aryl group, a monovalent hetero ring group or a substituted amino group, and the foregoing groups optionally have a substituent, since the light emitting device of the present invention is more excellent in external quantum efficiency.

The examples and preferable ranges of the aryl group, the monovalent hetero ring group and the substituted amino group represented by $R^{21A}$, $R^{22A}$, $R^{23A}$ and $R^{24A}$ are the same as the examples and preferable ranges of the aryl group, the monovalent hetero ring group and the substituted amino group as the substituent which Ring $L^1$ and Ring $L^2$ optionally have, respectively.

The examples and preferable ranges of the substituent which $R^{21A}$, $R^{22A}$, $R^{23A}$ and $R^{24A}$ optionally have are the same as the examples and preferable ranges of the substituent which the substituent which Ring $L^1$ and Ring $L^2$ optionally have optionally further has.

It is preferable that $R^{21A}$ and $R^{22A}$, $R^{22A}$ and $R^{23A}$, $R^{23A}$ and $R^{24A}$, and, the substituent which Ring $L^{1A}$ optionally has and $R^{21A}$ are each not combined together to form a ring together with atoms to which they are attached.

The metal complex represented by the formula (1-A) is preferably a metal complex represented by the formula (1-A1) to the formula (1-A4) or the formula (1-B1) to the formula (1-B5), more preferably a metal complex represented by the formula (1-B1) to the formula (1-B5), further preferably a metal complex represented by the formula (1-B1), the formula (1-B2) or the formula (1-B3), particularly preferably a metal complex represented by the formula (1-B1), since the light emitting device of the present invention is more excellent in external quantum efficiency.

[Metal Complexes Represented by the Formula (1-A1) to the Formula (1-A4)]

[Chemical Formula 33]

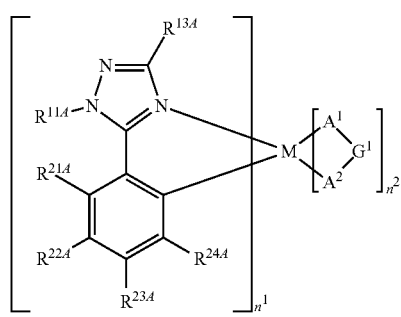

(1-A1)

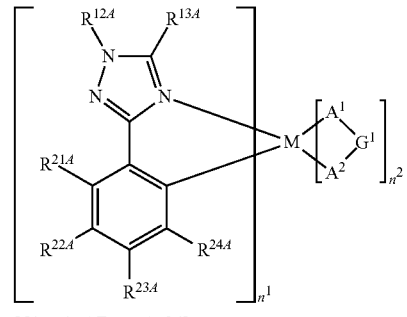

(1-A2)

[Chemical Formula 34]

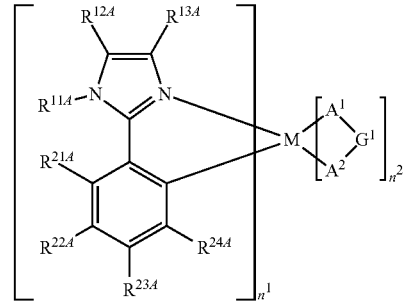

(1-A3)

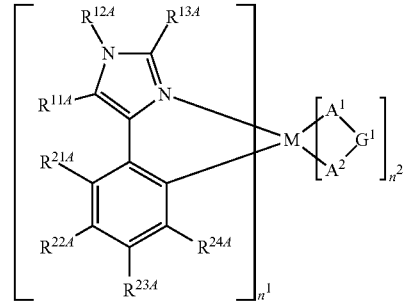

(1-A4)

[wherein, M, $n^1$, $n^2$, $R^{21A}$, $R^{22A}$, $R^{23A}$, $R^{24A}$ and $A^1$-$G^1$-$A^2$ represent the same meaning as described above.]

$R^{11A}$, $R^{12A}$ and $R^{13A}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and the foregoing groups optionally have a substituent. When a plurality of $R^{11A}$, $R^{12A}$ and $R^{13A}$ are present, they may be the same or different at each occurrence.

In the formula (1-A1), $R^{11A}$ and $R^{21A}$ may be combined together to form a ring together with atoms to which they are attached. In the formula (1-A2), $R^{12A}$ and $R^{13A}$ may be combined together to form a ring together with atoms to which they are attached. In the formula (1-A3) and the formula (1-A4), $R^{11A}$ and $R^{12A}$, $R^{12A}$ and $R^{13A}$, and, $R^{11A}$ and $R^{21A}$ each may be combined together to form a ring together with atoms to which they are attached.]

In the formula (1-A1) and the formula (1-A3), $R^{11A}$ is preferably an alkyl group, a cycloalkyl group, an aryl group or a monovalent hetero ring group, more preferably an aryl group or a monovalent hetero ring group, further preferably an aryl group, and the foregoing groups optionally have a substituent.

In the formula (1-A3), $R^{12A}$ is preferably a hydrogen atom, an alkyl group, a cycloalkyl group, an aryl group, a monovalent hetero ring group or a substituted amino group, more preferably a hydrogen atom, an alkyl group or an aryl group, further preferably a hydrogen atom, and the foregoing groups optionally have a substituent.

In the formula (1-A2) and the formula (1-A4), $R^{12A}$ is preferably an alkyl group, a cycloalkyl group, an aryl group or a monovalent hetero ring group, more preferably an aryl group or a monovalent hetero ring group, further preferably an aryl group, and the foregoing groups optionally have a substituent.

In the formula (1-A4), $R^{11A}$ is preferably a hydrogen atom, an alkyl group, a cycloalkyl group, an aryl group, a monovalent hetero ring group or a substituted amino group, more preferably a hydrogen atom, an alkyl group or an aryl group, further preferably a hydrogen atom, and the foregoing groups optionally have a substituent.

In the formula (1-A1) to the formula (1-A4), $R^{13A}$ is preferably a hydrogen atom, an alkyl group, a cycloalkyl group, an aryl group, a monovalent hetero ring group or a substituted amino group, more preferably a hydrogen atom, an alkyl group or an aryl group, further preferably a hydrogen atom, and the foregoing groups optionally have a substituent.

The examples and preferable ranges of the aryl group, the monovalent hetero ring group and the substituted amino group represented by $R^{11A}$, $R^{12A}$ and $R^{13A}$ are the same as the examples and preferable ranges of the aryl group, the monovalent hetero ring group and the substituted amino group as the substituent which Ring $L^1$ and Ring $L^2$ optionally have, respectively.

The examples and preferable ranges of the substituent which $R^{11A}$, $R^{12A}$ and $R^{13A}$ optionally have are the same as the examples and preferable ranges of the substituent which the substituent which Ring $L^1$ and Ring $L^2$ optionally have optionally further has.

It is preferable that, in the formula (1-A1) to the formula (1-A4), $R^{11A}$ and $R^{12A}$, $R^{12A}$ and $R^{13A}$, and, $R^{11A}$ and $R^{21A}$ are each not combined together to form a ring together with atoms to which they are attached.

[Metal Complexes Represented by the Formula (1-B1) to the Formula (1-B5)]

$R^{11B}$, $R^{12B}$, $R^{13B}$, $R^{14B}$, $R^{15B}$, $R^{16B}$, $R^{17B}$ and $R^{18B}$ are each preferably a hydrogen atom, an alkyl group, a cycloalkyl group, an aryl group, a monovalent hetero ring group or a substituted amino group, more preferably a hydrogen atom, an alkyl group, an aryl group or a monovalent hetero ring group, and the foregoing groups optionally have a substituent, since the light emitting device of the present invention is more excellent in external quantum efficiency.

$R^{11B}$, $R^{14B}$, $R^{15B}$, $R^{16B}$, $R^{17B}$ and $R^{18B}$ are each preferably a hydrogen atom or an alkyl group, more preferably a hydrogen atom, and the foregoing groups optionally have a substituent, since synthesis of the metal complex is easy.

$R^{12B}$ is preferably a hydrogen atom, an aryl group or a monovalent hetero ring group, more preferably a hydrogen atom, and the foregoing groups optionally have a substituent, since the light emitting device of the present invention is further excellent in external quantum efficiency.

$R^{13B}$ is preferably a hydrogen atom, an aryl group or a monovalent hetero ring group, and the foregoing groups optionally have a substituent, since the light emitting device of the present invention is further excellent in external quantum efficiency.

The examples and preferable ranges of the aryl group, the monovalent hetero ring group and the substituted amino group represented by $R^{11B}$, $R^{12B}$, $R^{13B}$, $R^{14B}$, $R^{15B}$, $R^{16B}$, $R^{17B}$ and $R^{18B}$ are the same as the examples and preferable ranges of the aryl group, the monovalent hetero ring group and the substituted amino group as the substituent which Ring $L^1$ and Ring $L^2$ optionally have, respectively.

The examples and preferable ranges of the substituent which $R^{11B}$, $R^{12B}$, $R^{13B}$, $R^{14B}$, $R^{15B}$, $R^{16B}$, $R^{17B}$ and $R^{18B}$ optionally have are the same as the examples and preferable ranges of the substituent which the substituent which Ring $L^1$ and Ring $L^2$ optionally have optionally further has.

In the formula (1-B1) to the formula (1-B5), at least one of $R^{11B}$, $R^{12B}$, $R^{13B}$, $R^{14B}$, $R^{11B}$, $R^{12B}$, $R^{13B}$, $R^{14B}$, $R^{15B}$, $R^{16B}$, $R^{17B}$, $R^{18B}$, $R^{21A}$, $R^{22A}$, $R^{23A}$ and $R^{24A}$ is preferably an alkyl group, a cycloalkyl group, an alkoxy group, a cycloalkoxy group, an aryl group, an aryloxy group, a monovalent hetero ring group, a substituted amino group or a halogen atom, at least one of $R^{12B}$, $R^{13B}$, $R^{22A}$ and $R^{23A}$ is more preferably an alkyl group, a cycloalkyl group, an alkoxy group, a cycloalkoxy group, an aryl group, an aryloxy group, a monovalent hetero ring group, a substituted amino group or a halogen atom, at least one of $R^{13B}$, $R^{22A}$ and $R^{23A}$ is further preferably an alkyl group, a cycloalkyl group, an aryl group, a monovalent hetero ring group or a substituted amino group, and the foregoing groups optionally have a substituent, since the light emitting device of the present invention is more excellent in external quantum efficiency.

It is preferable that, in the formula (1-B1) to the formula (1-B5), $R^{11B}$ and $R^{12B}$, $R^{12B}$ and $R^{13B}$, $R^{13B}$ and $R^{14B}$, $R^{11B}$ and $R^{21A}$, $R^{13B}$ and $R^{15B}$, $R^{15B}$ and $R^{16B}$, $R^{16B}$ and $R^{17B}$, $R^{17B}$ and $R^{18B}$, $R^{18B}$ and $R^{21A}$, $R^{11B}$ and $R^{18B}$, $R^{14B}$ and $R^{15B}$, and, $R^{12B}$ and $R^{18B}$ are each not combined together to forma ring together with atoms to which they are attached.

The phosphorescent transition metal complex includes, for example, metal complexes represented by the following formulae.

[Chemical Formula 35]

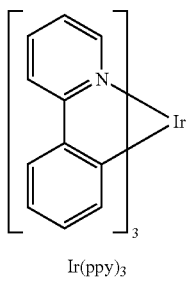

Ir(ppy)$_3$

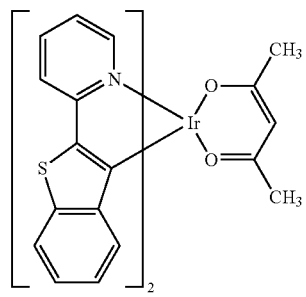

Btp$_2$Ir(acac)

-continued
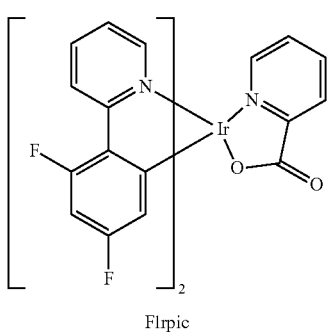
FIrpic
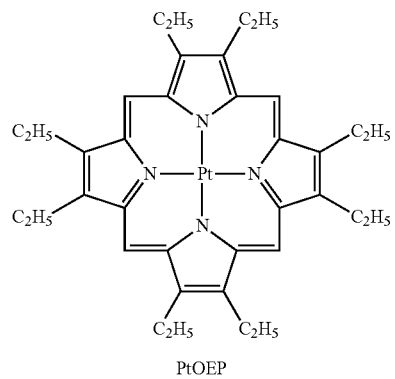
PtOEP
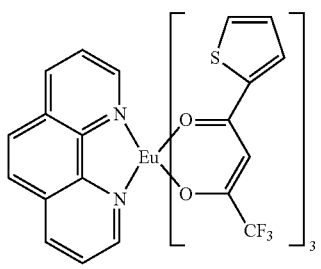
Eu(TTA)₃phen
[Chemical Formula 36]
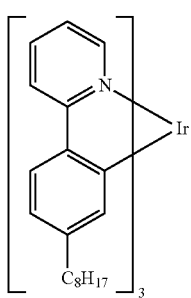
COM-1
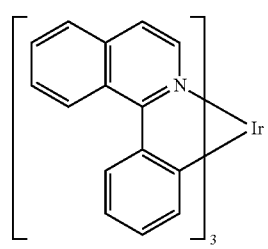
COM-2
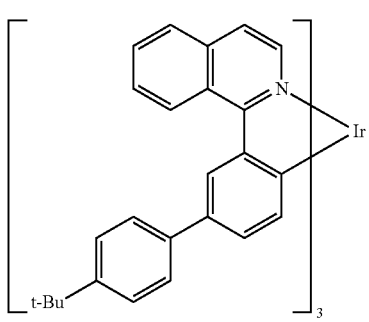
COM-3
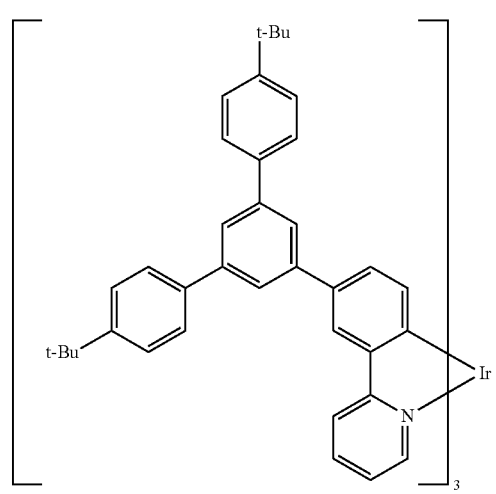
COM-4

-continued
COM-5
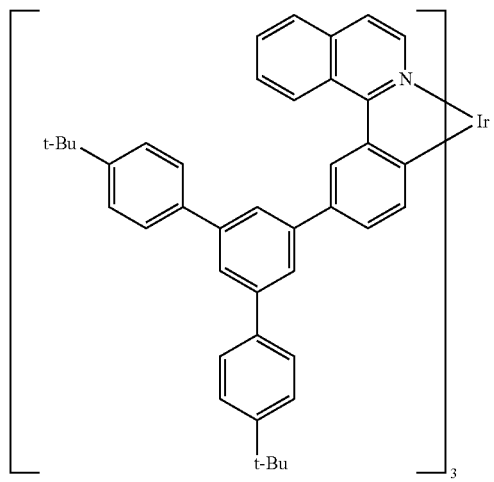
[Chemical Formula 37]
COM-6
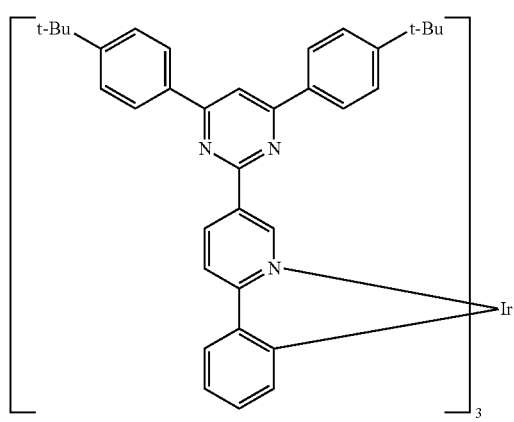
COM-7
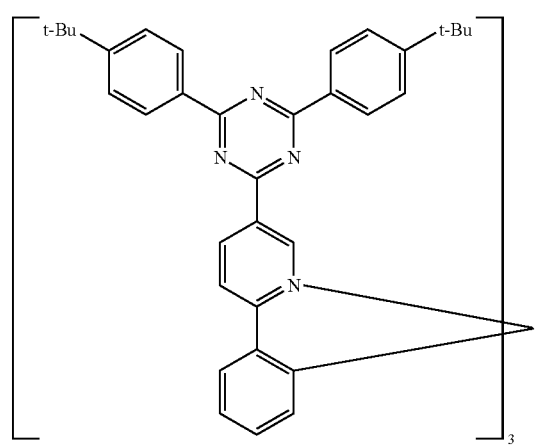
COM-8
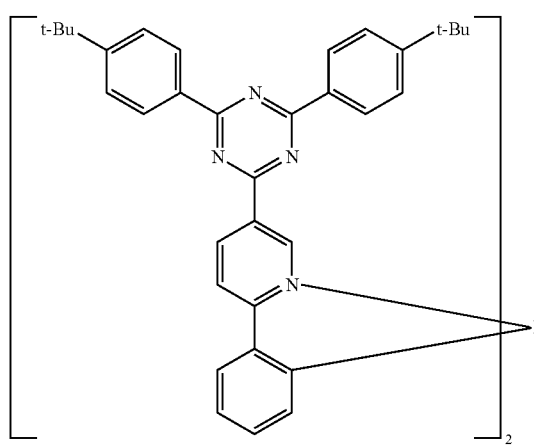
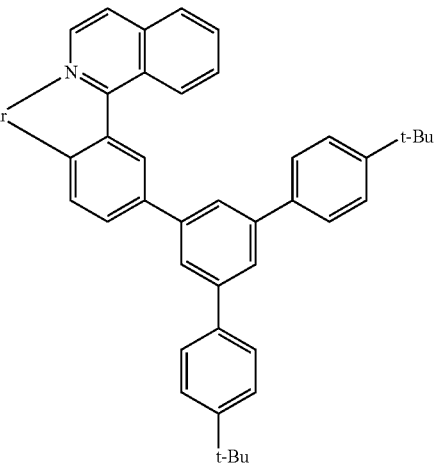

[Chemical Formula 38]
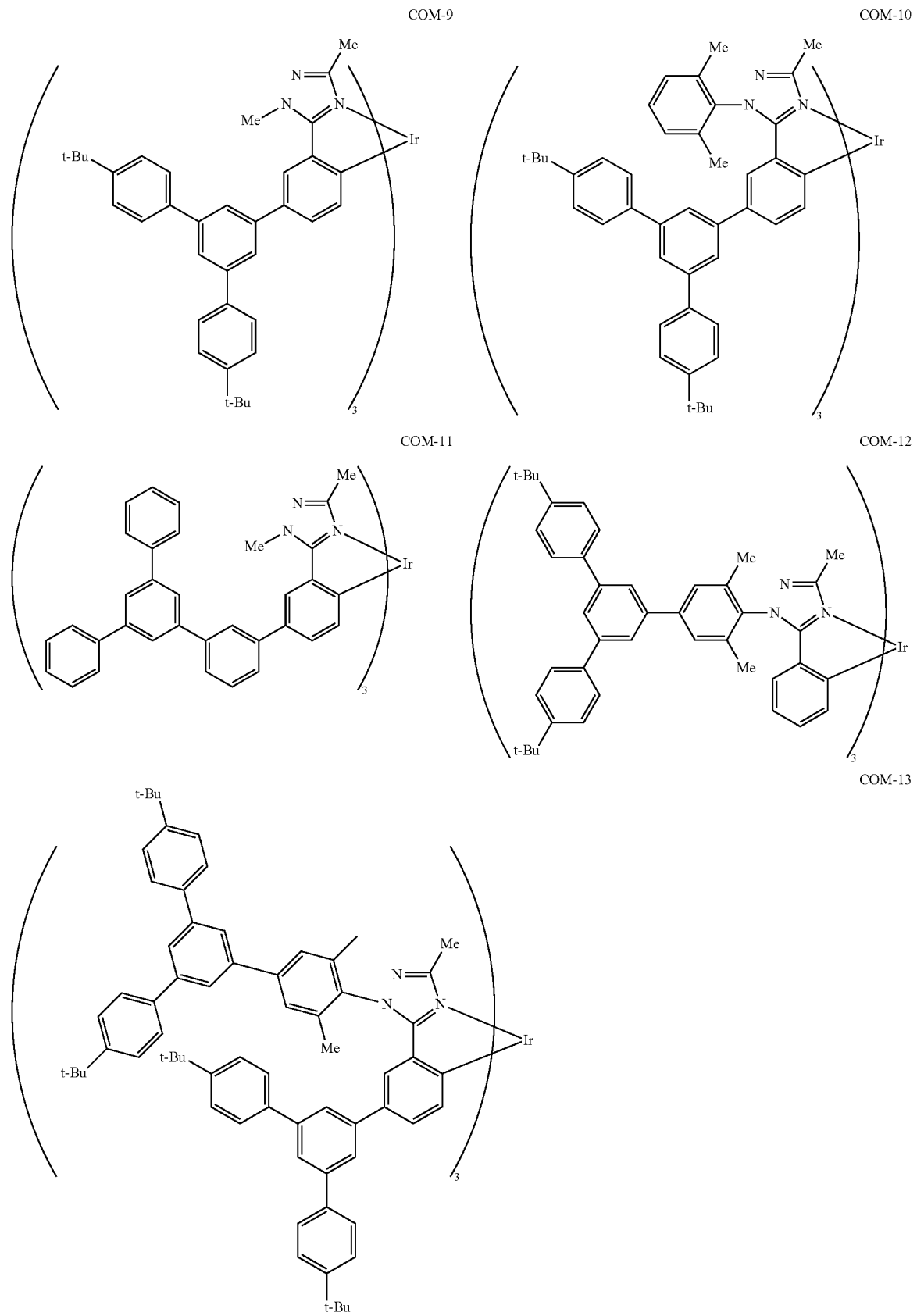

-continued
[Chemical Formula 39]
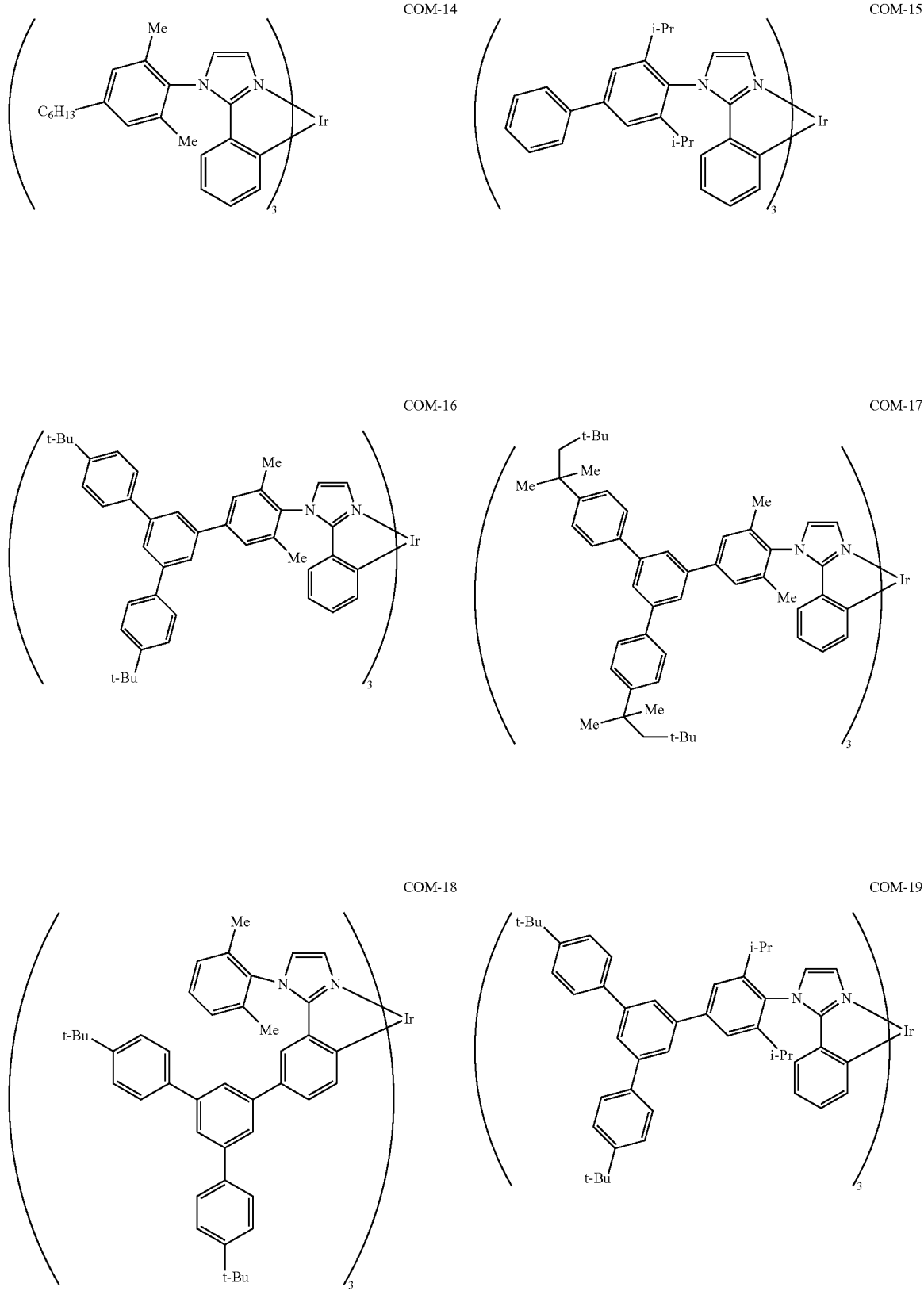

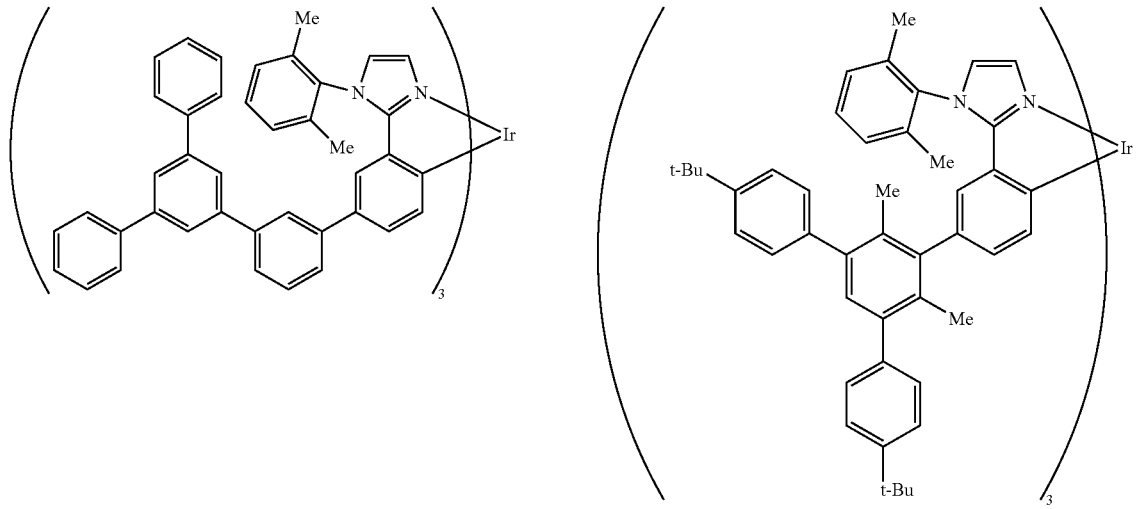

The phosphorescent transition metal complex is available from Aldrich, Luminescence Technology Corp., American Dye Source and the like.

Further, it can also be produced by known methods described in literatures such as "Journal of the American Chemical Society, Vol. 107, 1431-1432 (1985)", "Journal of the American Chemical Society, Vol. 106, 6647-6653 (1984)", Japanese Translation of PCT International Application Publication (JP-T) No. 2004-530254, Japanese Unexamined Patent Application Publication (JP-A) No. 2008-179617, JP-A No. 2011-105701, JP-T No. 2007-504272, International Publication WO 2006/121811, JP-A No. 2013-147450, JP-A No. 2014-224101 and the like.

<Compound (T)>

The low molecular compound satisfying at least one requirement selected from the group consisting of Requirement (I) and Requirement (II) and containing no transition metal (hereinafter, referred to as "compound (T)"), contained in the first organic layer of the light emitting device of the present invention, will be explained.

The compound (T) is preferably a thermally activated delayed fluorescent (TADF) compound.

The molecular weight of the compound (T) is usually $1 \times 10^2$ to $1 \times 10^4$, preferably $2 \times 10^2$ to $5 \times 10^3$, more preferably $3 \times 10^2$ to $3 \times 10^3$, further preferably $5 \times 10^2$ to $1.5 \times 10^3$.

In Requirement (I), the absolute value of the difference between the energy level of the lowest triplet excited state and the energy level of the lowest singlet excited state (hereinafter, referred to as "$\Delta E_{ST}$") is preferably 0.20 eV or less, more preferably 0.16 eV or less, since the light emitting device of the present invention is more excellent in external quantum efficiency. In Requirement (I), $\Delta E_{ST}$ is preferably 0.001 eV or more and 0.25 eV or less, more preferably 0.01 eV or more and 0.20 eV or less, further preferably 0.015 eV or more and 0.16 eV or less, since the light emitting device of the present invention is further excellent in external quantum efficiency.

For calculation of the value of $\Delta E_{ST}$ a compound, the structure of the ground state of the compound is optimized by the B3LYP level density functional method. In this operation, 6-31G* is used as the base function. Then, $\Delta E_{ST}$ the compound is calculated by the B3LYP level time-dependent density functional method using the resultant optimized structure. However, when an atom for which 6-31G* cannot be used is contained, LANL2DZ is used for the atom. As the quantum chemical calculation program, Gaussian09 is used for calculation.

In Requirement (II), $\Delta E_{ST}$ of the compound represented by the formula (T-1) is usually 0.60 eV or less, preferably 0.35 eV or less, more preferably 0.25 eV or less, further preferably 0.20 eV or less, particularly preferably 0.16 eV or less, since the light emitting device of the present invention is more excellent in external quantum efficiency. $\Delta E_{ST}$ of the compound represented by the formula (T-1) is preferably 0.0001 eV or more and 0.40 eV or less, more preferably 0.001 eV or more and 0.25 eV or less, further preferably 0.01 eV or more and 0.20 eV or less, particularly preferably 0.015 eV or more and 0.16 eV or less, since the light emitting device of the present invention is further excellent in external quantum efficiency.

$n^{T1}$ is preferably an integer of 0 or more and 3 or less, more preferably 0 or 1, since the light emitting device of the present invention is more excellent in external quantum efficiency.

$n^{T2}$ is preferably an integer of 1 or more and 5 or less, more preferably 1 or 2, since the light emitting device of the present invention is more excellent in external quantum efficiency.

"Nitrogen atom having no double bond" denotes a nitrogen atom having only a single bond between the nitrogen atom and all atoms bonded to the nitrogen atom.

"Containing a nitrogen atom having no double bond in the ring" means that a group represented by —N(—R$^N$)— (wherein, R$^N$ represents a hydrogen atom or a substituent.) or a group represented by the formula:

[Chemical Formula 40]

is contained in the ring.

In the monovalent hetero ring group containing a nitrogen atom having no double bond in the ring and not containing a group represented by =N—, a group represented by —C(=O)—, a group represented by —S(=O)— and a group represented by —S(=O)$_2$— in the ring (hereinafter, referred to as "monovalent donor type hetero ring group"), the number of the nitrogen atom having no double bond constituting the ring is usually 1 to 10, preferably 1 to 5, more preferably 1 to 3, further preferably 1 or 2.

In the monovalent donor type hetero ring group, the number of the carbon atom constituting the ring is usually 2 to 60, preferably 5 to 40, more preferably 10 to 25.

The monovalent donor type hetero ring group includes, for example, groups obtained by removing from a pyrrole ring, an indole ring, a carbazole ring, a 9,10-dihydroacridine ring, a 5,10-dihydrophenazine ring, a phenoxazine ring, a phenothiazine ring, an indolocarbazole ring, an indenocarbazole ring or rings obtained by condensing one or more and five or less aromatic hydrocarbon rings and/or hetero rings to these hetero rings one hydrogen atom bonding directly to a carbon atom or a hetero atom constituting the ring, and the foregoing groups optionally have a substituent. The aromatic hydrocarbon ring which may be condensed to the hetero ring is an aromatic hydrocarbon ring not containing a group represented by —C(=O)— in the ring. The hetero ring which may be condensed to the hetero ring is a hetero ring not containing a group represented by =N—, a group represented by —C(=O)—, a group represented by —S(=O)— and a group represented by —S(=O)$_2$— in the ring.

The number of carbon atoms of "the aromatic hydrocarbon ring not containing a group represented by —C(=O)— in the ring", not including the number of carbon atoms of the substituent, is usually 6 to 60, preferably 6 to 30, more preferably 6 to 18.

The aromatic hydrocarbon ring not containing a group represented by —C(=O)— in the ring includes, for example, a benzene ring, a naphthalene ring, an indene ring, a fluorene ring, a phenanthrene ring, a dihydrophenanthrene ring and rings obtained by condensing two or more and five or less these rings, and is preferably a benzene ring, a naphthalene ring, a fluorene ring, a spirobifluorene ring, a phenanthrene ring or a dihydrophenanthrene ring, more preferably a benzene ring, a fluorene ring or a spirobifluorene ring, further preferably a benzene ring or a fluorene ring, and the foregoing rings optionally have a substituent.

The number of carbon atoms of "the hetero ring not containing a group represented by =N—, a group represented by —C(=O)—, a group represented by —S(=O)— and a group represented by —S(=O)$_2$— in the ring", not including the number of carbon atoms of the substituent, is usually 6 to 60, preferably 6 to 30, more preferably 6 to 18.

The hetero ring not containing a group represented by =N—, a group represented by —C(=O)—, a group represented by —S(=O)— and a group represented by —S(=O)$_2$— in the ring includes a pyrrole ring, a furan ring, a thiophene ring, an indole ring, a benzofuran ring, a benzothiophene ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring, a 5,10-dihydrophenazine ring, rings obtained by condensing one or more and five or less aromatic hydrocarbon rings not containing a group represented by —C(=$Z^{T1}$)— in the ring to these rings, and, rings obtained by condensing two or more and five or less these rings, and is preferably a carbazole ring, a dibenzofuran ring, a dibenzothiophene ring, a phenoxazine ring, a phenothiazine ring, a 9,10-dihydroacridine ring or a 5,10-dihydrophenazine ring, more preferably a carbazole ring, a dibenzofuran ring or a dibenzothiophene ring, and the foregoing rings optionally have a substituent.

The monovalent donor type hetero ring group is preferably a group obtained by removing from a carbazole ring, a 9,10-dihydroacridine ring, a 5,10-dihydrophenazine ring, a phenoxazine ring, a phenothiazine ring, an indolocarbazole ring or an indenocarbazole ring one hydrogen atom bonding directly to a carbon atom or a hetero atom constituting the ring, more preferably a group obtained by removing from a carbazole ring, an indolocarbazole ring or an indenocarbazole ring one hydrogen atom bonding directly to a carbon atom or a hetero atom constituting the ring, and the foregoing groups optionally have a substituent, since the light emitting device of the present invention is more excellent in external quantum efficiency.

The examples and preferable ranges of the substituted amino group represented by $Ar^{T1}$ are the same as the examples and preferable ranges of the substituted amino group as a substituent which $Ar^{T1}$ optionally has described later.

The substituent which $Ar^{T1}$ optionally has is preferably an alkyl group, a cycloalkyl group, an alkoxy group, a cycloalkoxy group, an aryl group, an aryloxy group, a monovalent hetero ring group, a substituted amino group, a halogen atom or a cyano group, more preferably an alkyl group, a cycloalkyl group, an aryl group, a monovalent hetero ring group or a substituted amino group, further preferably an alkyl group, an aryl group or a monovalent hetero ring group, and the foregoing groups optionally further have a substituent.

The aryl group as the substituent which $Ar^{T1}$ optionally has is preferably a phenyl group, a naphthyl group, a phenanthrenyl group, a dihydrophenanthrenyl group or a fluorenyl group, more preferably a phenyl group or a fluorenyl group, further preferably a phenyl group, and the foregoing groups optionally have a substituent.

The monovalent hetero ring group as the substituent which $Ar^{T1}$ optionally has is preferably a pyridyl group, a pyrimidinyl group, a triazinyl group, a quinolinyl group, an isoquinolinyl group, a dibenzofuranyl group, a dibenzothienyl group, a carbazolyl group, an azacarbazolyl group, a diazacarbazolyl group, a phenoxazinyl group or a phenothiazinyl group, more preferably a pyridyl group, a pyrimidinyl group, a triazinyl group, a dibenzofuranyl group, a dibenzothienyl group or a carbazolyl group, further preferably a dibenzofuranyl group, a dibenzothienyl group or a carbazolyl group, and the foregoing groups optionally have a substituent.

In the substituted amino group as the substituent which $Ar^{T1}$ optionally has, the substituent which the amino group has is preferably an aryl group or a monovalent hetero ring group, more preferably an aryl group, and the foregoing groups optionally further have a substituent. The examples and preferable ranges of the aryl group as the substituent which the amino group has are the same as the examples and preferable ranges of the aryl group as the substituent which $Ar^{T1}$ optionally has. The examples and preferable ranges of the monovalent hetero ring group as the substituent which the amino group has are the same as the examples and preferable ranges of the monovalent hetero ring group as the substituent which $Ar^{T1}$ optionally has.

The substituent which the substituent which $Ar^{T1}$ optionally has optionally further has is preferably an alkyl group, a cycloalkyl group, an alkoxy group, a cycloalkoxy group, an aryl group, an aryloxy group, a monovalent hetero ring group, a substituted amino group, a halogen atom or a cyano group, more preferably an alkyl group, a cycloalkyl group, an aryl group, a monovalent hetero ring group or a substituted amino group, further preferably an alkyl group or an aryl group, and the foregoing groups optionally further have a substituent.

The examples and preferable ranges of the aryl group, the monovalent hetero ring group and the substituted amino group as the substituent which the substituent which $Ar^{T1}$ optionally has optionally further has are the same as the examples and preferable ranges of the aryl group, the monovalent hetero ring group and the substituted amino group as the substituent which $Ar^{T1}$ optionally has, respectively.

At least one $Ar^{T1}$ is preferably a monovalent donor type hetero ring group, more preferably a group represented by the formula (T1-1), and the foregoing groups optionally have a substituent, since the light emitting device of the present invention is more excellent in external quantum efficiency.

That is, the monovalent donor type hetero ring group is preferably a group represented by the formula (T1-1).

$Ar^{T1}$ is preferably a monovalent donor type hetero ring group, more preferably a group represented by the formula (T1-1), and the foregoing groups optionally have a substituent, since the light emitting device of the present invention is further excellent in external quantum efficiency.

(Group Represented by the Formula (T1-1))

The examples and preferable ranges of the substituent which Ring $R^{T1}$ and Ring $R^{T2}$ optionally have are the same as the examples and preferable ranges of the substituent which $Ar^{T1}$ optionally has.

At least one of Ring $R^{T1}$ and Ring $R^{T2}$ is preferably an aromatic hydrocarbon ring not containing a group represented by —C(=O)— in the ring, and the foregoing rings optionally have a substituent.

Ring $R^{T1}$ and Ring $R^{T2}$ are each preferably a benzene ring, a naphthalene ring, a fluorene ring, a spirobifluorene ring, a phenanthrene ring, a dihydrophenanthrene ring, a carbazole ring, a dibenzofuran ring, a dibenzothiophene ring, a phenoxazine ring, a phenothiazine ring, a 9,10-dihydroacridine ring or a 5,10-dihydrophenazine ring, more preferably a benzene ring, a fluorene ring, a spirobifluorene ring, a carbazole ring, a dibenzofuran ring or a dibenzothiophene ring, further preferably a benzene ring, a fluorene ring or a carbazole ring, and the foregoing rings optionally have a substituent, since the light emitting device of the present invention is more excellent in external quantum efficiency.

$X^{T1}$ is preferably a single bond, an oxygen atom or a sulfur atom, more preferably a single bond.

$R^{XT1}$ is preferably an alkyl group, a cycloalkyl group, an aryl group or a monovalent hetero ring group, more preferably an aryl group or a monovalent hetero ring group, further preferably an aryl group, and the foregoing groups optionally have a substituent.

$R^{XT1'}$ is preferably an alkyl group, a cycloalkyl group, an aryl group or a monovalent hetero ring group, more preferably an alkyl group or an aryl group, further preferably an alkyl group, and the foregoing groups optionally have a substituent.

It is preferable that a plurality of $R^{XT1'}$ are not combined together to form a ring together with carbon atoms to which they are attached.

The examples and preferable ranges of the aryl group, the monovalent hetero ring group and the substituted amino group represented by $R^{XT1}$ and $R^{XT1'}$ are the same as the examples and preferable ranges of the aryl group, the monovalent hetero ring group and the substituted amino group as the substituent which $Ar^{T1}$ optionally has, respectively.

The examples and preferable ranges of the substituent which $R^{XT1}$ and $R^{XT1'}$ optionally have are the same as the examples and preferable ranges of the substituent which the substituent which $Ar^{T1}$ optionally has optionally further has.

The group represented by the formula (T1-1) is preferably a group represented by the formula (T1-1A), the formula (T1-1B), the formula (T1-1C) or the formula (T1-1D), more preferably a group represented by the formula (T1-1A), the formula (T1-1B) or the formula (T1-1C), since the light emitting device of the present invention is more excellent in external quantum efficiency.

$X^{T2}$ and $X^{T3}$ are each preferably a single bond, a group represented by —N($R^{XT2}$)— or a group represented by —C($R^{T2'}$)$_2$—.

At least one of $X^{T2}$ and $X^{T3}$ is preferably a single bond, and it is more preferable that $X^{T3}$ is a single bond.

When at least one of $X^{T2}$ and $X^{T3}$ is a single bond, the other one is preferably an oxygen atom, a sulfur atom, a group represented by —N($R^{XT2}$)— or a group represented by —C($R^{XT2}$)$_2$—, more preferably a group represented by —N($R^{T2}$)— or a group represented by —C($R^{XT2'}$)$_2$—.

The examples and preferable ranges of $R^{XT2}$ are the same as the examples and preferable ranges of $R^{XT1}$.

The examples and preferable ranges of $R^{XT2'}$ are the same as the examples and preferable ranges of $R^{XT1'}$.

The examples and preferable ranges of the substituent which $R^{XT2}$ and $R^{XT2'}$ optionally have are the same as the examples and preferable ranges of the substituent which $R^{XT1}$ and $R^{XT1'}$ optionally have.

$R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ are each preferably a hydrogen atom, an alkyl group, a cycloalkyl group, an aryl group, a monovalent hetero ring group or a substituted amino group, more preferably a hydrogen atom, an alkyl group, a cycloalkyl group, an aryl group, a monovalent hetero ring group or a substituted amino group, further preferably a hydrogen atom, an alkyl group, an aryl group or a monovalent hetero ring group, and the foregoing groups optionally further have a substituent.

It is particularly preferable that, in the formula (T1-1A), $R^{T1}$, $R^{T2}$, $R^{T4}$, $R^{T5}$, $R^{T7}$ and $R^{T8}$ represent a hydrogen atom.

It is particularly preferable that, in the formula (T1-1B), the formula (T1-1C) or the formula (T1-1D), $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ represent a hydrogen atom.

The examples and preferable ranges of the aryl group, the monovalent hetero ring group and the substituted amino group represented by $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ are the same as the examples and preferable ranges of the aryl group, the monovalent hetero ring group and the substituted amino group as the substituent which $Ar^{T1}$ optionally has, respectively.

The examples and preferable ranges of the substituent which $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ optionally have are the same as the examples and preferable ranges of the substituent which the substituent which $Ar^{T1}$ optionally has optionally further has.

$L^{T1}$ is preferably an arylene group or a divalent hetero ring group, more preferably an arylene group, and the foregoing groups optionally have a substituent.

The arylene group represented by $L^{T1}$ is preferably a group represented by the formula (A-1) to the formula (A-9), the formula (A-19) or the formula (A-20), more preferably a group represented by the formula (A-1) to the formula (A-3), the formula (A-8) or the formula (A-9), further preferably a group represented by the formula (A-1) or (A-2), and the foregoing groups optionally have a substituent.

The divalent hetero ring group represented by $L^1$ is preferably a group represented by the formula (AA-1) to the formula (AA-6), the formula (AA-10) to the formula (AA-15) or the formula (AA-18) to the formula (AA-22), more preferably a group represented by the formula (AA-1) to the formula (AA-4), the formula (AA-10) to the formula (AA-15).

The examples and preferable ranges of the substituent which $L^{T1}$ optionally has are the same as the examples and preferable ranges of the substituent which $Ar^{T1}$ optionally has.

$R^{T1'}$ is preferably an aryl group or a monovalent hetero ring group, more preferably an aryl group, and the foregoing groups optionally have a substituent.

The examples and preferable ranges of the aryl group and the monovalent hetero ring group represented by $R^{T1'}$ are the same as the examples and preferable ranges of the aryl group and the monovalent hetero ring group as the substituent which $Ar^{T1}$ optionally has, respectively.

The examples and preferable ranges of the substituent which $R^{T1'}$ optionally has are the same as the examples and preferable ranges of the substituent which the substituent which $Ar^{T1}$ optionally has optionally further has.

The number of carbon atoms of the aromatic hydrocarbon group represented by $Ar^{T2}$, not including the number of carbon atoms of the substituent, is usually 6 to 60, preferably 6 to 30, more preferably 6 to 18.

The aromatic hydrocarbon group represented by $Ar^{T2}$ is preferably an aromatic hydrocarbon group containing a group represented by —C(=O)— in the ring or an aromatic hydrocarbon group having an electron attracting group, and the foregoing groups optionally have a substituent, since the light emitting device of the present invention is more excellent in external quantum efficiency.

The aromatic hydrocarbon group containing a group represented by —C(=O)— in the ring includes groups obtained by removing from a naphthoquinone ring, an anthraquinone ring, a phenanthoquinone ring, an indenone ring, a fluorenone ring, a tetralon ring, rings obtained by condensing one or more and five or less benzene rings to these rings, or rings obtained by condensing two or more and five or less these rings one or more hydrogen atoms bonding directly to carbon atoms constituting the ring, preferably groups obtained by removing from a naphthoquinone ring, an anthraquinone ring, a phenanthoquinone ring, a fluorenone ring or a phenanthreone ring one or more hydrogen atoms bonding directly to carbon atoms constituting the ring, and the foregoing groups optionally have a substituent.

The aromatic hydrocarbon group other than an aromatic hydrocarbon group containing a group represented by —C(=O)— in the ring includes groups obtained by removing from a benzene ring, a naphthalene ring, an indene ring, a fluorene ring, a phenanthrene ring, a dihydrophenanthrene ring, or rings obtained by condensing two or more and five or less these rings one or more hydrogen atoms bonding directly to carbon atoms constituting the ring, and since the light emitting device of the present invention is more excellent in external quantum efficiency, it is preferably a group obtained by removing from a benzene ring, a naphthalene ring, a fluorene ring, a spirobifluorene ring, a phenanthrene ring or a dihydrophenanthrene ring one or more hydrogen atoms bonding directly to carbon atoms constituting the ring, more preferably a benzene ring, a fluorene ring or a spirobifluorene ring, further preferably a benzene ring, and the foregoing rings optionally have a substituent.

The electron attracting group includes, for example, an alkyl group having a fluorene atom as a substituent, a fluorene atom, a cyano group, a nitro group, an acyl group and a carboxyl group, and is preferably an alkyl group having a fluorene atom as a substituent, a fluorene atom, a cyano group or an acyl group, more preferably a cyano group.

The alkyl group having a fluorene atom as a substituent is preferably a trifluoromethyl group, a pentafluoroethyl group, a perfluorobutyl group, a perfluorohexyl group or a perfluorooctyl group.

In the aromatic hydrocarbon group having an electron attracting group, the number of the electron attracting group of the aromatic hydrocarbon group is usually 1 to 10, preferably 1 to 5, more preferably 1 to 3, further preferably 1 or 2.

The number of carbon atoms of the hetero ring group represented by $Ar^{T2}$, not including the number of carbon atoms of the substituent, is usually 2 to 60, preferably 2 to 30, more preferably 3 to 15.

The hetero ring group represented by $Ar^{T2}$ is preferably a monocyclic hetero ring group containing two or more groups represented by =N— in the ring, or a condensed-cyclic hetero ring group containing at least one group selected from the group consisting of a group represented by —C(=O)—, a group represented by —S(=O)—, a group represented by —S(=O)$_2$— and a group represented by =N— in the ring, more preferably a monocyclic hetero ring group containing two or more groups represented by =N— in the ring, and the foregoing groups optionally have a substituent, since the light emitting device of the present invention is more excellent in external quantum efficiency.

The monocyclic hetero ring group containing two or more groups represented by =N— in the ring includes groups obtained by removing from a triazole ring, an oxadiazole ring, a thiadiazole ring, a diazabenzene ring or a triazine ring one or more hydrogen atoms bonding directly to carbon atoms constituting the ring, and is preferably a group obtained by removing from a triazole ring, a diazabenzene ring or a triazine ring one or more hydrogen atoms bonding directly to carbon atoms constituting the ring, more preferably a group obtained by removing from a pyrimidine ring or a triazine ring one or more hydrogen atoms bonding directly to carbon atoms constituting the ring, and the foregoing groups optionally have a substituent.

The condensed-cyclic hetero ring group containing at least one group selected from the group consisting of a group represented by —C(=O)—, a group represented by —S(=O)—, a group represented by —S(=O)$_2$— and a group represented by =N— in the ring is a group obtained by removing from a benzothiophene dioxide ring, a benzothiophene oxide ring, a benzopyranone ring, an azanaphthalene ring, a diazanaphthalene ring, a triazanaphthalene ring, an azaindole ring, a diazaindole ring, a quinoline ring, a benzodiazole ring, a benzotriazole ring, a benzooxadiazole ring, a benzothiadiazole ring, rings obtained by condensing one or more and five or less aromatic rings to these rings, or rings obtained by condensing two or more and five or less these rings one or more hydrogen atoms bonding directly to atoms constituting the ring, preferably a group obtained by removing from a dibenzothiophene dioxide ring, a dibenzothiophene oxide ring, a dibenzopyranone ring, an azanaphthalene ring, a diazanaphthalene ring, an azaanthracene ring, a diazaanthracene ring, an azaphenanthrene ring, a diazaphenanthrene ring, an azacarbazole ring, a diazacarbazole ring or an acridone ring one or more hydrogen atoms bonding directly to atoms constituting the ring, more preferably a group obtained by removing from a dibenzothiophene dioxide ring, a dibenzopyranone ring, an azanaphthalene ring, a diazanaphthalene ring, an azaanthracene ring, a diazaanthracene ring or a diazaphenanthrene ring one or more hydrogen atoms bonding directly to atoms constituting the ring, further preferably a group obtained by removing from a dibenzothiophene dioxide ring one or more hydrogen atoms bonding directly to atoms constituting the ring, and the foregoing groups optionally have a substituent.

The condensed-cyclic hetero ring group containing at least one group selected from the group consisting of a group represented by —C(=O)—, a group represented by —S(=O)—, a group represented by —S(=O)$_2$— and a group represented by =N— in the ring is preferably a condensed-cyclic hetero ring group containing at least one group selected from the group consisting of a group represented by —S(=O)$_2$— and a group represented by =N— in the ring, more preferably a condensed-cyclic hetero ring group containing a group represented by —S(=O)$_2$—, and the foregoing groups optionally have a substituent.

In the condensed-cyclic hetero ring group containing at least one group selected from the group consisting of a group represented by —C(=O)—, a group represented by —S(=O)—, a group represented by —S(=O)$_2$— and a group represented by =N— in the ring, the total number of the group represented by —C(=O)—, the group represented by —S(=O)—, the group represented by —S(=O)$_2$— and the group represented by =N— contained in the ring is usually 1 or more and 10 or less, preferably 1 to 5, more preferably 1 to 3, further preferably 1.

The hetero ring group represented by $Ar^{T2}$ other than the monocyclic hetero ring group containing two or more groups represented by =N— in the ring and the a condensed-cyclic hetero ring group containing at least one group selected from the group consisting of a group represented by —C(=O)—, a group represented by —S(=O)—, a group represented by —S(=O)$_2$— and a group represented by =N— in the ring is preferably a group obtained by removing from a pyridine ring, a diazole ring, a dibenzofuran ring or a dibenzothiophene ring one or more hydrogen atoms bonding directly to atoms constituting the ring, and the foregoing groups optionally have a substituent.

$Ar^{T2}$ is preferably a monocyclic hetero ring group containing two or more groups represented by =N— in the ring, a condensed-cyclic hetero ring group containing at least one group selected from the group consisting of a group represented by —C(=O)—, a group represented by —S(=O)—, a group represented by —S(=O)$_2$— and a group represented by =N— in the ring, an aromatic hydrocarbon group containing a group represented by —C(=O)— in the ring or an aromatic hydrocarbon group having an electron attracting group, more preferably a monocyclic hetero ring group containing two or more groups represented by =N— in the ring, or a condensed-cyclic hetero ring group containing at least one group selected from the group consisting of a group represented by —C(=O)—, a group represented by —S(=O)—, a group represented by —S(=)$_2$— and a group represented by =N— in the ring, further preferably a monocyclic hetero ring group containing two or more groups represented by =N— in the ring, and the foregoing groups optionally have a substituent, since the light emitting device of the present invention is more excellent in external quantum efficiency.

The substituent which $Ar^{T2}$ optionally has (different from a group represented by the formula (1T') described later, the same shall apply hereinafter) is preferably an alkyl group, a cycloalkyl group, an alkoxy group, a cycloalkoxy group, an aryl group, an aryloxy group, a monovalent hetero ring group other than the monovalent donor type hetero ring group, or an electron attracting group, more preferably an alkyl group, an aryl group, a monovalent hetero ring group other than the monovalent donor type hetero ring group, or an electron attracting group, further preferably an alkyl group or an aryl group, and the foregoing groups optionally have a substituent.

The examples and preferable ranges of the aryl group as the substituent which $Ar^{T2}$ optionally has are the same as the examples and preferable ranges of the aryl group as the substituent which $Ar^{T1}$ optionally has.

The monovalent hetero ring group other than the monovalent donor type hetero ring group is preferably a pyridyl group, a pyrimidinyl group, a triazinyl group, a quinolinyl group, an isoquinolinyl group, a dibenzofuranyl group, a dibenzothienyl group, an azacarbazolyl group or a diazacarbazolyl group, more preferably a pyridyl group, a pyrimidinyl group or a triazinyl group, and the foregoing groups optionally further have a substituent.

The examples and preferable ranges of the substituent which the substituent which $Ar^{T2}$ optionally has optionally further has are the same as the examples and preferable ranges of the substituent which the substituent which $Ar^{T1}$ optionally has optionally further has.

The compound represented by the formula (T-1) is preferably a compound represented by the formula (T'-1) to the formula (T'-16), more preferably a compound represented by the formula (T'-1) to the formula (T'-5) or the formula (T'-10) to the formula (T'-12), further preferably a compound represented by the formula (T'-1) or the formula (T'-3), particularly preferably a compound represented by the formula (T'-3), since the light emitting device of the present invention is more excellent in external quantum efficiency.

[Chemical Formula 41]

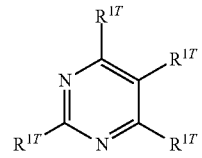

(T'-1)

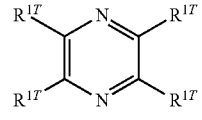

(T'-2)

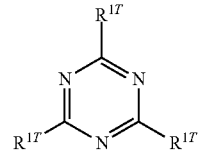

(T'-3)

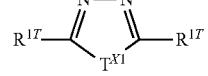

(T'-4)

-continued (T'-5) 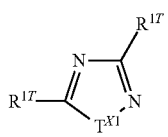

[Chemical Formula 42]

(T'-6) 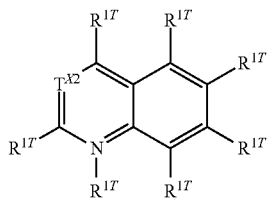

(T'-7) 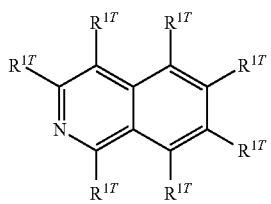

(T'-8) 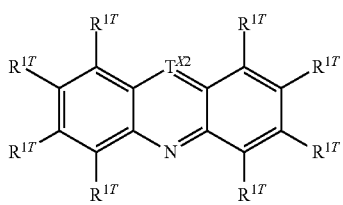

(T'-9) 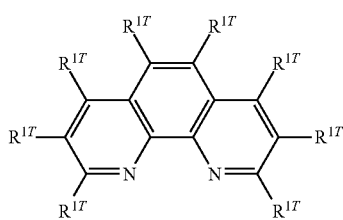

[Chemical Formula 43]

(T'-10) 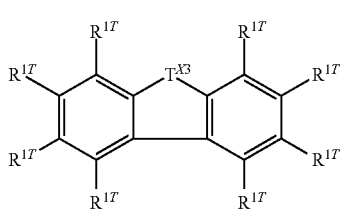

(T'-11) 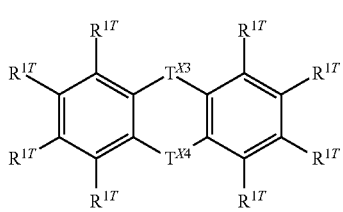

(T'-12) 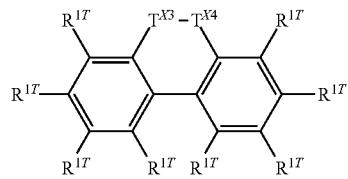

[Chemical Formula 44]

(T'-13) 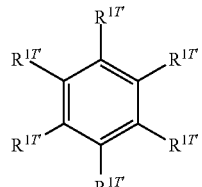

(T'-14) 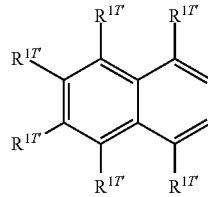

(T'-16) 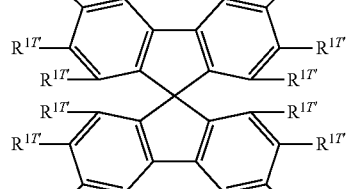

(T'-15) 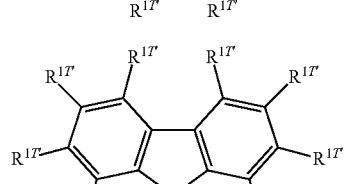

[wherein, $T^{X1}$ represents an oxygen atom, a sulfur atom or a group represented by —N($R^{1T}$)—.

$T^{X2}$ represents a group represented by =N— or a group represented by =C($R^{1T}$)—.

$T^{X3}$ represents a group represented by —C(=O)—, a group represented by —S(=O)— or a group represented by —S(=O)$_2$—.

$T^{X4}$ represents an oxygen atom, a sulfur atom, a group represented by —N($R^{1T}$)—, a group represented by —C(=O)—, a group represented by —S(=O)— or a group represented by —S(=O)$_2$—.

$R^{1T}$ and $R^{1T\prime}$ each independently represent a hydrogen atom, an alkyl group, a cycloalkyl group, an alkoxy group, a cycloalkoxy group, an aryl group, an aryloxy group, a monovalent hetero ring group other than the monovalent donor type hetero ring group, an electron attracting group or a group represented by the formula (1T'), and the foregoing groups optionally have a substituent.

A plurality of $R^{1T}$ may be the same or different. At least one of the plurality of $R^{1T}$ is a group represented by the formula (1T').

A plurality of $R^{1Ti}$ may be the same or different. At least one of the plurality of $R^{1Ti}$ is a group represented by the formula (1T'), and at least one of them is an electron attracting group.]

$T^{X1}$ is preferably a group represented by $-N(R^{1T})-$.

$T^{X3}$ is preferably a group represented by $-C(=O)-$ or a group represented by $-S(=O)_2-$, more preferably a group represented by $-S(=O)_2-$.

$T^{X4}$ is preferably an oxygen atom, a sulfur atom, a group represented by $-N(R^{1T})-$, a group represented by $-C(=O)-$ or a group represented by $-S(=O)_2-$, more preferably an oxygen atom, a sulfur atom or a group represented by $-N(R^{1T})-$, further preferably an oxygen atom.

$R^{1T}$ is preferably a hydrogen atom, an alkyl group, an aryl group, a monovalent hetero ring group other than the monovalent donor type hetero ring group, an electron attracting group or a group represented by the formula (1T'), more preferably a hydrogen atom, an alkyl group, an aryl group or a group represented by the formula (1T'), further preferably a hydrogen atom, an aryl group or a group represented by the formula (1T'), and the foregoing groups optionally have a substituent. At least one of a plurality of $R^{1T}$ is a group represented by the formula (1T').

$R^{1Ti}$ is preferably a hydrogen atom, an alkyl group, an aryl group, a monovalent hetero ring group other than the monovalent donor type hetero ring group, an electron attracting group or a group represented by the formula (1T'), more preferably a hydrogen atom, an alkyl group, an aryl group, an electron attracting group or a group represented by the formula (1T'), further preferably a hydrogen atom, an electron attracting group or a group represented by the formula (1T'), and the foregoing groups optionally have a substituent. At least one of a plurality of $R^{1Ti}$ is a group represented by the formula (1T'), and at least one of them is an electron attracting group.]

The examples and preferable ranges of the substituent which $R^{1T}$ and $R^{1Ti}$ optionally have are the same as the examples and preferable ranges of the substituent which the substituent which $Ar^{T1}$ optionally has optionally further has.

Of a plurality of $R^{1T}$, 1 or 2 groups $R^{1T}$ preferably represent a group represented by the formula (1T').

Of a plurality of $R^{1Ti}$, 1 to 5 groups $R^{1Ti}$ preferably represent a group represented by the formula (1T'), 1 or 2 groups $R^{1Ti}$ more preferably represent a group represented by the formula (1T').

Of a plurality of $R^{1Ti}$, 1 to 5 groups $R^{1Ti}$ preferably represent an electron attracting group, 1 to 3 groups $R^{1Ti}$ more preferably represent an electron attracting group, 1 or 2 groups $R^{1Ti}$ further preferably represent an electron attracting group.

[Chemical Formula 45]

(1T')

[wherein, $L^{T1}$, $n^{T1}$ and $Ar^{T1}$ represent the same meaning as described above.]

It is preferable that the compound (T) satisfies Requirement (I) and Requirement (II), since the light emitting device of the present invention is more excellent in external quantum efficiency.

The compound (T) includes, for example, compounds represented by the following formulae. In the formula, $Z^1$ represents a group represented by $-N=$ or a group represented by $-CH=$. $Z^2$ represents an oxygen atom or a sulfur atom. $Z^3$ represents a group represented by $-C(=O)-$ or a group represented by $-S(=O)_2-$. When a plurality of $Z^1$, $Z^2$ and $Z^3$ are present, they may be the same or different at each occurrence.

[Chemical Formula 46]

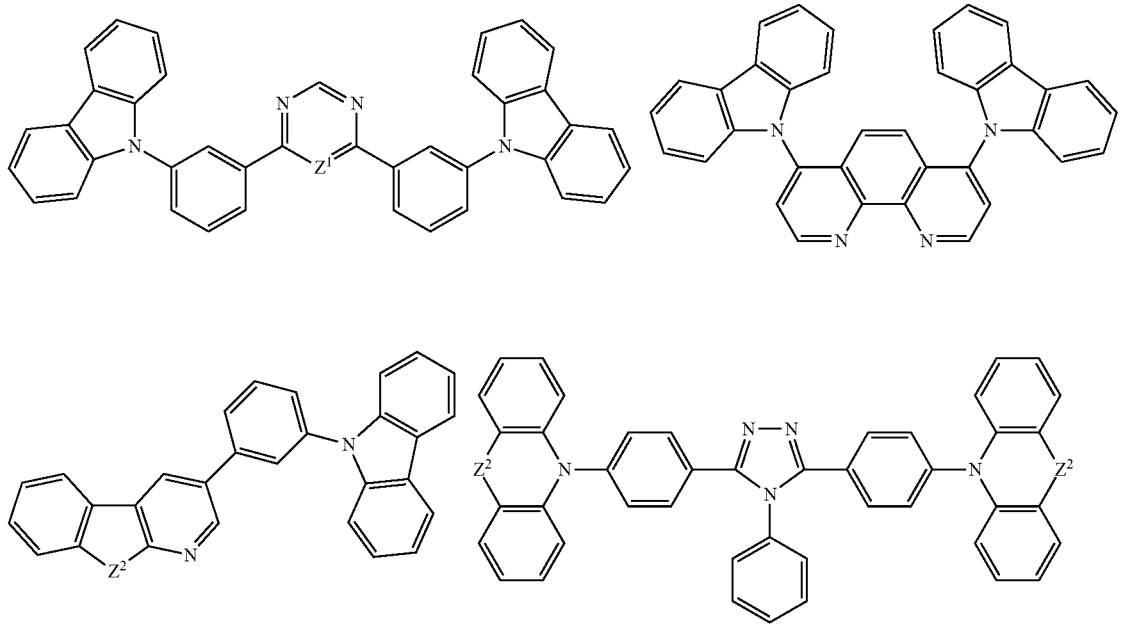

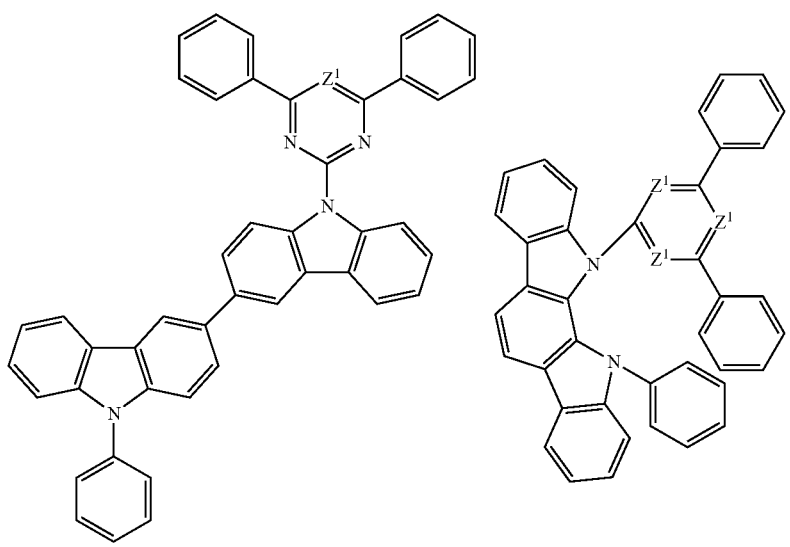
[Chemical Formula 47]
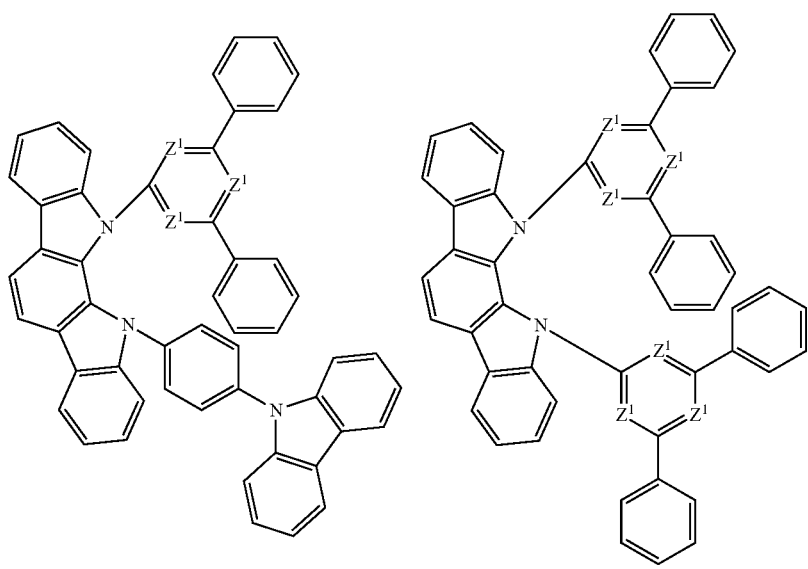
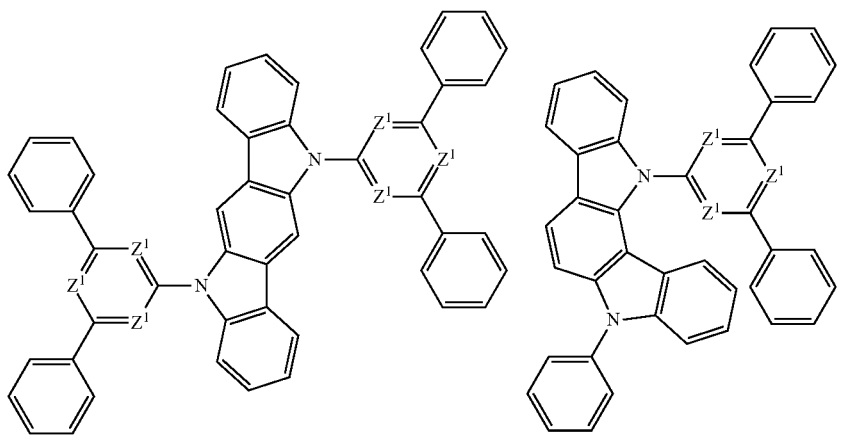

[Chemical Formula 48]
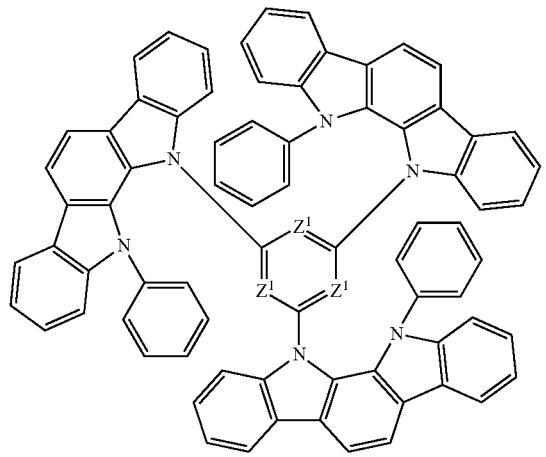
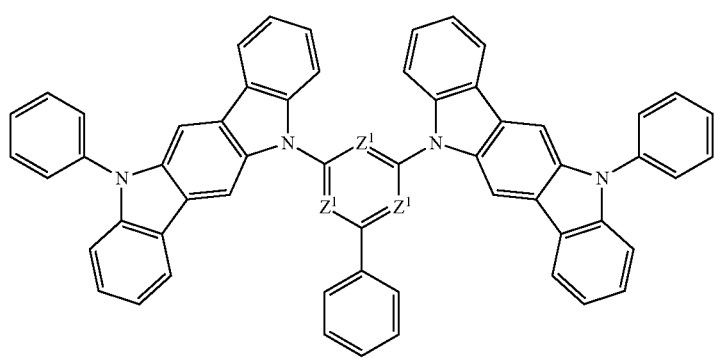
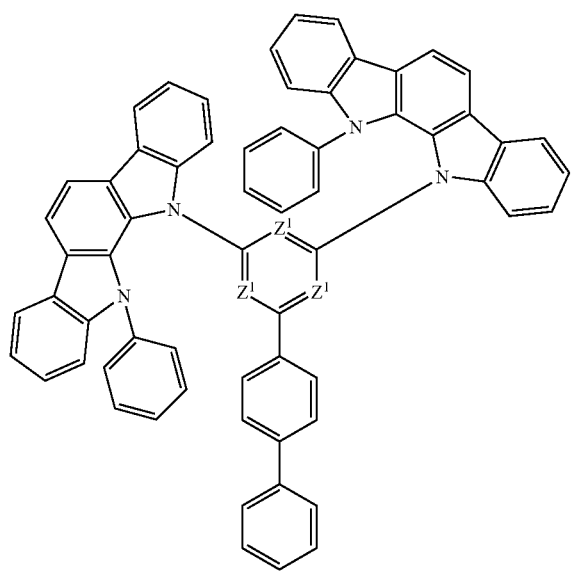

-continued
[Chemical Formula 49]
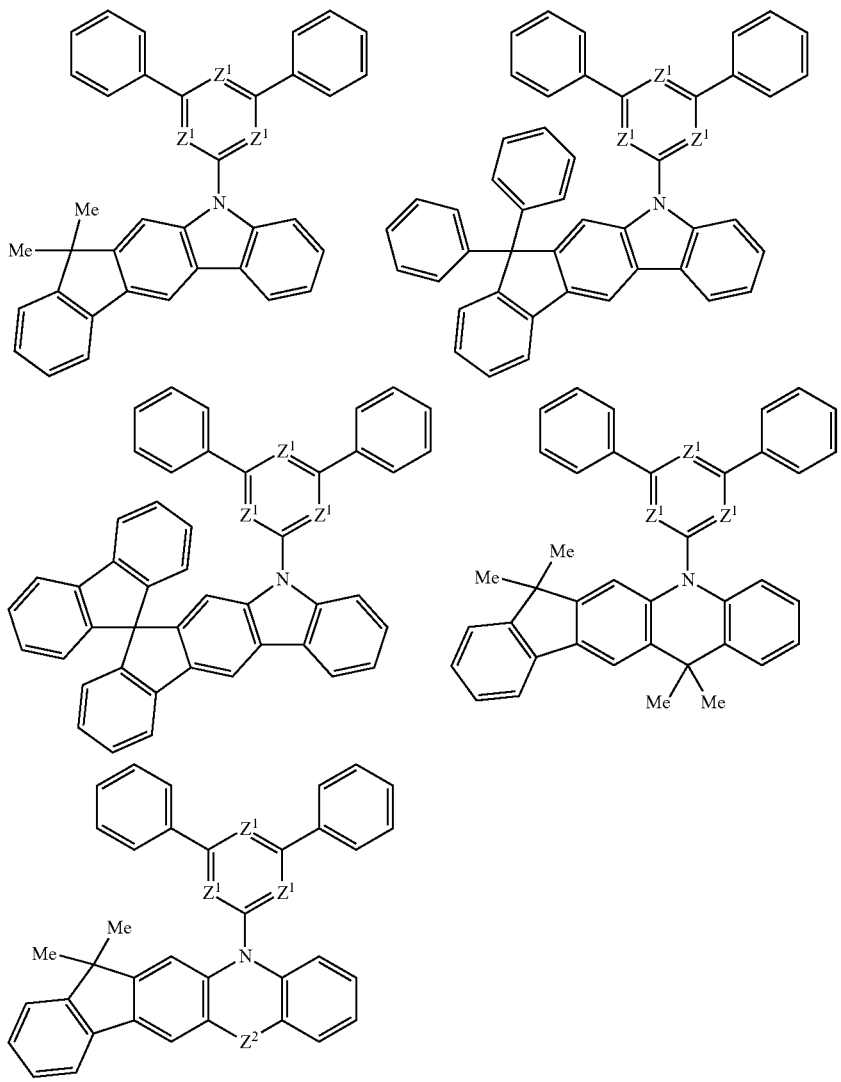
[Chemical Formula 50]
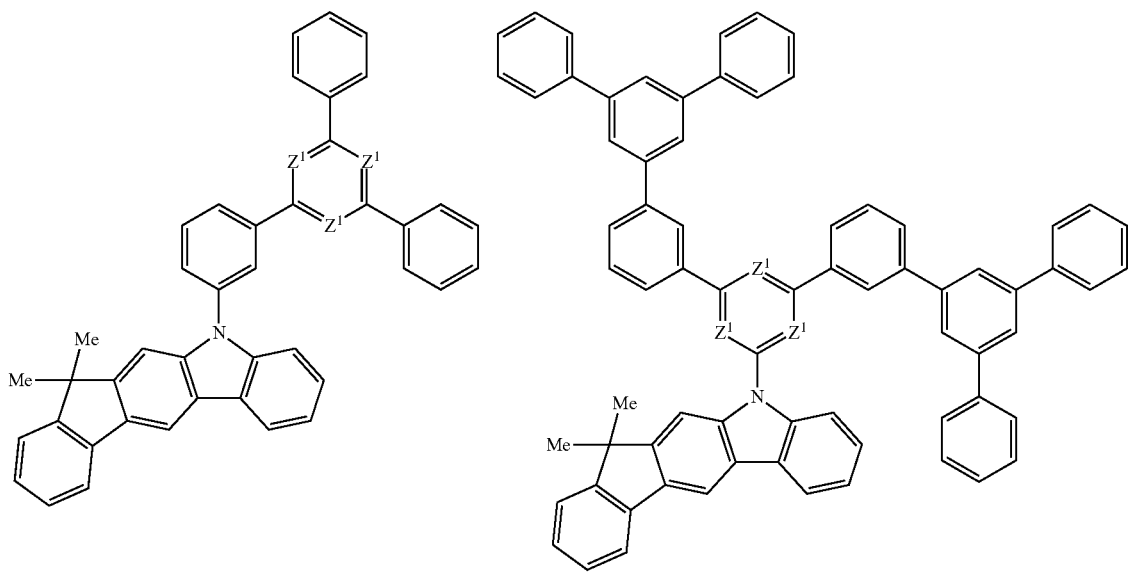

-continued
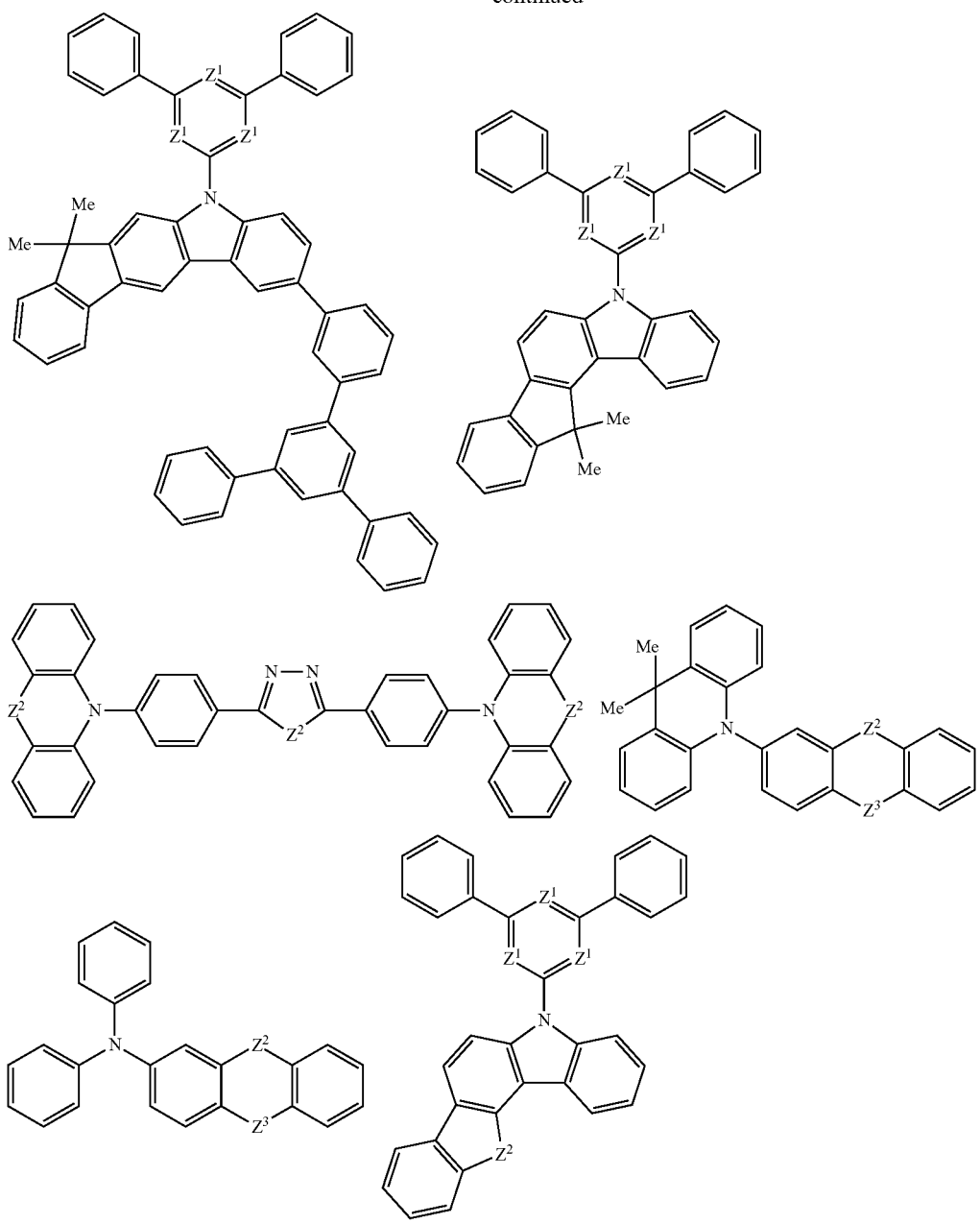
[Chemical Formula 51]
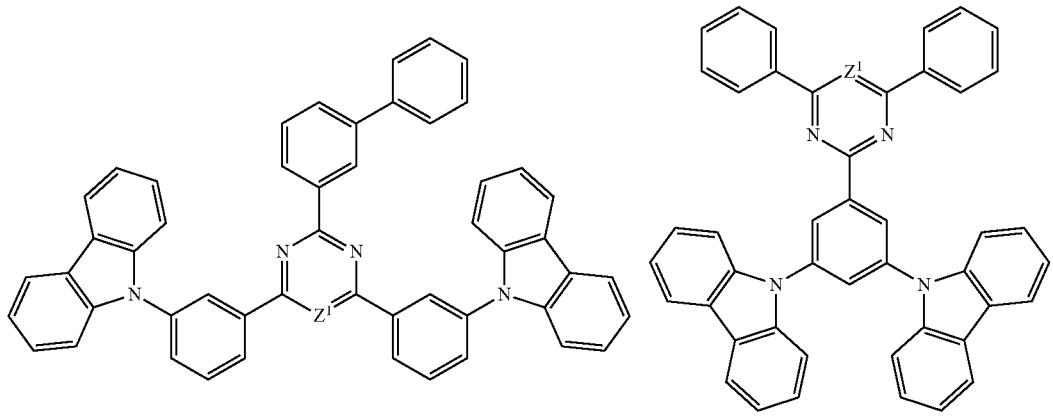

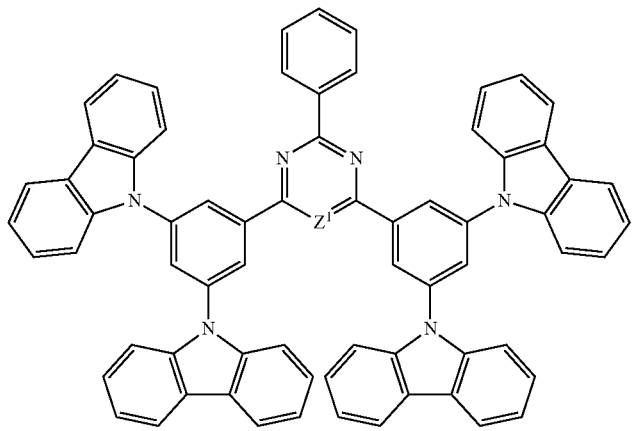
[Chemical Formula 52]
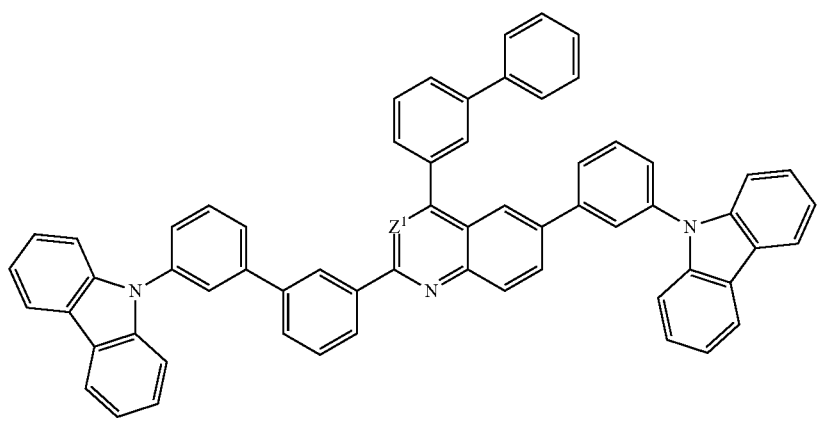
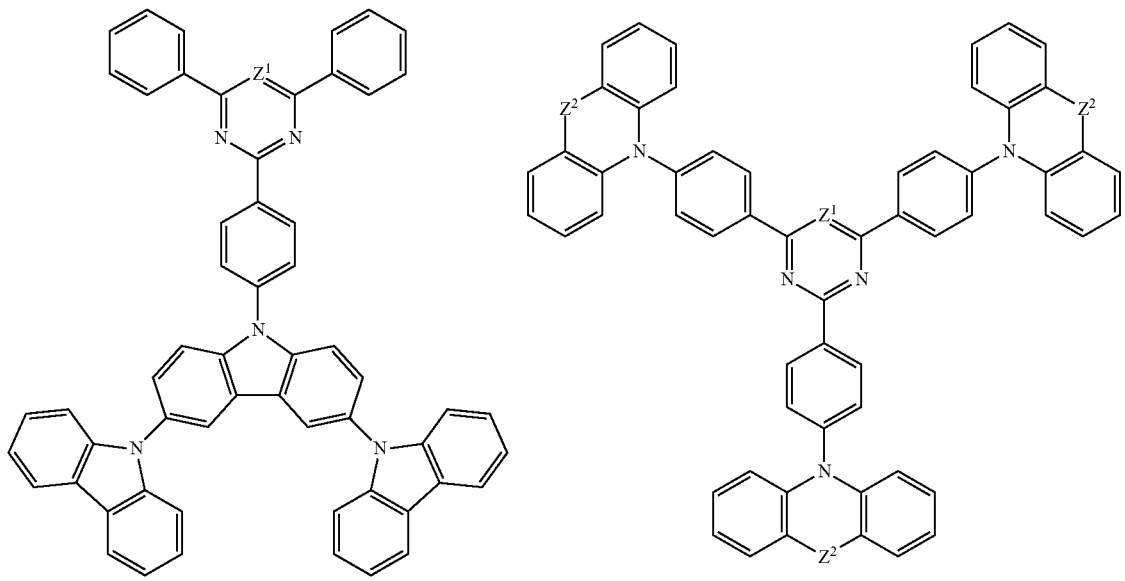

[Chemical Formula 53]
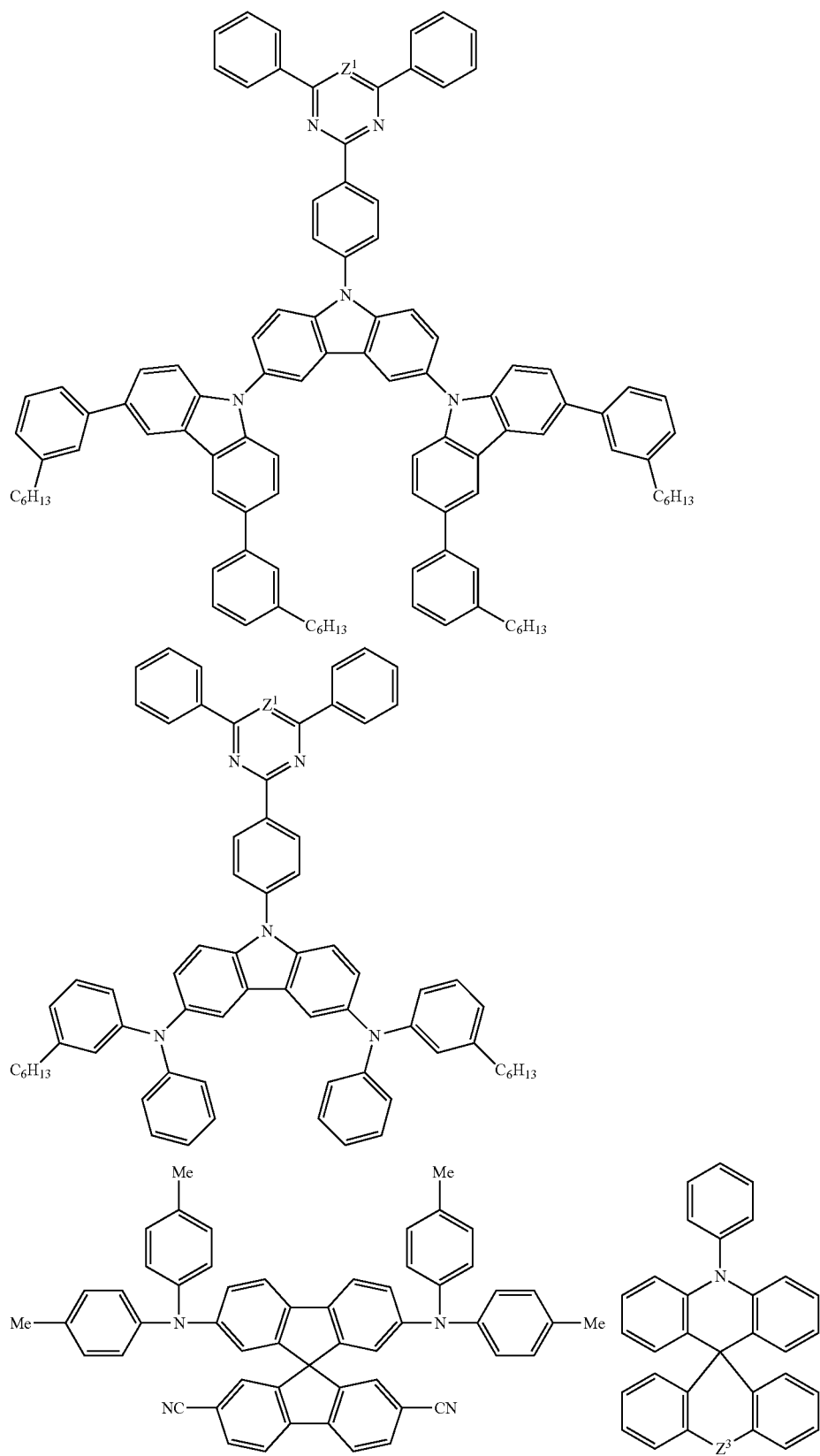

[Chemical Formula 54]

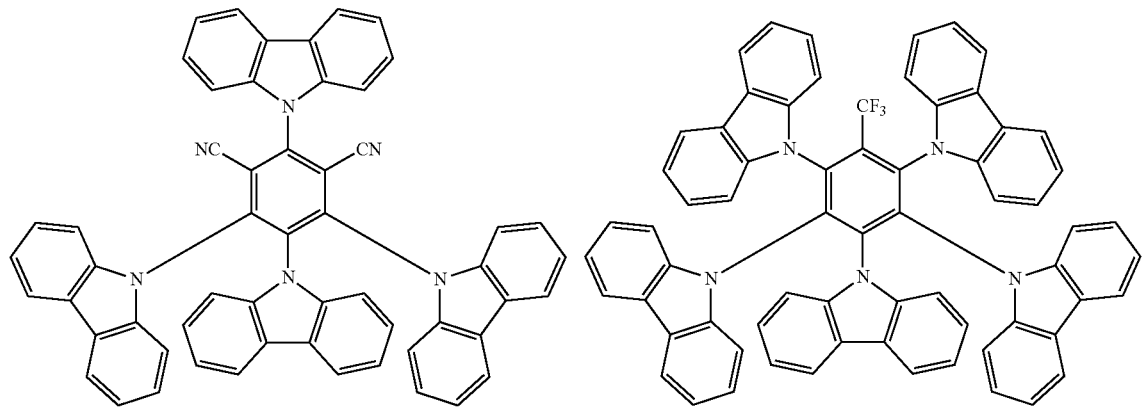

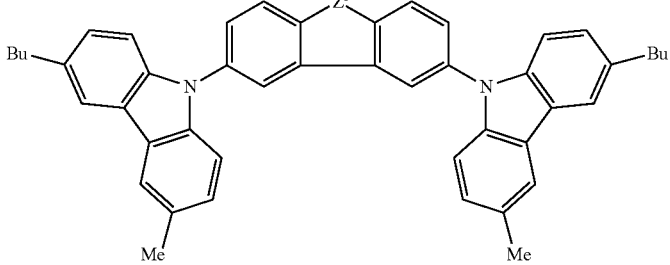

[Chemical Formula 55]

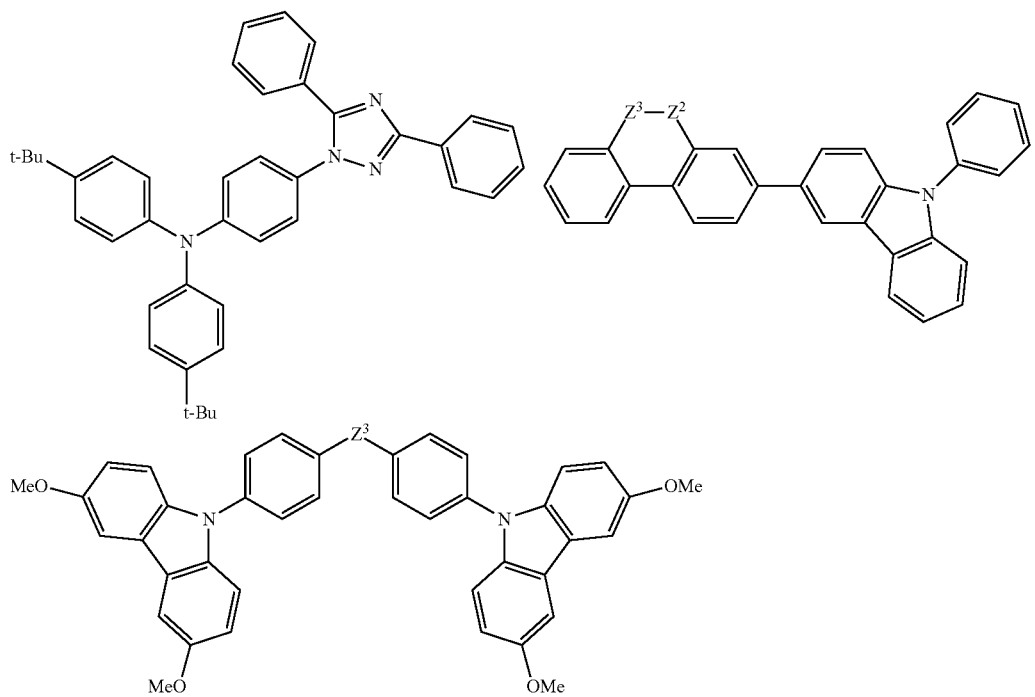

$Z^1$ is preferably a group represented by —N═. $Z^2$ is preferably an oxygen atom. $Z^3$ is preferably a group represented by —S(═O)$_2$—.

The compound (T) is available from Aldrich, Luminescence Technology Corp. and the like. Additionally, it can be synthesized according to methods described in, for example, International Publication WO 2007/063754, International Publication WO 2008/056746, International Publication WO 2011/032686, International Publication WO 2012/096263, JP-A No. 2009-227663, JP-A No. 2010-275255, Advanced Materials (Adv. Mater), vol. 26, pp. 7931-7958, 2014.

[First Composition]

The first organic layer may be a layer containing a compound (T), a phosphorescent transition metal complex, and at least one selected from the group consisting of a hole transporting material, a hole injection material, an electron transporting material, an electron injection material, a fluorescent compound and an antioxidant (hereinafter, referred to also as "first composition"). The hole transporting material, the hole injection material, the electron transporting material, the electron injection material and the fluorescent compound are different from the compound (T).

[Hole Transporting Material]

The hole transporting material is classified into a low molecular compound and a polymer compound, and is preferably a polymer compound. The hole transporting material may have a crosslinking group.

The polymer compound includes, for example, polyvinylcarbazole and derivatives thereof; and polyarylnene having an aromatic amine structure in the side chain or main chain and derivatives thereof. The polymer compound may be a compound to which an electron accepting site is bonded. The electron accepting site includes, for example, fullerene, tetrafluorotetracyanoquinodimethane, tetracyanoethylene, trinitrofluorenone and the like, preferably fullerene.

In the first composition, the compounding amount of the hole transporting material is usually 1 to 400 parts by mass, preferably 5 to 150 parts by mass, when the sum of the compound (T) and the phosphorescent transition metal complex is taken as 100 parts by mass.

The hole transporting material may be used singly or in combination of two or more kinds thereof.

[Electron Transporting Material]

The electron transporting material is classified into a low molecular compound and a polymer compound. The electron transporting material may have a crosslinking group.

The low molecular compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene, and derivatives thereof. The polymer compound may be doped with a metal.

In the first composition, the compounding amount of the electron transporting material is usually 1 to 400 parts by mass, preferably 5 to 150 parts by mass, when the sum of the compound (T) and the phosphorescent transition metal complex is taken as 100 parts by mass.

The electron transporting material may be used singly or in combination of two or more.

[Hole Injection Material and Electron Injection Material]

The hole injection material and the electron injection material are each classified into a low molecular compound and a polymer compound. The hole injection material and the electron injection material may have a crosslinking group.

The low molecular compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer containing an aromatic amine structure in the main chain or side chain, and the like.

In the first composition, the compounding amounts of the hole injection material and the electron injection material are each usually 1 to 400 parts by mass, preferably 5 to 150 parts by mass when the sum of the compound (T) and the phosphorescent transition metal complex is taken as 100 parts by mass.

The electron injection material and the hole injection material each may be used singly or in combination of two or more kinds thereof.

[Ion Doping]

When the hole injection material or the electron injection material contains an electrically conductive polymer, the electric conductivity of the electrically conductive polymer is preferably $1 \times 10^{-5}$ S/cm to $1 \times 10^3$ S/cm. For adjusting the electric conductivity of the electrically conductive polymer within such a range, the electrically conductive polymer can be doped with an appropriate amount of ions.

The kind of the ion to be doped is an anion for the hole injection material and a cation for the electron injection material. The anion includes, for example, a polystyrenesulfonic ion, an alkylbenzenesulfonic ion and a camphor sulfonic ion. The cation includes, for example, a lithium ion, a sodium ion, a potassium ion and a tetrabutylammonium ion.

The ion to be doped may be used singly or in combination of two or more kinds thereof.

[Fluorescent Compound]

The fluorescent compound is classified into a low molecular compound and a polymer compound. The fluorescent compound may have a crosslinking group.

The low molecular compound includes, for example, naphthalene and derivatives thereof, anthracene and derivatives thereof and perylene and derivatives thereof.

The polymer compound includes polymer compounds containing, for example, a phenylene group, a naphthalenediyl group, anthracenediyl group, a fluorenediyl group, a phenanthrenedilyl group, a dihydrophenanthrenedilyl group, a group represented by the formula (X) described later, a carbazolediyl group, a phenoxazinediyl group, a phenothiazinediyl group, a pyrenediyl group and the like.

In the first composition, the compounding amount of the fluorescent compound is usually 0.1 to 400 parts by mass, preferably 5 to 150 parts by mass when the sum of the compound (T) and the phosphorescent transition metal complex is taken as 100 parts by mass.

The fluorescent compound may be used singly or in combination of two or more kinds thereof.

[Antioxidant]

The antioxidant may be a compound which is soluble in a solvent which is the same as the solvent for the compound (T) and the phosphorescent transition metal complex and does not inhibit light emission and charge transportation, and includes, for example, phenol type antioxidants and phosphorus-based antioxidants.

In the first composition, the compounding amount of the antioxidant is usually 0.001 to 10 parts by mass, when the sum of the compound (T) and the phosphorescent transition metal complex is taken as 100 parts by mass.

The antioxidant may be used singly or in combination of two or more kinds thereof.

[First Ink]

The composition containing the compound (T), a phosphorescent transition metal complex and a solvent (hereinafter, referred to also as "first ink") can be suitably used for application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method, a nozzle coat method and the like.

The viscosity of the first ink may be adjusted according to the type of the application method, and when applied to printing methods in which a solution passes through a discharge device such as an inkjet printing method and the like, the viscosity is preferably 1 to 20 mPa·s at 25° C. since clogging and flight deflection during discharge scarcely occur.

The solvent contained in the first ink is preferably a solvent capable of dissolving or uniformly dispersing solid components in the ink. The solvent includes, for example, chlorine-based solvents such as 1,2-dichloroethane, 1,1,2-trichloroethane, chlorobenzene, o-dichlorobenzene and the like; ether type solvents such as tetrahydrofuran, dioxane, anisole, 4-methylanisole and the like; aromatic hydrocarbon type solvents such as toluene, xylene, mesitylene, ethylbenzene, n-hexylbenzene, cyclohexylbenzene and the like; aliphatic hydrocarbon type solvents such as cyclohexane, methylcyclohexane, n-pentane, n-hexane, n-heptane, n-octane, n-nonane, n-decane, n-dodecane, bicyclohexyl and the like; ketone type solvents such as acetone, methyl ethyl ketone, cyclohexanone, acetophenone and the like; ester type solvents such as ethylacetate, butylacetate, ethylcellosolve acetate, methyl benzoate, phenyl acetate and the like; polyhydric alcohol type solvents such as ethylene glycol, glycerin, 1,2-hexanediol and the like; alcohol type solvents such as isopropyl alcohol, cyclohexanol and the like; sulfoxide type solvents such as dimethyl sulfoxide and the like; and amide type solvents such as N-methyl-2-pyrrolidone, N,N-dimethylformamide and the like. The solvent may be used singly or in combination of two or more kinds thereof.

In the first ink, the compounding amount of the solvent is usually 1000 to 100000 parts by mass, preferably 2000 to 20000 parts by mass, when the sum of the compound (T) and the phosphorescent transition metal complex is taken as 100 parts by mass.

<Second Organic Layer>

The second organic layer is a layer containing a crosslinked body of a polymer compound containing a constitutional unit having a crosslinking group (hereinafter, referred to also as "polymer compound of the second organic layer").

The crosslinked body of the polymer compound of the second organic layer is obtained by bringing the polymer compound of the second organic layer into crosslinked state by the above-described methods, conditions and the like.

[Polymer Compound of Second Organic Layer]

The energy level of the lowest triplet excited state of the polymer compound of the second organic layer is preferably 2.34 eV or more, more preferably 2.36 eV or more, since the light emitting device of the present invention is more excellent in external quantum efficiency.

The energy level of the lowest triplet excited state of the polymer compound of the second organic layer is preferably 2.30 eV or more and 4.00 eV or less, more preferably 2.34 eV or more and 3.00 eV or less, further preferably 2.36 eV or more and 2.70 eV or less, since the light emitting device of the present invention is more excellent in external quantum efficiency and the polymer compound of the second organic layer is excellent in stability.

The energy level of the lowest triplet excited state of the polymer compound can be determined by fabricating a film composed of the polymer compound, measuring the phosphorescent emission spectrum of this film at 77 K, and converting the maximum peak wavelength at the shortest wavelength in the resultant phosphorescent emission spectrum into energy. The thickness of the film is usually 10 nm to 1 µm. For formation of the film, for example, application methods such as a spin coat method, a drop cast method and the like are mentioned, and a drop cast method is preferable.

The magnitude relation of the energy level of the lowest triplet excited state of the polymer compound can be compared by a computational scientific method. Specifically, the energy level of the lowest triplet excited state of each polymer compound is calculated by a computational scientific method, and the magnitude relation can be compared by the calculation result obtained.

In the computational scientific method, Gaussian 09 is used as the quantum chemical calculation program, and the ground state of a dimer as a monomer unit is structurally-optimized by the B3LYP level density functional method, and as the basis function, 6-31G* is used in this process. Then, the energy level of the lowest triplet excited state of the polymer compound is calculated by the B3LYP level time dependent density functional method. When an atom for which 6-31G* cannot be used is contained, LANL2DZ is used for this atom. In the case where the polymer compound consists of only one type of monomer unit, the lowest excited triplet energy is calculated for a dimer of the monomer unit and is taken as the lowest excited triplet energy of the polymer compound. When the polymer compound is composed of two or more kinds of monomer units, the lowest excited triplet energy is calculated for all dimers which can occur in the polymerization of the monomer unit contained in a molar ratio of 1 or more, and the lowest value is adopted as the lowest excited triplet energy of the polymer compound.

The polymer compound of the second organic layer is preferably a polymer compound containing a constitutional unit having at least one crosslinking group selected from Group A of crosslinking group, since the light emitting device of the present invention is more excellent in external quantum efficiency.

The crosslinking group selected from Group A of crosslinking group is preferably a crosslinking group represented by the formula (XL-1) to the formula (XL-4), the formula (XL-7) to the formula (XL-10) or the formula (XL-16) to the formula (XL-19), more preferably a crosslinking group represented by the formula (XL-1), the formula (XL-3), the formula (XL-9), the formula (XL-10), the formula (XL-16) or the formula (XL-17) to the formula (XL-19), further preferably a crosslinking group represented by the formula (XL-1), the formula (XL-16) or the formula (XL-17) to the formula (XL-19), particularly preferably a crosslinking group represented by the formula (XL-1) or the formula (XL-17), since the light emitting device of the present invention is more excellent in external quantum efficiency.

The constitutional unit having at least one crosslinking group selected from Group A of crosslinking group contained in the polymer compound of the second organic layer is preferably a constitutional unit represented by the formula (2) or a constitutional unit represented by the formula (2'), and constitutional units represented by the following formulae may also be used.

[Chemical Formula 56]

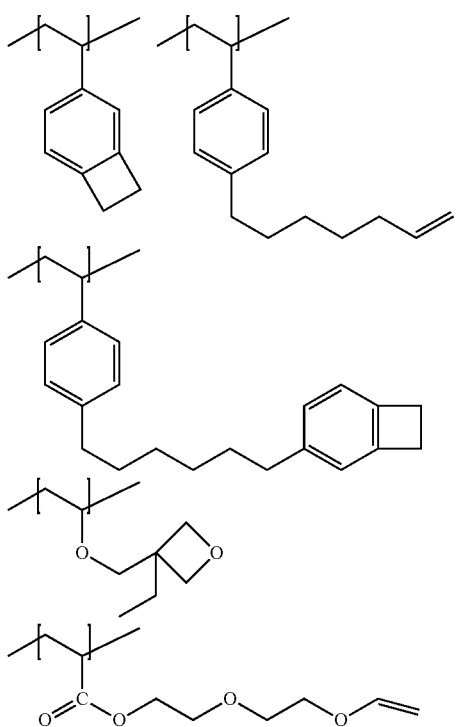

When the polymer compound of the second organic layer contains two or more constitutional units having at least one crosslinking group selected from Group A of crosslinking group, it is preferable that the crosslinking groups are mutually different in at least two constitutional units having at least one crosslinking group selected from Group A of crosslinking group. The combination of the mutually different crosslinking groups is preferably a combination of a crosslinking group represented by the formula (XL-1), the formula (XL-2), the formula (XL-5) to the formula (XL-8) or the formula (XL-14) to the formula (XL-16) with a crosslinking group represented by the formula (XL-3), the formula (XL-4), the formula (XL-13) or the formula (XL-17) to the formula (XL-19), more preferably a combination of a crosslinking group represented by the formula (XL-1) or the formula (XL-16) with a crosslinking group represented by the formula (XL-17) to the formula (XL-19), further preferably a combination of a crosslinking group represented by the formula (XL-1) with a crosslinking group represented by the formula (XL-17).

(Constitutional Unit Represented by the Formula (2))

nA is preferably an integer of 0 to 3, more preferably an integer of 0 to 2, further preferably 1, since the light emitting device of the present invention is more excellent in external quantum efficiency.

n is preferably 2, since the light emitting device of the present invention is more excellent in external quantum efficiency.

$Ar^3$ is preferably an aromatic hydrocarbon group optionally having a substituent, since the light emitting device of the present invention is more excellent in external quantum efficiency.

The number of carbon atoms of the aromatic hydrocarbon group represented by $Ar^3$, not including the number of carbon atoms of the substituent, is usually 6 to 60, preferably 6 to 30, more preferably 6 to 18.

The examples and the preferable range of the arylene group portion obtained by removing n substituents of the aromatic hydrocarbon group represented by $Ar^3$ are the same as the examples and the preferable range of the arylene group represented by $Ar^{Y1}$ described later.

The number of carbon atoms of the hetero ring group represented by $Ar^3$, not including the number of carbon atoms of the substituent, is usually 2 to 60, preferably 3 to 30, more preferably 4 to 18.

The examples and the preferable range of the divalent hetero ring group portion obtained by removing n substituents of the hetero ring group represented by $Ar^3$ are the same as the examples and the preferable range of the divalent hetero ring group represented by $Ar^{Y1}$ described later.

The examples and the preferable range of the substituent which the group represented by $Ar^3$ optionally has are the same as the examples and the preferable range of the substituent which the group represented by $Ar^{Y1}$ optionally has described later.

The examples and the preferable range of the substituent which the substituent which the group represented by $Ar^3$ optionally has optionally further has are the same as the examples and the preferable range of the substituent which the substituent which the group represented by $Ar^{Y1}$ optionally has optionally further has described later.

The number of carbon atoms of the alkylene group represented by $L^A$, not including the number of carbon atoms of the substituent, is usually 1 to 20, preferably 1 to 15, more preferably 1 to 10. The number of carbon atoms of the cycloalkylene group represented by $L^A$, not including the number of carbon atoms of the substituent, is usually 3 to 20.

The alkylene group and the cycloalkylene group represented by $L^A$ optionally have a substituent and examples thereof include a methylene group, an ethylene group, a propylene group, a butylene group, a hexylene group, a cyclohexylene group and an octylene group, and groups obtained by substituting a hydrogen atom in these groups with an alkyl group, a cycloalkyl group, an alkoxy group, a cycloalkoxy group, an aryl group, a monovalent hetero ring group, a fluorine atom and the like.

The examples and the preferable range of the arylene group represented by $L^A$ are the same as the examples and the preferable range of the arylene group represented by $Ar^{Y1}$, however, the arylene group represented by $L^A$ is preferably a phenylene group or a fluorenediyl group, more preferably a m-phenylene group, a p-phenylene group, a fluorene-2,7-diyl group or a fluorene-9,9-diyl group, and the foregoing groups optionally further have a substituent, since the light emitting device of the present invention is more excellent in external quantum efficiency.

The examples and the preferable range of the divalent hetero ring group represented by $L^A$ are the same as the examples and the preferable range of the divalent hetero ring group represented by $Ar^{Y1}$.

$L^A$ is preferably an arylene group or an alkylene group, more preferably a phenylene group, a fluorenediyl group or an alkylene group, further preferably an alkylene group, and these groups optionally have a substituent, since production of the polymer compound of the second organic layer becomes easy.

The substituent which the group represented by $L^A$ optionally has is preferably an alkyl group, a cycloalkyl group, an alkoxy group, a cycloalkoxy group, an aryl group, a monovalent hetero ring group, a substituted amino group, a fluorine atom, a cyano group or a crosslinking group selected from Group A of crosslinking group, more preferably an alkyl group, a cycloalkyl group, an alkoxy group, a cycloalkoxy group, an aryl group, a monovalent hetero ring group or a crosslinking group selected from Group A of crosslinking group, further preferably an alkyl group, a cycloalkyl group, an aryl group or a monovalent hetero ring group, particularly preferably an alkyl group, a cycloalkyl group or an aryl group, and the foregoing groups optionally further have a substituent.

The examples and the preferable range of the substituent which the substituent which the group represented by $L^A$ optionally has optionally further has are the same as the examples and the preferable range of the substituent which the substituent which the group represented by $Ar^{Y1}$ optionally has optionally further has.

X is preferably a crosslinking group represented by the formula (XL-1) to the formula (XL-4), the formula (XL-7) to the formula (XL-10) or the formula (XL-16) to the formula (XL-19), more preferably a crosslinking group represented by the formula (XL-1), the formula (XL-3), the formula (XL-9), the formula (XL-10), the formula (XL-16) or the formula (XL-17) to the formula (XL-19), further preferably a crosslinking group represented by the formula (XL-1), the formula (XL-16) or the formula (XL-17) to the formula (XL-19), particularly preferably a crosslinking group represented by the formula (XL-1) or the formula (XL-17), since the light emitting device of the present invention is more excellent in external quantum efficiency.

The amount of the constitutional unit represented by the formula (2) is preferably 0.5 to 80% by mol, more preferably 3 to 65% by mol, further preferably 5 to 50% by mol with respect to the total amount of constitutional units contained in the polymer compound of the second organic layer, since the polymer compound of the second organic layer is excellent in stability and crosslinkability.

The constitutional unit represented by the formula (2) may be contained only singly or in combination of two or more kinds thereof in the polymer compound of the second organic layer.

When the polymer compound of the second organic layer contains two or more constitutional units represented by the formula (2), it is preferable that the crosslinking groups represented by X are mutually different in at least two constitutional units represented by the formula (2). The preferable range of the combination of the mutually different crosslinking groups represented by X is the same as the preferable range of the combination of the mutually different crosslinking groups described above.

(Constitutional Unit Represented by the Formula (2'))

mA is preferably an integer of 0 to 3, more preferably an integer of 0 to 2, further preferably 0 or 1, particularly preferably 0, since the light emitting device of the present invention is more excellent in external quantum efficiency.

m is preferably 1 or 2, more preferably 2, since the light emitting device of the present invention is more excellent in external quantum efficiency.

c is preferably 0, since production of the polymer compound of the second organic layer is easy and the light emitting device of the present invention is more excellent in external quantum efficiency.

$Ar^5$ is preferably an aromatic hydrocarbon group optionally having a substituent, since the light emitting device of the present invention is more excellent in external quantum efficiency.

The definition and the examples of the arylene group portion obtained by removing m substituents of the aromatic hydrocarbon group represented by $Ar^5$ are the same as the definition and the examples of the arylene group represented by $Ar^{X2}$ in the formula (X) described later.

The definition and the examples of the divalent hetero ring group portion obtained by removing m substituents of the hetero ring group represented by $Ar^5$ are the same as the definition and the examples of the divalent hetero ring group portion represented by $Ar^{X2}$ in the formula (X) described later.

The definition and the examples of the divalent group obtained by removing m substituents of a group in which at least one aromatic hydrocarbon ring and at least one hetero ring are bonded directly represented by $Ar^5$ are the same as the definition and the examples of the divalent group in which at least one arylene group and at least one divalent hetero ring group are bonded directly represented by $Ar^{X2}$ in the formula (X) described later.

$Ar^4$ and $Ar^6$ are each preferably an arylene group optionally having a substituent, since the light emitting device of the present invention is more excellent in external quantum efficiency.

The definition and the examples of the arylene group represented by $Ar^4$ and $Ar^6$ are the same as the definition and the examples of the arylene group represented by $Ar^{X1}$ and $Ar^{X3}$ in the formula (X) described later.

The definition and the examples of the divalent hetero ring group represented by $Ar^4$ and $Ar^6$ are the same as the definition and the examples of the divalent hetero ring group represented by $Ar^{X1}$ and $Ar^{X3}$ in the formula (X) described later.

The examples and preferable ranges of the substituent which the group represented by $Ar^4$, $Ar^5$ and $Ar^6$ optionally has are the same as the examples and preferable ranges of the substituent which a group represented by $Ar^{Y1}$ described later optionally has. The examples and preferable ranges of the substituent which the substituent which the group represented by $Ar^4$, $Ar^5$ and $Ar^6$ optionally has optionally further has are the same as the examples and preferable ranges of the substituent which the substituent which a group represented by $Ar^{Y1}$ described later optionally has optionally further has.

The definition and the examples of the alkylene group, the cycloalkylene group, the arylene group and the divalent hetero ring group represented by $K^A$ are the same as the definition and the examples of the alkylene group, the cycloalkylene group, the arylene group and the divalent hetero ring group represented by $L^A$, respectively.

$K^A$ is preferably an arylene group or an alkylene group, more preferably a phenylene group, a fluorenediyl group or an alkylene group, further preferably a phenylene group or a methylene group, and the foregoing groups optionally have a substituent, since production of the polymer compound of the second organic layer becomes easy.

The examples and the preferable range of the substituent which the group represented by $K^A$ optionally has are the same as the examples and the preferable range of the substituent which the group represented by $L^A$ optionally has.

The examples and the preferable range of the substituent which the substituent which the group represented by $K^A$ optionally has optionally further has are the same as the examples and the preferable range of the substituent which the substituent which the group represented by $Ar^{Y1}$ optionally has optionally further has.

The definition and the examples of the crosslinking group represented by X' are the same as the definition and the examples of the crosslinking group represented by X described above.

The amount of the constitutional unit represented by the formula (2') is preferably 0.5 to 50% by mol, more preferably 3 to 30% by mol, further preferably 5 to 20% by mol with respect to the total amount of constitutional units contained in the polymer compound of the second organic layer, since the polymer compound of the second organic layer is excellent in stability and the polymer compound of the second organic layer is excellent in crosslinkability.

The constitutional unit represented by the formula (2') may be contained only singly or in combination of two or more kinds thereof in the polymer compound of the second organic layer.

When the polymer compound of the second organic layer contains two or more constitutional units represented by the formula (2'), it is preferable that the crosslinking groups represented by X' are mutually different in at least two constitutional units represented by the formula (2'). The preferable range of the combination of the mutually different crosslinking groups represented by X' is the same as the preferable range of the combination of the mutually different crosslinking groups described above.

(Preferable Embodiment of Constitutional Unit Represented by the Formula (2) or (2'))

The constitutional unit represented by the formula (2) includes, for example, constitutional units represented by the formula (2-1) to the formula (2-30), and the constitutional unit represented by the formula (2') includes, for example, constitutional units represented by the formula (2'-1) to the formula (2'-9). Of them, preferable are constitutional units represented by the formula (2-1) to the formula (2-30), more preferable are constitutional units represented by the formula (2-1) to the formula (2-15), the formula (2-19), the formula (2-20), the formula (2-23), the formula (2-25) or the formula (2-30), further preferable are constitutional units represented by the formula (2-1) to the formula (2-9) or the formula (2-30), since the polymer compound of the second organic layer is excellent in crosslinkability.

[Chemical Formula 57]

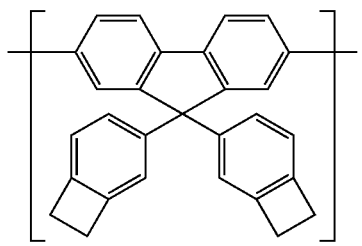

(2-1)

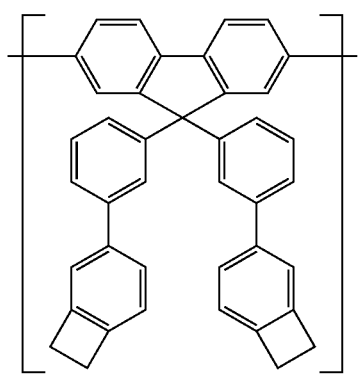

(2-2)

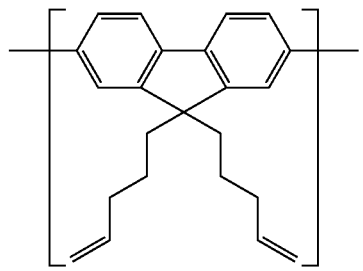

(2-3)

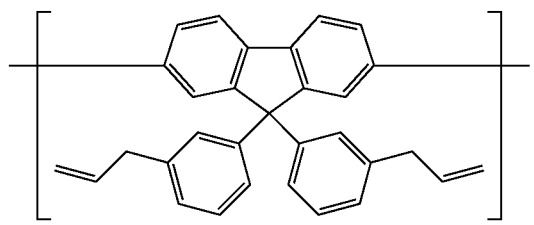

(2-4)

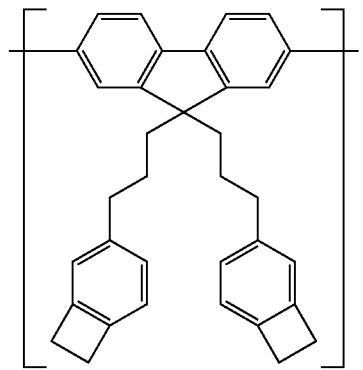

(2-5)

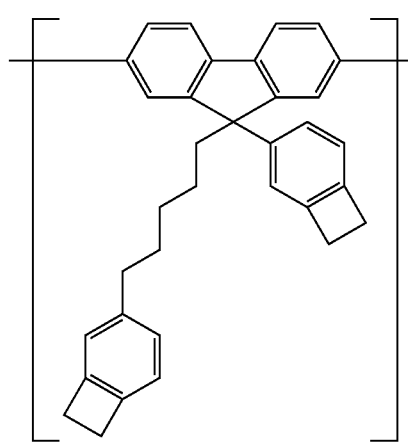

(2-6)

(2-7)
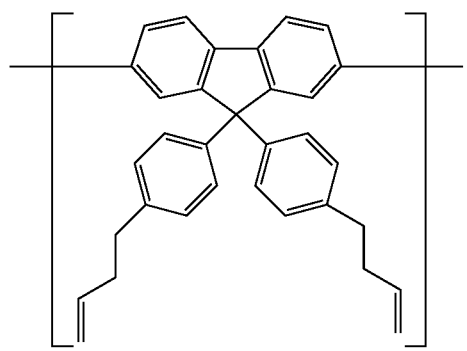
(2-8)
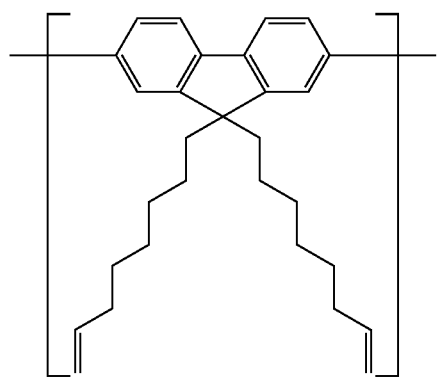
(2-9)
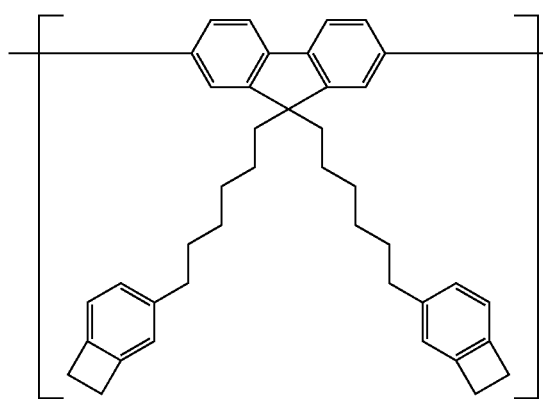
(2-10)
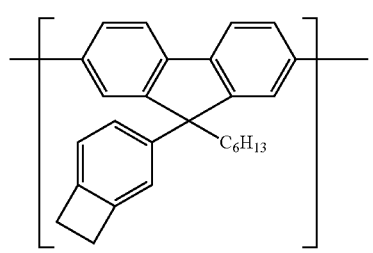
(2-11)
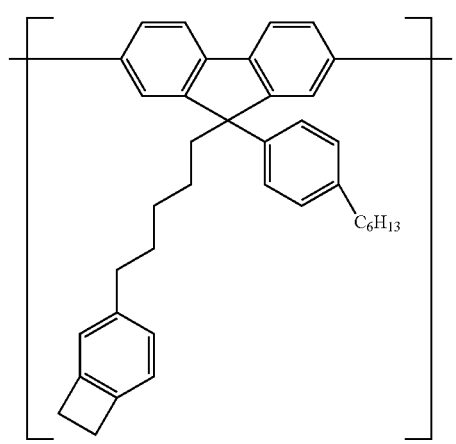
(2-12)
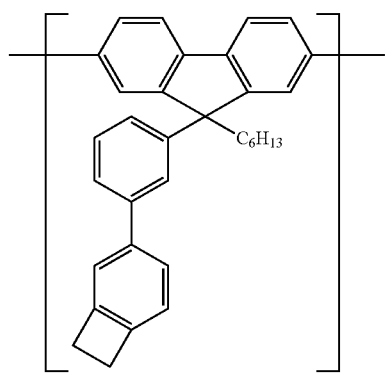
(2-13)
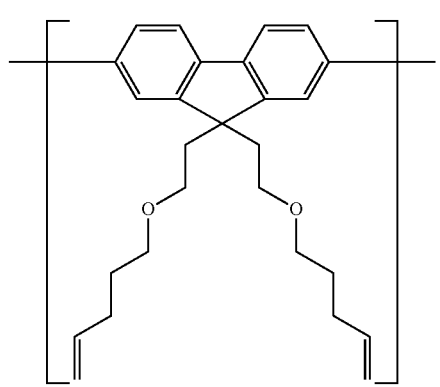
(2-14)
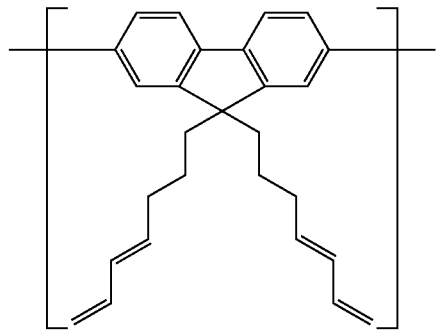

(2-15)
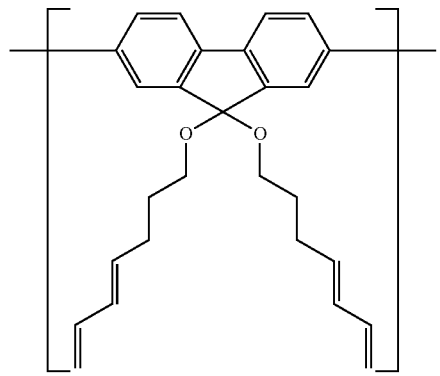
[Chemical Formula 58]
(2-16)
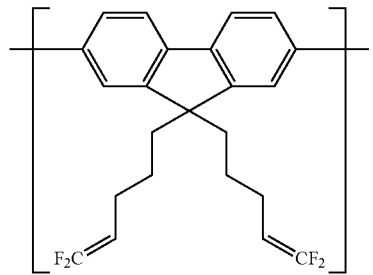
(2-17)
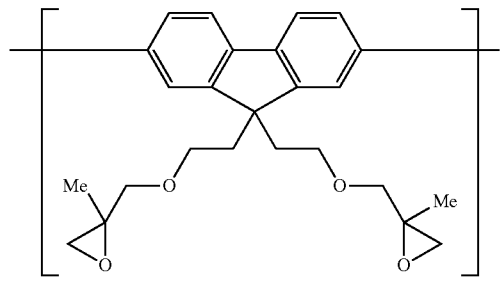
(2-18)
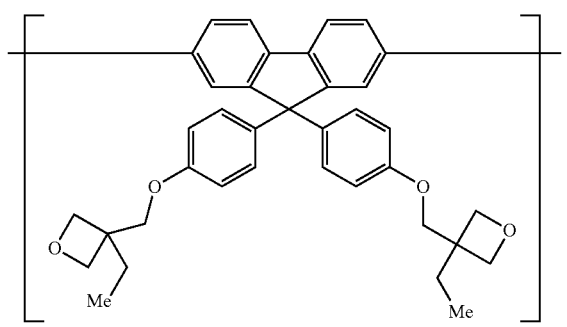
(2-19)
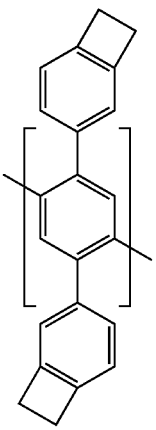
(2-20)
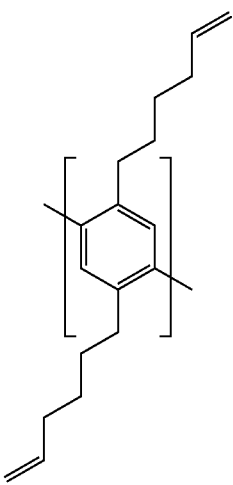
(2-21)
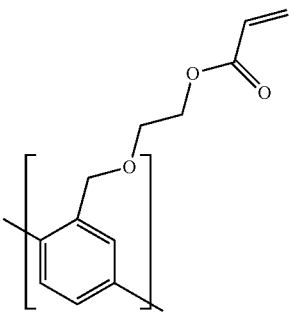

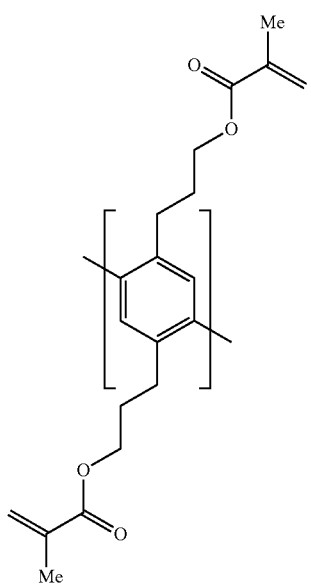
(2-22)
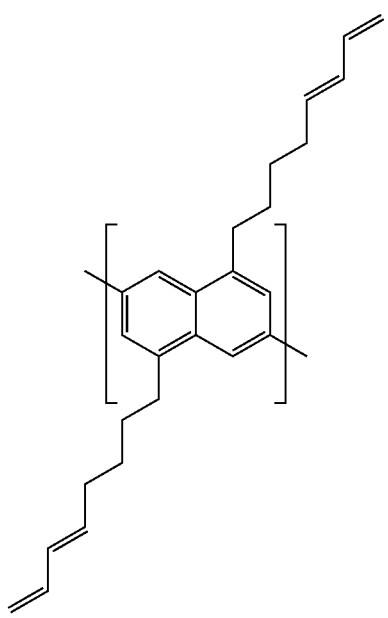
(2-24)
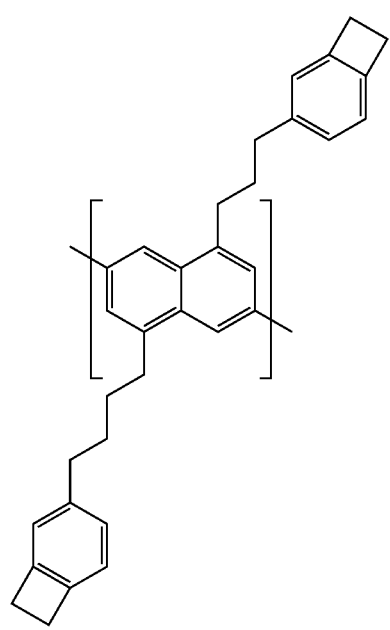
(2-23)
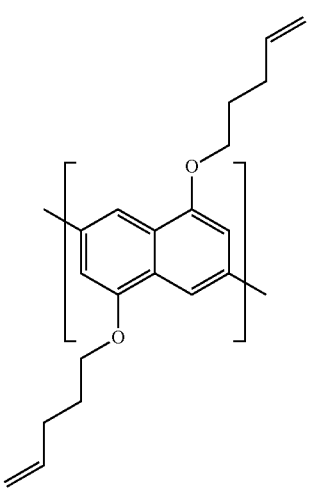
(2-25)

-continued
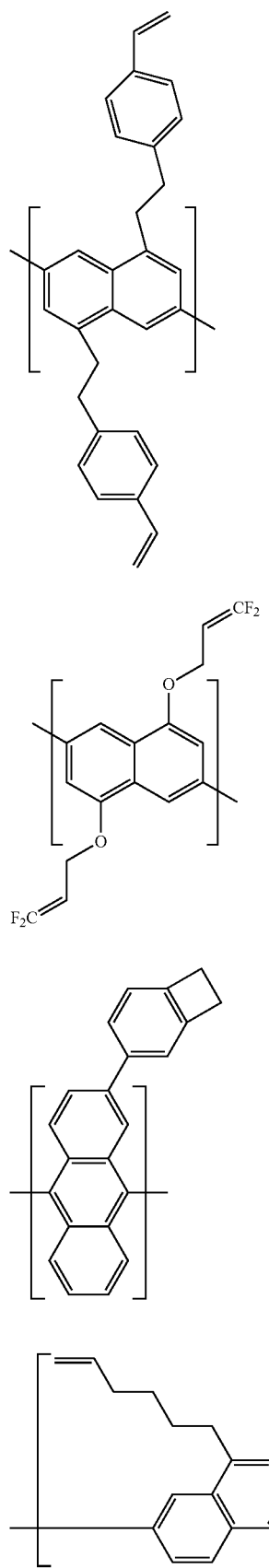
(2-26)
(2-27)
(2-28)
(2-29)
-continued
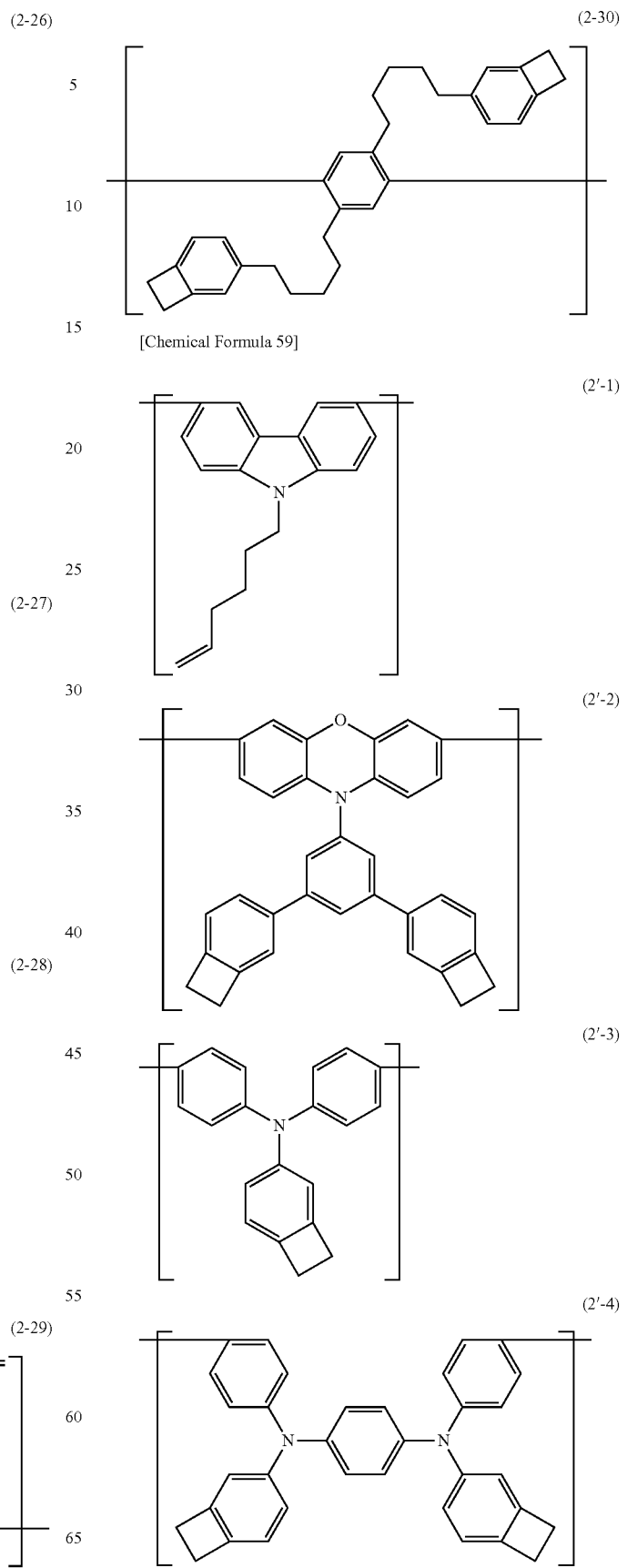
(2-30)
[Chemical Formula 59]
(2'-1)
(2'-2)
(2'-3)
(2'-4)

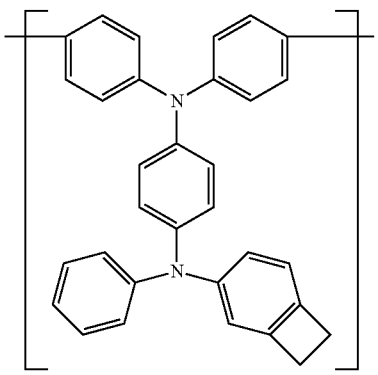

(2'-5)

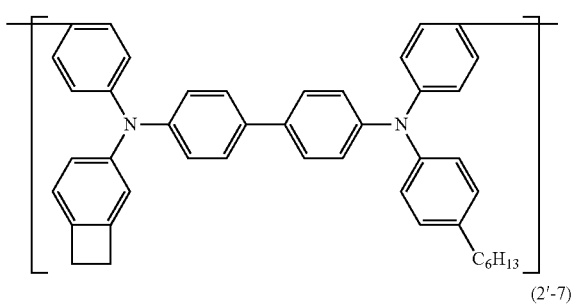

(2'-6)

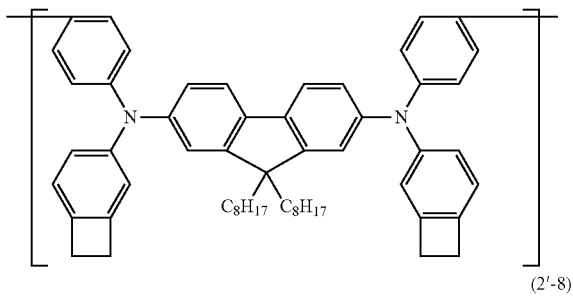

(2'-7)

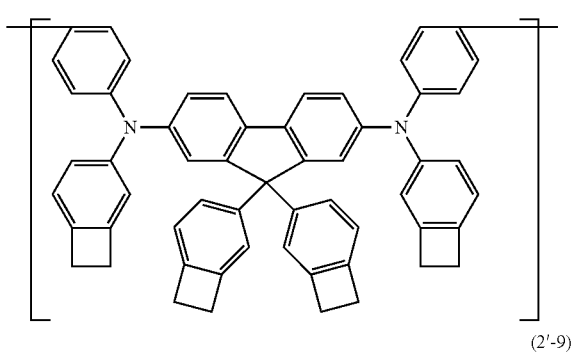

(2'-8)

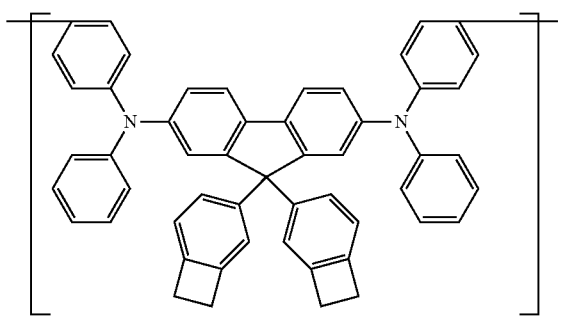

(2'-9)

(Other Constitutional Unit)

It is preferable that the polymer compound of the second organic layer further contains a constitutional unit represented by the formula (Y), since the light emitting device of the present invention is more excellent in external quantum efficiency.

It is preferable that the polymer compound of the second organic layer further contains a constitutional unit represented by the formula (X), since excellent hole transportability is obtained.

It is preferable that the polymer compound of the second organic layer further contains a constitutional unit represented by the formula (X) and a constitutional unit represented by the formula (Y), since excellent hole transportability is obtained and the light emitting device of the present invention is more excellent in external quantum efficiency.

[Chemical Formula 60]

$$-\!\!\left[\mathrm{Ar}^{Y1}\right]\!\!-\quad\quad(Y)$$

[wherein, $\mathrm{Ar}^{Y1}$ represents an arylene group, a divalent hetero ring group or a divalent group in which at least one arylene group and at least one divalent hetero ring group are bonded directly, and the foregoing groups optionally have a substituent.]

The arylene group represented by $\mathrm{Ar}^{Y1}$ is preferably a group represented by the formula (A-1) to the formula (1-10), the formula (A-19) or the formula (A-20), more preferably a group represented by the formula (A-1) to the formula (A-3), the formula (A-6)-the formula (A-10), the formula (A-19) or the formula (A-20), further preferably a group represented by the formula (A-1), the formula (A-2), the formula (A-7), the formula (A-9) or the formula (A-19), since the light emitting device of the present invention is more excellent in external quantum efficiency.

The divalent hetero ring group represented by Aryl is preferably a group represented by the formula (AA-1) to the formula (AA-4), the formula (AA-10) to the formula (AA-15), the formula (AA-18) to the formula (AA-22), the formula (AA-33) or the formula (AA-34), further preferably a group represented by the formula (AA-4), the formula (AA-10), the formula (AA-12), the formula (AA-14) or the formula (AA-33), since the light emitting device of the present invention is more excellent in external quantum efficiency.

In the divalent group in which at least one arylene group and at least one divalent hetero ring group are bonded directly represented by $\mathrm{Ar}^{Y1}$, the more preferable range and the further preferable range of the arylene group and the divalent hetero ring group are the same as the more preferable range and the further preferable range of the arylene group and the divalent hetero ring group represented by Aryl described above, respectively.

"Divalent group in which at least one arylene group and at least one divalent hetero ring group are bonded directly" includes, for example, groups represented by the following formulae, and the foregoing groups optionally have a substituent.

[Chemical Formula 61]

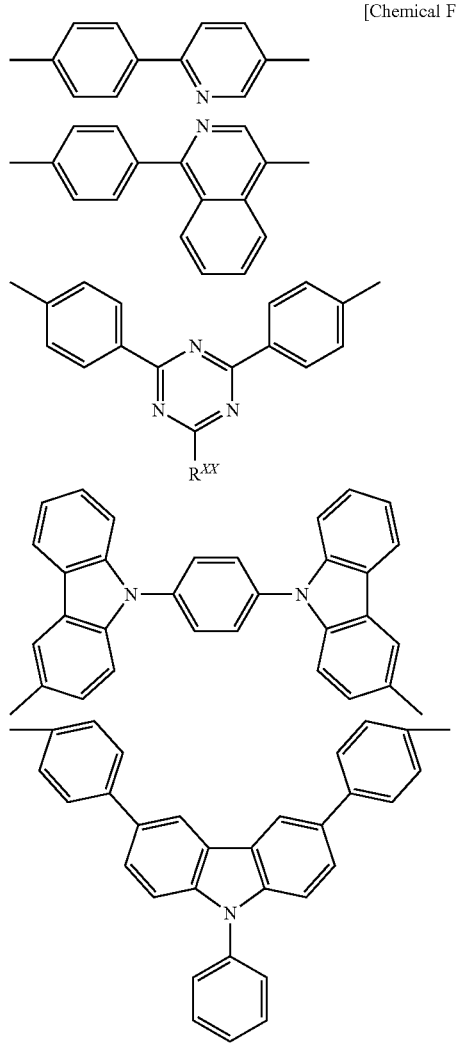

[wherein, $R^{XX}$ represents a hydrogen atom, an alkyl group, a cycloalkyl group, an aryl group or a monovalent hetero ring group, and the foregoing groups optionally have a substituent.]

$R^{XX}$ is preferably an alkyl group, a cycloalkyl group or an aryl group, and the foregoing groups optionally have a substituent.

The substituent which the group represented by $Ar^{Y1}$ optionally has is preferably an alkyl group, a cycloalkyl group, an alkoxy group, a cycloalkoxy group, an aryl group, a monovalent hetero ring group, a substituted amino group, a fluorene atom or a cyano group, more preferably an alkyl group, a cycloalkyl group, an alkoxy group, a cycloalkoxy group, an aryl group, a monovalent hetero ring group or a substituted amino group, further preferably an alkyl group, a cycloalkyl group, an aryl group or a monovalent hetero ring group, particularly preferably an alkyl group, a cycloalkyl group or an aryl group, and the foregoing groups optionally further have a substituent.

The substituent which the substituent which the group represented by $Ar^{Y1}$ optionally has optionally further has is preferably an alkyl group, a cycloalkyl group, an alkoxy group, a cycloalkoxy group, an aryl group, a monovalent hetero ring group, a substituted amino group, a fluorene atom or a cyano group, more preferably an alkyl group, a cycloalkyl group, an aryl group or a monovalent hetero ring group, further preferably an alkyl group or a cycloalkyl group, and the foregoing groups optionally further have a substituent.

The arylene group represented by $Ar^1$ is preferably a group represented by any of the formula (Y-1) or the formula (Y-2), more preferably a group represented by the formula (Y-1), since the light emitting device of the present invention is more excellent in external quantum efficiency and the energy level of the lowest triplet excited state of the polymer compound of the second organic layer is higher.

The divalent group in which at least one arylene group and at least one divalent hetero ring group are bonded directly represented by $Ar^{Y1}$ is preferably a group represented by any of the formula (Y-4) to the formula (Y-7), since the light emitting device of the present invention is more excellent in external quantum efficiency and the polymer compound of the second organic layer is excellent in electron transportability.

The divalent hetero ring group represented by $Ar^{Y1}$ is preferably a group represented by any of the formula (Y-8) to the formula (Y-10), more preferably a group represented by the formula (Y-10), since the light emitting device of the present invention is more excellent in external quantum efficiency and the polymer compound of the second organic layer is excellent in hole transportability.

[Chemical Formula 62]

(Y-1)

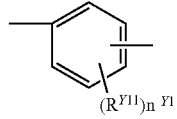

[wherein, $n^{Y1}$ represents an integer of 1 or more and 4 or less.

$R^{Y11}$ represents an alkyl group, a cycloalkyl group, an alkoxy group, a cycloalkoxy group, an aryl group or a monovalent hetero ring group, and the foregoing groups optionally have a substituent. When a plurality of $R^{Y11}$ are present, they may be the same or different, and the adjacent $R^{Y11}$ may be combined together to form a ring together with carbon atoms to which they are attached.]

$n^{Y1}$ is preferably 1 or 2, more preferably 2.

$R^{Y11}$ is preferably an alkyl group, a cycloalkyl group, an aryl group or a monovalent hetero ring group, more preferably an alkyl group, a cycloalkyl group or an aryl group, further preferably an alkyl group or a cycloalkyl group, particularly preferably an alkyl group, and the foregoing groups optionally have a substituent.

When a plurality of $R^{Y11}$ are present, it is preferable that adjacent $R^{Y11}$ are not combined together to form a ring together with carbon atoms to which they are attached.

The examples and preferable ranges of the substituent which $R^{Y11}$ optionally has are the same as the examples and preferable ranges of the substituent which the substituent which a group represented by $Ar^{Y1}$ optionally has optionally further has.

[029-2]

The group represented by the formula (Y-1) is preferably a group represented by the formula (Y-1-1) to the formula (Y-1-4), more preferably a group represented by the formula (Y-1-1) or the formula (Y-1-2), further preferably a group represented by the formula (Y-1-1).

[Chemical Formula 63]

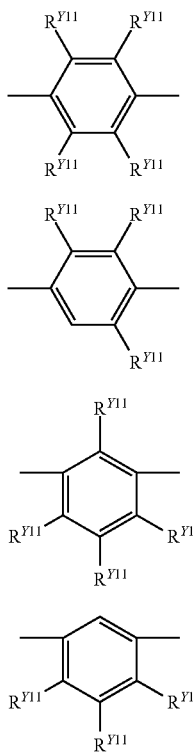

(Y-1-1)

(Y-1-2)

(Y-1-3)

(Y-1-4)

[wherein, $R^{Y11}$ represents the same meaning as described above.

$R^{Y1}$ represents a hydrogen atom, an alkyl group, a cycloalkyl group, an alkoxy group, a cycloalkoxy group, an aryl group or a monovalent hetero ring group, and the foregoing groups optionally have a substituent. A plurality of $R^{Y1}$ may be the same or different, and the adjacent $R^{Y1}$ may be combined together to form a ring together with carbon atoms to which they are attached.

Adjacent $R^{Y1}$ and $R^{Y11}$ may be combined together to form a ring together with carbon atoms to which they are attached.]

$R^{Y1}$ is preferably a hydrogen atom, an alkyl group, a cycloalkyl group, an aryl group or a monovalent hetero ring group, more preferably a hydrogen atom, an alkyl group, a cycloalkyl group or an aryl group, further preferably a hydrogen atom, an alkyl group or a cycloalkyl group, particularly preferably a hydrogen atom or an alkyl group, and the foregoing groups optionally have a substituent.

The examples and preferable ranges of the substituent which $R^{Y1}$ optionally has are the same as the examples and preferable ranges of the substituent which the substituent which a group represented by $Ar^{Y1}$ optionally has optionally further has.

It is preferable that adjacent $R^{Y1}$ are not combined together to form a ring together with carbon atoms to which they are attached.

It is preferable that adjacent $R^{Y1}$ and $R^{Y11}$ are not combined together to form a ring together with carbon atoms to which they are attached.

[Chemical Formula 64]

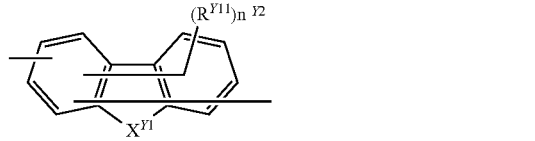

(Y-2)

[wherein, $n^{Y2}$ represents an integer of 1 or more and 6 or less.

$R^{Y11}$ represents the same meaning as described above.

$X^{Y1}$ represents a group represented by —C($R^{Y2}$)$_2$—, —C($R^{Y2}$)=C($R^{Y2}$)— or —C($R^{Y2}$)$_2$—C($R^{Y2}$)$_2$—. $R^{Y2}$ represents a hydrogen atom, an alkyl group, a cycloalkyl group, an alkoxy group, a cycloalkoxy group, an aryl group or a monovalent hetero ring group, and the foregoing groups optionally have a substituent. A plurality of $R^{Y2}$ may be the same or different, $R^{Y2}$ may be combined together to form a ring together with carbon atoms to which they are attached.]

$n^{Y2}$ is preferably an integer of 1 or more and 4 or less, more preferably 1 or 2, further preferably 2.

$R^{Y2}$ is preferably an alkyl group, a cycloalkyl group, an aryl group or a monovalent hetero ring group, more preferably an alkyl group, a cycloalkyl group or an aryl group, and the foregoing groups optionally have a substituent.

The examples and preferable ranges of the substituent which $R^{Y2}$ optionally has are the same as the examples and preferable ranges of the substituent which the substituent which a group represented by $Ar^{Y1}$ optionally has optionally further has.

In $X^{Y1}$, the combination of two groups $R^{Y2}$ in the group represented by —C($R^{Y2}$)$_2$— is preferably a combination in which both represent an alkyl group or a cycloalkyl group, both represent an aryl group, both represent a monovalent hetero ring group, or one represents an alkyl group or a cycloalkyl group and the other represents an aryl group or a monovalent hetero ring group, more preferably a combination in which one represents an alkyl group or a cycloalkyl group and the other represents an aryl group, and these groups optionally have a substituent. Two groups $R^{Y2}$ may be combined together to form a ring together with atoms to which they are attached, and when $R^{Y2}$ forms a ring, the group represented by —C($R^{Y2}$)$_2$— is preferably a group represented by the formula (Y-A1) to the formula (Y-A5), more preferably a group represented by the formula (Y-A4), and the foregoing groups optionally have a substituent.

[Chemical Formula 65]

(Y-A1)

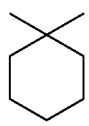

(Y-A2)

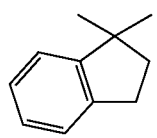

(Y-A3)

-continued

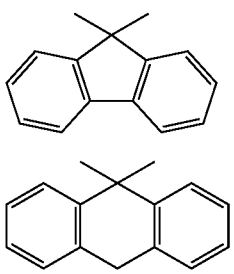
(Y-A4)

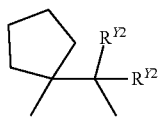
(Y-A5)

In $X^{Y1}$, the combination of two groups $R^{Y2}$ in the group represented by —C($R^{Y2}$)=C($R^{Y2}$)— is preferably a combination in which both represent an alkyl group or a cycloalkyl group, or one represents an alkyl group or a cycloalkyl group and the other represents an aryl group, and the foregoing groups optionally have a substituent.

In $X^{Y1}$, four groups $R^{Y2}$ in the group represented by —C($R^{Y2}$)$_2$—C($R^{Y2}$)$_2$— represent preferably an alkyl group or a cycloalkyl group optionally having a substituent. A plurality of $R^{Y2}$ may be combined together to form a ring together with atoms to which they are attached, and when $R^{Y2}$ forms a ring, the group represented by —C($R^{Y2}$)$_2$—C($R^{Y2}$)$_2$— is preferably a group represented by the formula (Y-B1) to the formula (Y-B5), more preferably a group represented by the formula (Y-B3), and the foregoing groups optionally have a substituent.

[Chemical Formula 66]

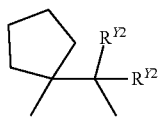
(Y-B1)

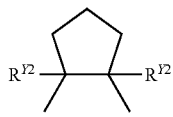
(Y-B2)

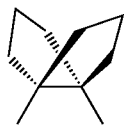
(Y-B3)

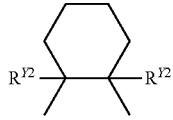
(Y-B4)

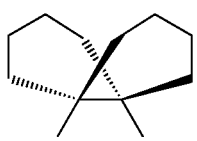
(Y-B5)

[wherein, $R^{Y2}$ represents the same meaning as described above.]

The group represented by the formula (Y-2) is preferably a group represented by the formula (Y-2-1) to (Y-2-4), more preferably a group represented by the formula (Y-2-1) or the formula (Y-2-2).

[Chemical Formula 67]

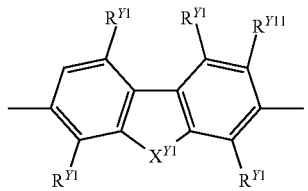
(Y-2-1)

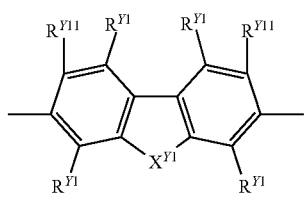
(Y-2-2)

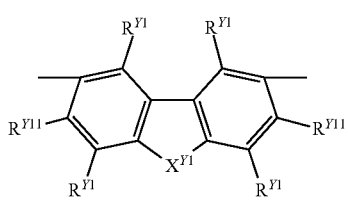
(Y-2-3)

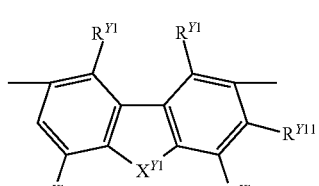
(Y-2-4)

[wherein, $R^{Y1}$, $R^{Y11}$ and $X^{Y1}$ represent the same meaning as described above.]

[Chemical Formula 68]

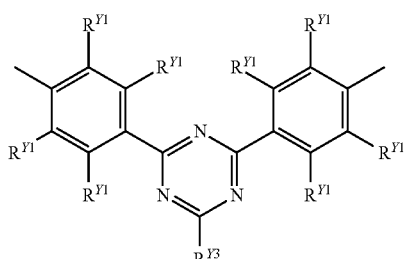
(Y-4)

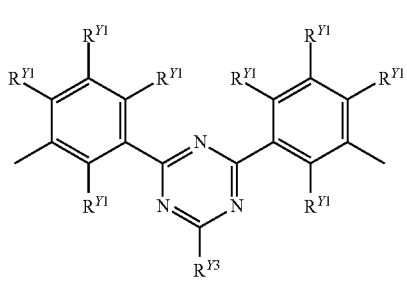
(Y-5)

[Chemical Formula 69]

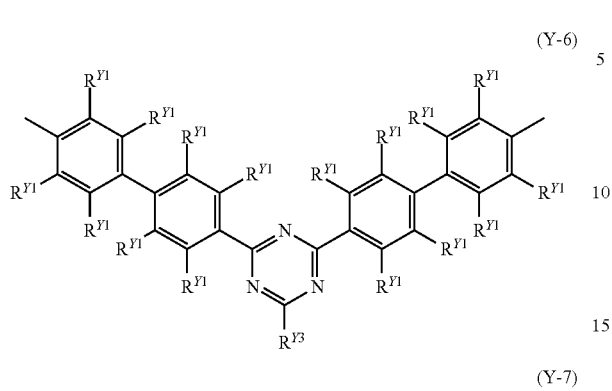
(Y-6)

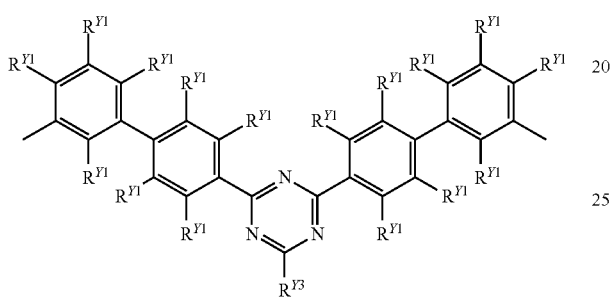
(Y-7)

[wherein,

R$^{Y1}$ represents the same meaning as described above.

R$^{Y3}$ represents a hydrogen atom, an alkyl group, a cycloalkyl group, an alkoxy group, a cycloalkoxy group, an aryl group or a monovalent hetero ring group, and the foregoing groups optionally have a substituent.]

R$^{Y3}$ is preferably an alkyl group, a cycloalkyl group, an aryl group or a monovalent hetero ring group, more preferably an aryl group or a monovalent hetero ring group, further preferably an aryl group, and the foregoing groups optionally have a substituent.

The examples and preferable ranges of the substituent which R$^{Y3}$ optionally has are the same as the examples and preferable ranges of the substituent which the substituent which a group represented by Ar$^{Y1}$ optionally has optionally further has.

The group represented by the formula (Y-4) is preferably a group represented by the formula (Y-4').

The group represented by the formula (Y-6) is preferably a group represented by the formula (Y-6').

[Chemical Formula 70]

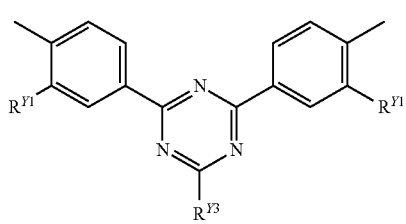
(Y-4')

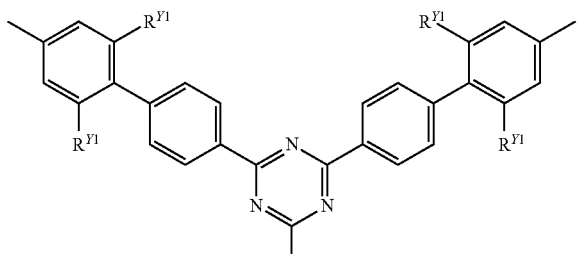
(Y-6')

[wherein, R$^{Y1}$ and R$^{Y3}$ represent the same meaning as described above.]

[Chemical Formula 71]

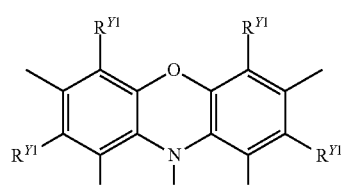
(Y-8)

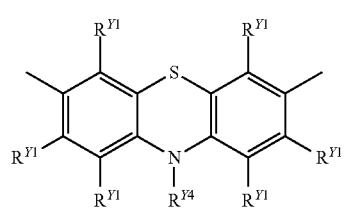
(Y-9)

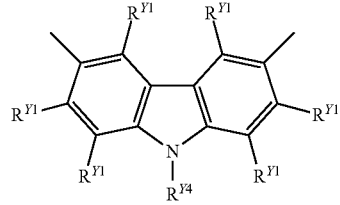
(Y-10)

[wherein,

R$^{Y1}$ represents the same meaning as described above.

R$^{Y4}$ represents a hydrogen atom, an alkyl group, a cycloalkyl group, an alkoxy group, a cycloalkoxy group, an aryl group or a monovalent hetero ring group, and the foregoing groups optionally have a substituent.]

R$^{Y4}$ is preferably an alkyl group, a cycloalkyl group, an aryl group or a monovalent hetero ring group, more preferably an aryl group or a monovalent hetero ring group, further preferably an aryl group, and the foregoing groups optionally have a substituent.

The examples and preferable ranges of the substituent which R$^{Y4}$ optionally has are the same as the examples and preferable ranges of the substituent which the substituent which a group represented by Ar$^{Y1}$ optionally has optionally further has.

The polymer compound of the second organic layer preferably contains a group represented by the formula (Y-1), the formula (Y-2) or the formula (Y-8) to the formula (Y-10), more preferably contains a group represented by the formula (Y-1), the formula (Y-2) or the formula (Y-10), further preferably contains a group represented by the formula (Y-1) or the formula (Y-10), particularly preferably contains a group represented by the formula (Y-1), since the energy level of the lowest triplet excited state is higher.

The constitutional unit represented by the formula (Y) includes, for example, constitutional units composed of the arylene group represented by the formula (Y-101) to the formula (Y-121), constitutional units composed of the divalent hetero ring group represented by the formula (Y-201) to the formula (Y-206), and constitutional units composed of the divalent group in which at least one arylene group and at least one divalent hetero ring group are bonded directly represented by the formula (Y-300) to the formula (Y-304).

[Chemical Formula 72]

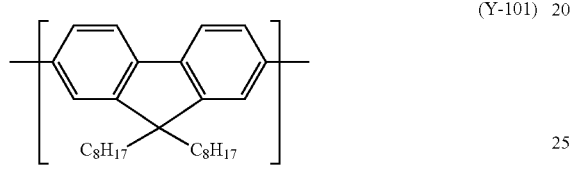
(Y-101)

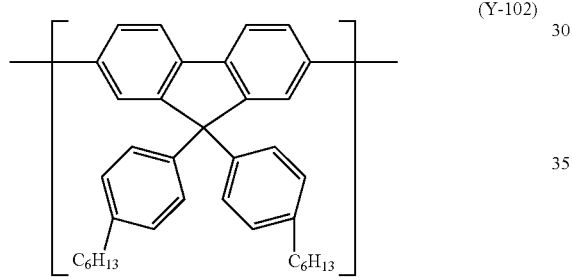
(Y-102)

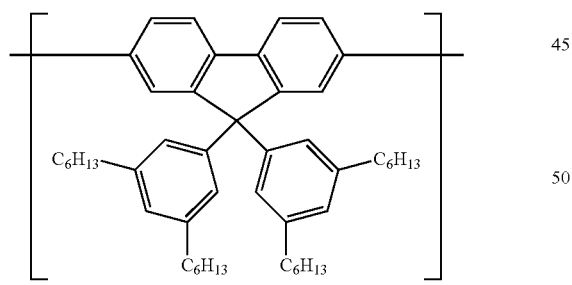
(Y-103)

[Chemical Formula 73]

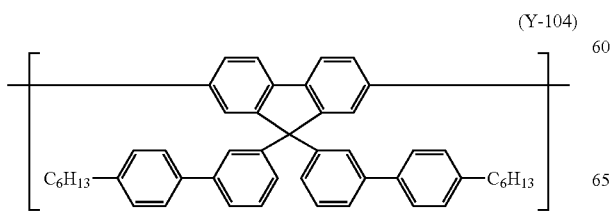
(Y-104)

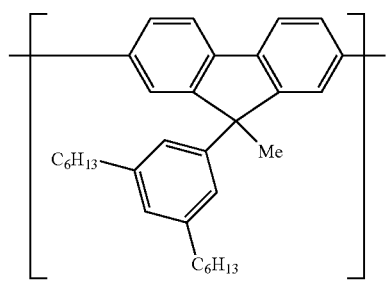
(Y-105)

[Chemical Formula 74]

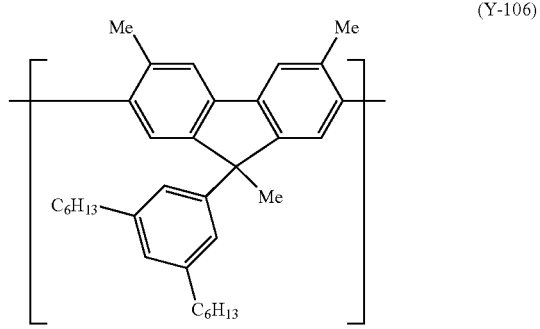
(Y-106)

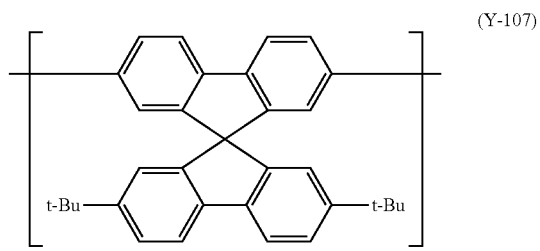
(Y-107)

(Y-108)

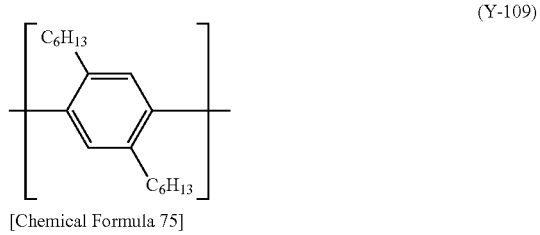
(Y-109)

[Chemical Formula 75]

(Y-110)

(Y-111) 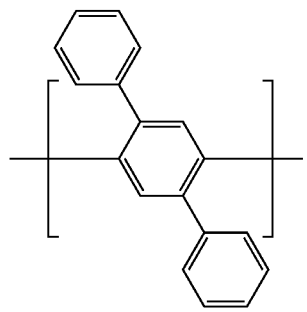
(Y-112) 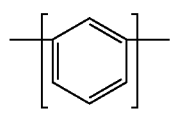
(Y-113) 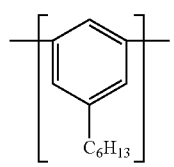
(Y-114) 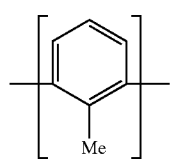
[Chemical Formula 76]
(Y-115) 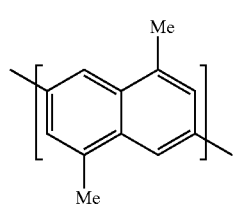
(Y-116) 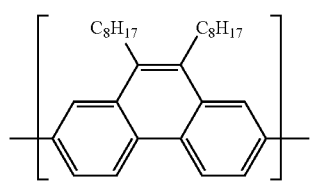
(Y-117) 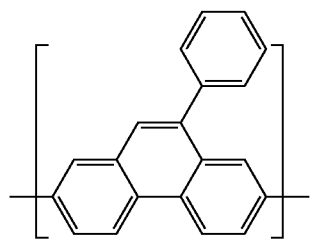
(Y-118) 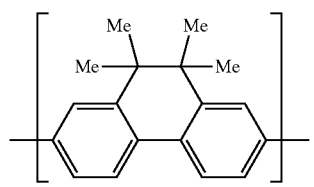
[Chemical Formula 77]
(Y-119) 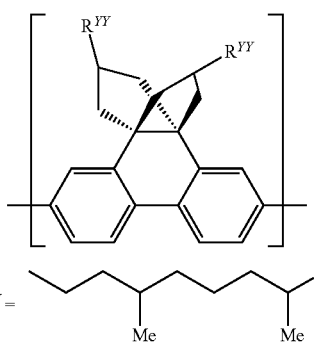
$R^{YY}=$
(Y-120) 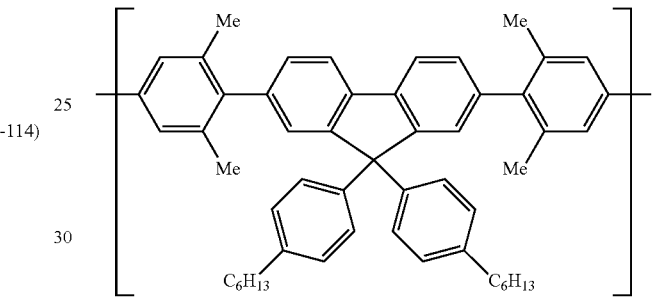
(Y-121) 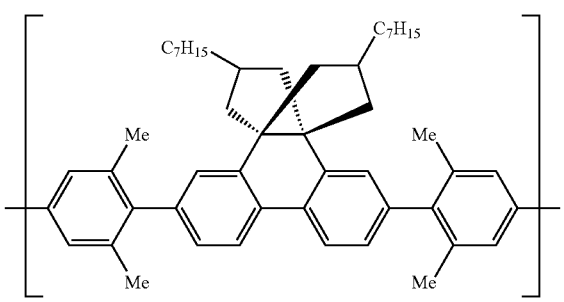
[Chemical Formula 78]
(Y-201) 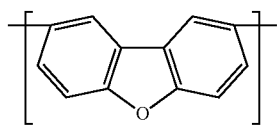
(Y-202) 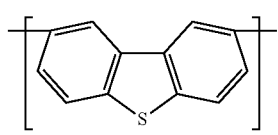

(Y-203) 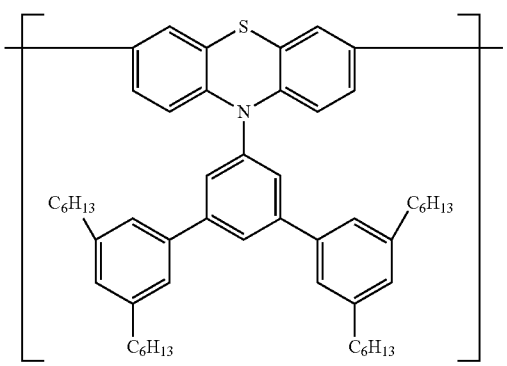
(Y-204) 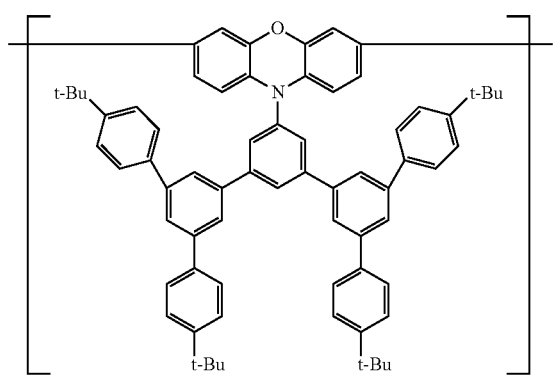
[Chemical Formula 79]
(Y-205) 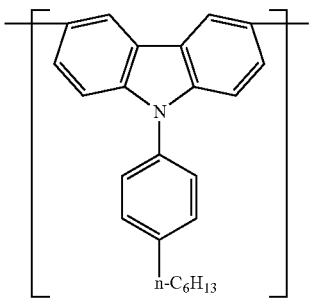
(Y-206) 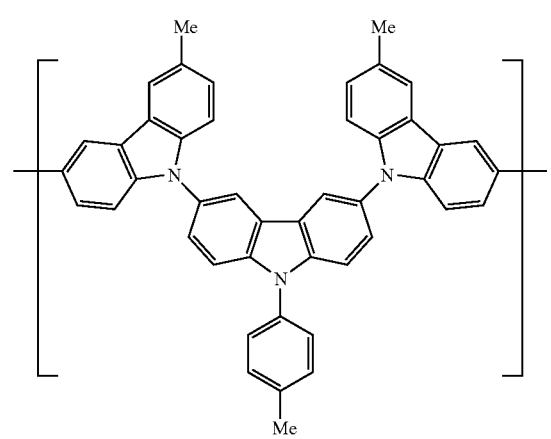
(Y-300) 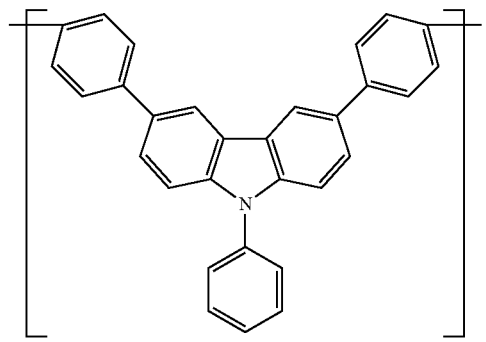
[Chemical Formula 80]
(Y-301) 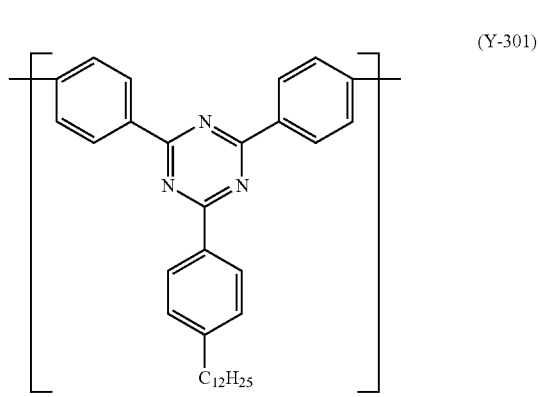
(Y-302) 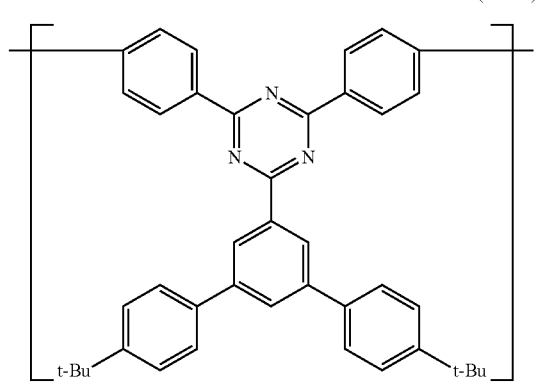
(Y-303) 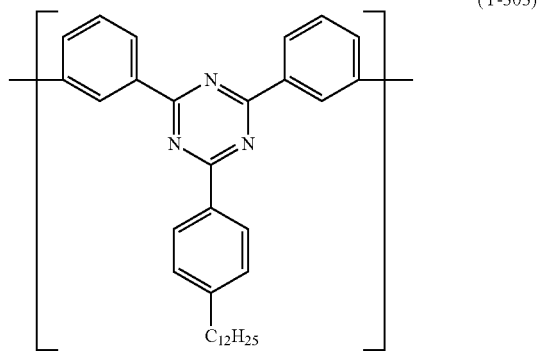

-continued

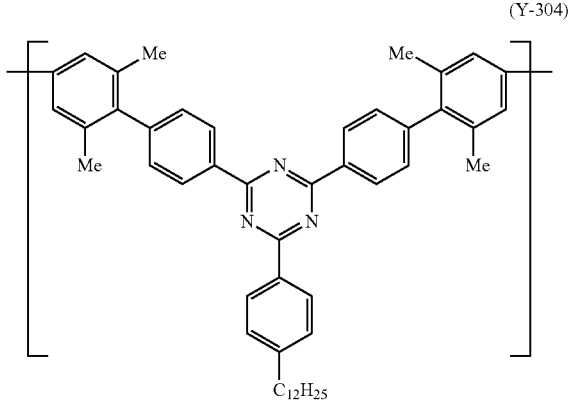
(Y-304)

When the polymer compound of the second organic layer contains a constitutional unit represented by the formula (Y) and $Ar^{Y1}$ is an arylene group, the amount is preferably 0.5 to 90% by mole, more preferably 30 to 60% by mole, with respect to the total amount of constitutional units contained in the polymer compound of the second organic layer, since the light emitting device of the present invention is more excellent in external quantum efficiency.

When the polymer compound of the second organic layer contains a constitutional unit represented by the formula (Y) and $Ar^{Y1}$ is a divalent hetero ring group or a divalent group in which at least one arylene group and at least one divalent hetero ring group are bonded directly, the amount is preferably 0.1 to 90% by mole, more preferably 1 to 70% by mole, further preferably 10 to 50% by mole, with respect to the total amount of constitutional units contained in the polymer compound of the second organic layer, since the polymer compound of the second organic layer is excellent in charge transportability.

The constitutional unit represented by the formula (Y) may contained only singly or in combination of two or more kinds thereof in the polymer compound of the second organic layer.

[Chemical Formula 81]

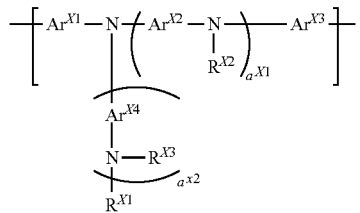
(X)

[wherein,
$a^{X1}$ and $a^{X2}$ each independently represent an integer of 0 or more.

$Ar^{X1}$ and $Ar^{X3}$ each independently represent an arylene group or a divalent hetero ring group, and the foregoing groups optionally have a substituent.

$Ar^{X2}$ and $Ar^{X4}$ each independently represent an arylene group, a divalent hetero ring group, or a divalent group in which at least one arylene group and at least one divalent hetero ring group are bonded directly, and the foregoing groups optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent hetero ring group, and the foregoing groups optionally have a substituent. When a plurality of $R^{X2}$ and $R^{X3}$ are present, they may be the same or different at each occurrence.]

$a^{X1}$ is preferably 2 or less, more preferably 0 or 1, further preferably 0, since the light emitting device of the present invention is more excellent in external quantum efficiency.

$a^{X2}$ is preferably 2 or less, more preferably 0 or 1, further preferably 0, since the light emitting device of the present invention is more excellent in external quantum efficiency.

$R^{X1}$, $R^{X2}$ and $R^{X3}$ are each preferably an alkyl group, a cycloalkyl group, an aryl group or a monovalent hetero ring group, more preferably an aryl group or a monovalent hetero ring group, further preferably an aryl group, and the foregoing groups optionally have a substituent.

The examples and preferable ranges of the arylene group and the divalent hetero ring group represented by $Ar^{X1}$, $Ar^{X2}$, $Ar^{X3}$ and $Ar^{X4}$ are the same as the examples and preferable ranges of the arylene group and the divalent hetero ring group represented by $Ar^{Y1}$, respectively.

In the divalent group in which at least one arylene group and at least one divalent hetero ring group are bonded directly represented by $Ar^{X2}$ and $Ar^{X4}$, the examples and preferable ranges of the arylene group and the divalent hetero ring group are the same as the examples and preferable ranges of the arylene group and the divalent hetero ring group represented by $Ar^{Y1}$, respectively.

The divalent group in which at least one arylene group and at least one divalent hetero ring group are bonded directly represented by $Ar^{X2}$ and $Ar^{X4}$ includes groups which are the same as the divalent group in which at least one arylene group and at least one divalent hetero ring group are bonded directly represented by $Ar^{Y1}$ in the formula (Y).

$Ar^{X1}$, $Ar^{X2}$, $Ar^{X3}$ and $Ar^{X4}$ are each preferably an arylene group optionally having a substituent.

At least one of $Ar^{X1}$ and $Ar^{X3}$ is preferably a group represented by the formula (Y-1) or the formula (Y-2), more preferably a group represented by the formula (Y-1), further preferably a group represented by the formula (Y-1-1) or the formula (Y-1-2), particularly preferably a group represented by the formula (Y-1-2), since the energy level of the lowest triplet excited state of the polymer compound of the second organic layer is higher.

$Ar^{X1}$ and $Ar^{X3}$ are each preferably a group represented by the formula (Y-1) or the formula (Y-2), more preferably a group represented by the formula (Y-1), further preferably a group represented by the formula (Y-1-1) or the formula (Y-1-2), particularly preferably a group represented by the formula (Y-1-2), since the light emitting device of the present invention is more excellent in external quantum efficiency and the energy level of the lowest triplet excited state of the polymer compound of the second organic layer is higher.

The examples and preferable ranges of the substituent which the group represented by $Ar^{X1}$ to $Ar^{X4}$ and $R^{X1}$ to $R^{X3}$ optionally has are the same as the examples and preferable ranges of the substituent which the group represented by $Ar^{Y1}$ optionally has.

The examples and the preferable range of the substituent which the substituent which the group represented by $Ar^{X1}$ to $Ar^{X4}$ and $R^{X1}$ to $R^{Y3}$ optionally has optionally further has are the same as the examples and the preferable range of the substituent which the substituent which the group represented by $Ar^{Y1}$ optionally has optionally further has.

The constitutional unit represented by the formula (X) is preferably a constitutional unit represented by the formula (X-1) to the formula (X-7), more preferably a constitutional unit represented by the formula (X-1) to the formula (X-6).
[Chemical Formula 82]
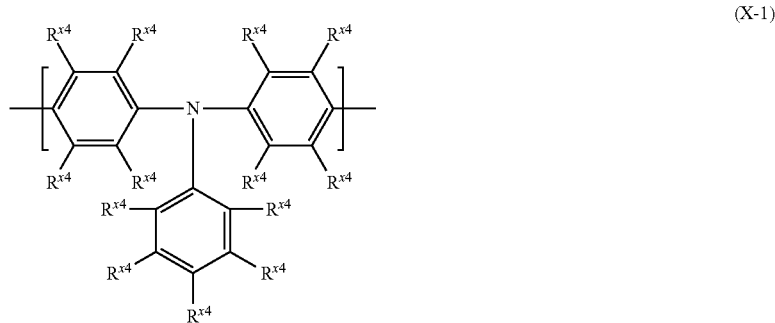
(X-1)
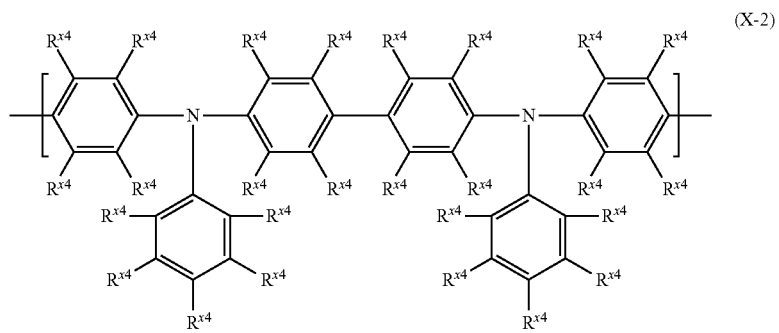
(X-2)
[Chemical Formula 83]
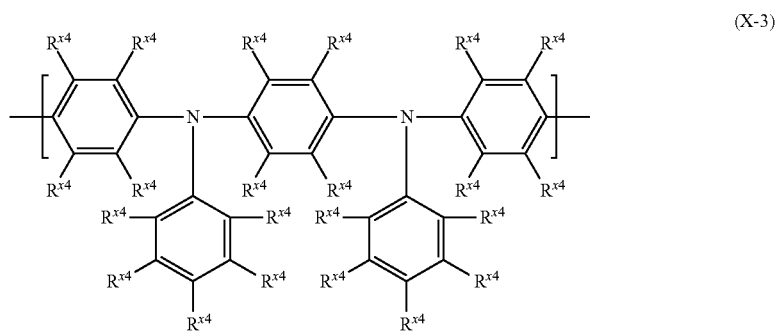
(X-3)
[Chemical Formula 84]
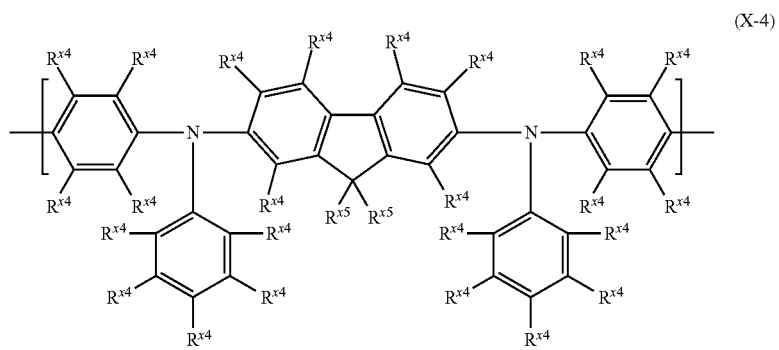
(X-4)

(X-5)

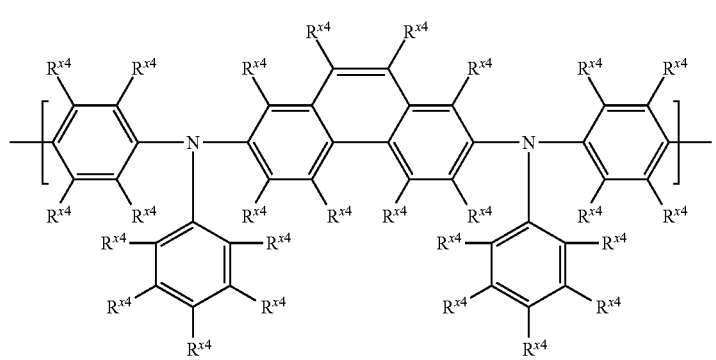

[Chemical Formula 85]

(X-6)

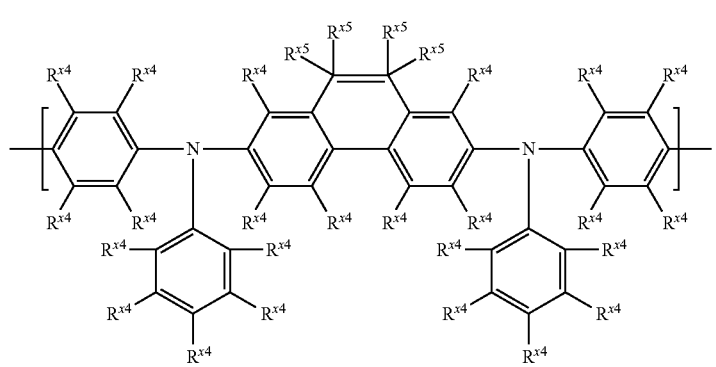

(X-7)

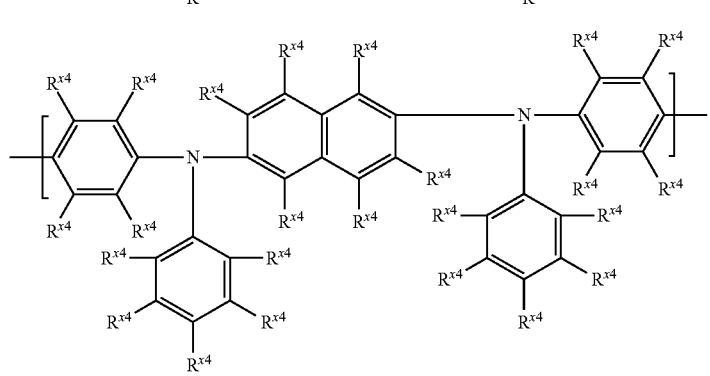

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent hetero ring group or a cyano group, and the foregoing groups optionally have a substituent. A plurality of $R^{X4}$ may be the same or different. A plurality of $R^{X5}$ may be the same or different, and the adjacent $R^{X5}$ may be combined together to form a ring together with carbon atoms to which they are attached.]

$R^{X4}$ is preferably a hydrogen atom, an alkyl group, a cycloalkyl group, an alkoxy group, a cycloalkoxy group, an aryl group or a monovalent hetero ring group, more preferably a hydrogen atom, an alkyl group, a cycloalkyl group, an aryl group or a monovalent hetero ring group, further preferably a hydrogen atom, an alkyl group, a cycloalkyl group or an aryl group, particularly preferably a hydrogen atom or an alkyl group, and the foregoing groups optionally further have a substituent.

$R^{X5}$ is preferably a hydrogen atom, an alkyl group, a cycloalkyl group, an alkoxy group, a cycloalkoxy group, an aryl group or a monovalent hetero ring group, more preferably a hydrogen atom, an alkyl group, a cycloalkyl group, an aryl group or a monovalent hetero ring group, further preferably an alkyl group, a cycloalkyl group, an aryl group or a monovalent hetero ring group, particularly preferably an alkyl group or an aryl group, and the foregoing groups optionally further have a substituent.

The examples and the preferable range of the substituent which the group represented by $R^{X4}$ and $R^{X5}$ optionally has are the same as the examples and the preferable range of the substituent which the substituent which the group represented by $Ar^{Y1}$ optionally has optionally further has.

When the polymer compound of the second organic layer contains a constitutional unit represented by the formula (X), the amount of the constitutional unit represented by the formula (X) is preferably 0.1 to 90% by mole, more preferably 1 to 70% by mole, further preferably 10 to 50% by mole, with respect to the total amount of constitutional units contained in the polymer compound of the second organic layer, since excellent hole transportability is obtained.

The constitutional unit represented by the formula (X) includes, for example, constitutional units represented by the formula (X1-1) to the formula (X1-15).
[Chemical Formula 86]
(X1-1)
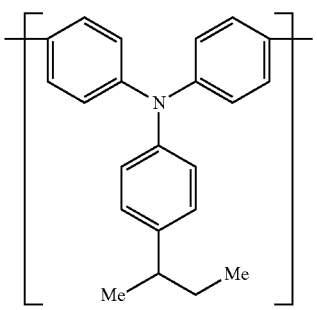
(X1-2)
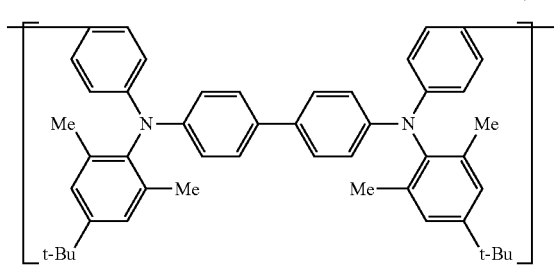
(X1-3)
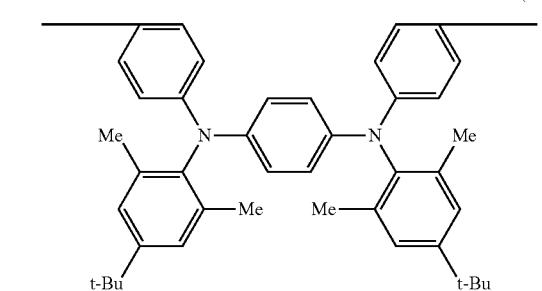
[Chemical Formula 87]
(X1-4)
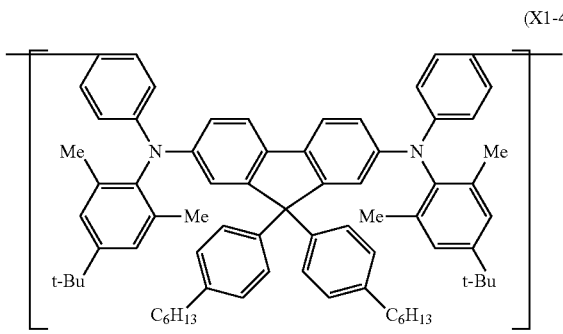
(X1-5)
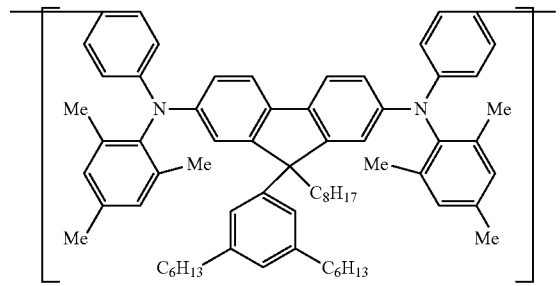
[Chemical Formula 88]
(X1-6)
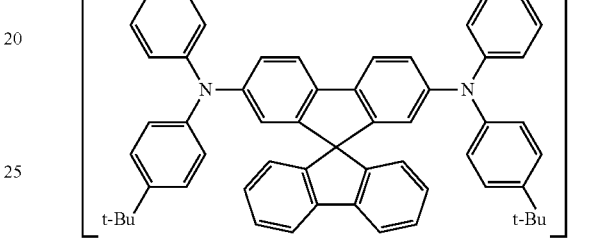
(X1-7)
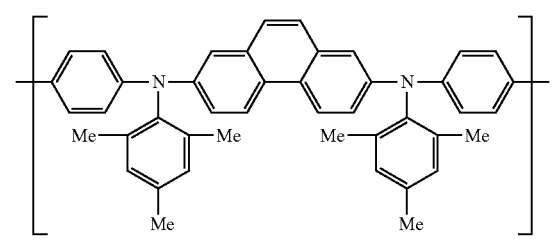
[Chemical Formula 89]
(X1-8)
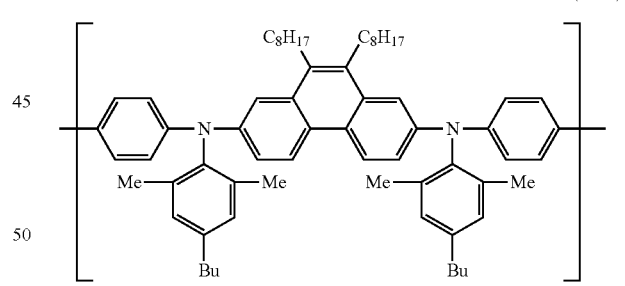
(X1-9)
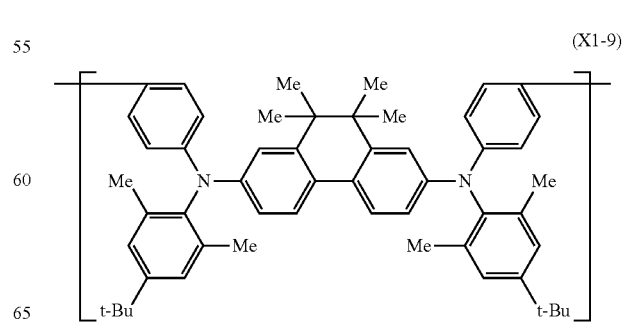

[Chemical Formula 90]

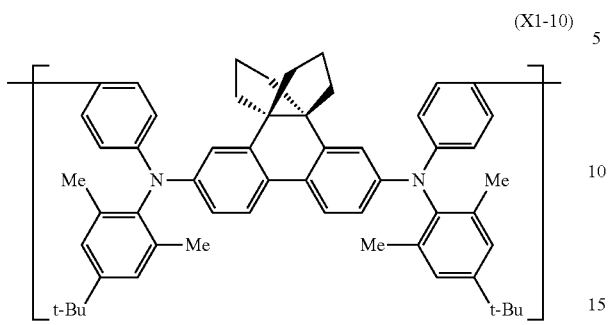
(X1-10)

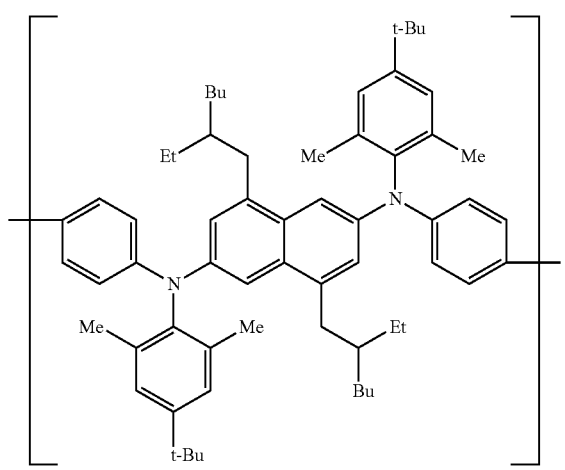
(X1-11)

[Chemical Formula 91]

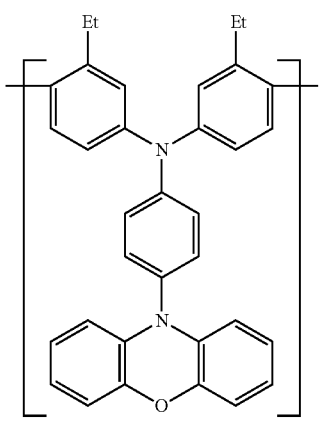
(X1-12)

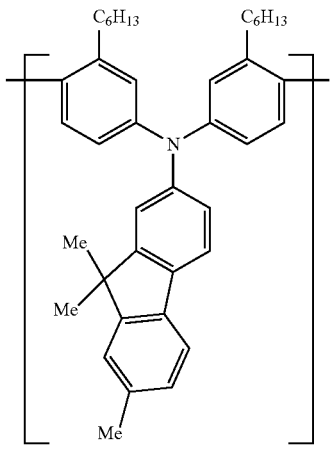
(X1-13)

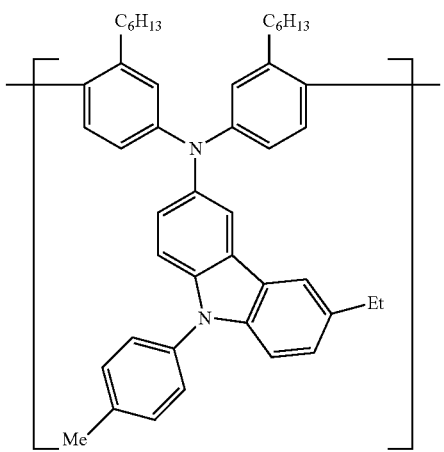
(X1-14)

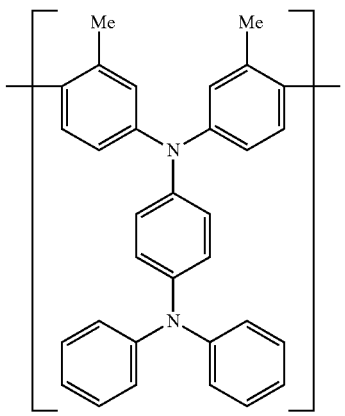
(X1-15)

In the polymer compound of the second organic layer, the constitutional unit represented by the formula (X) may be contained only singly or in combination of two or more kinds thereof.

The polymer compound of the second organic layer includes, for example, polymer compounds P-1 to P-8. In the present specification, "other constitutional unit" denotes a constitutional unit other than constitutional units represented by the formula (2), the formula (2'), the formula (X) and the formula (Y).

TABLE 1

| polymer compound | formula (2) p' | formula (2') q' | formula (X) R' | formula (Y) s' | other t' |
|---|---|---|---|---|---|
| P-1 | 0.1 to 99.9 | 0.1 to 99.9 | 0 | 0 | 0 to 30 |
| P-2 | 0.1 to 99.9 | 0 | 0.1 to 99.9 | 0 | 0 to 30 |
| P-3 | 0.1 to 99.9 | 0 | 0 | 0.1 to 99.9 | 0 to 30 |
| P-4 | 0 | 0.1 to 99.9 | 0.1 to 99.9 | 0 | 0 to 30 |
| P-5 | 0 | 0.1 to 99.9 | 0 | 0.1 to 99.9 | 0 to 30 |
| P-6 | 0.1 to 99.8 | 0.1 to 99.8 | 0.1 to 99.8 | 0 | 0 to 30 |
| P-7 | 0.1 to 99.8 | 0.1 to 99.8 | 0 | 0.1 to 99.8 | 0 to 30 |
| P-8 | 0.1 to 99.7 | 0.1 to 99.7 | 0.1 to 99.7 | 0.1 to 99.7 | 0 to 30 |

[in the table, p', q', R', s' and t' represent the molar ratio of each constitutional unit. p'+q'+R'+s'+t'=100, and 70≤p'+q'+R'+s'≤100.]

The polymer compound of the second organic layer may be any of a block copolymer, a random copolymer, an alternating copolymer and a graft copolymer, and may also be another form, and is preferably a copolymer obtained by copolymerizing a plurality of raw material monomers.

The polystyrene-equivalent number-average molecular weight of the polymer compound of the second organic layer is preferably $5\times10^3$ to $1\times10^6$, more preferably $1\times10^4$ to $5\times10^5$, further preferably $1.5\times10^4$ to $1\times10^5$.

[Production Method of Polymer Compound of Second Organic Layer]

The polymer compound of the second organic layer can be produced using known polymerization methods described in Chemical Review (Chem. Rev.), vol. 109, pp. 897 to 1091 (2009) and the like, and methods of polymerizing by a coupling reaction using a transition metal catalyst such as the Suzuki reaction, the Yamamoto reaction, the Buchwald reaction, the Stille reaction, the Negishi reaction, the Kumada reaction and the like are exemplified.

In the above-described polymerization methods, the method of charging monomers includes a method in which the entire monomers are charged all at once into the reaction system, a method in which a part of the monomers is charged and reacted, then, the remaining monomers are charged all at once, continuously or in a divided manner, a method of charging monomers continuously or dividedly, and other methods.

The transition metal catalyst includes a palladium catalyst, a nickel catalyst and the like.

For the post treatment of the polymerization reaction, known methods, for example, a method in which water-soluble impurities are removed by liquid separation, a method in which a reaction solution after the polymerization reaction is added to a lower alcohol such as methanol and the like, the deposited precipitate is filtrated, then, dried, and other methods, are used each singly or used in combination. When the purity of the polymer compound of the second organic layer is low, it can be purified by usual methods such as, for example, recrystallization, reprecipitation, continuous extraction with a Soxhlet extractor, column chromatography and the like.

[Second Composition]

The second organic layer may be a layer containing a composition containing a crosslinked body of the polymer compound of the second organic layer and at least one material selected from the group consisting of a hole transporting material, a hole injection material, an electron transporting material, an electron injection material, a light emitting material and an antioxidant (hereinafter, referred to also as "second composition").

The examples and the preferable range of the hole transporting material, the electron transporting material, the hole injection material and the electron injection material contained in the second composition are the same as the examples and the preferable range of the hole transporting material, the electron transporting material, the hole injection material and the electron injection material contained in the first composition.

The light emitting material contained in the second composition includes, for example, fluorescent light emitting materials which may be contained in the first composition, and phosphorescent metal complexes having iridium, platinum or europium as the central metal. The light emitting material may be used singly or in combination of two or more kinds thereof.

In the second composition, the compounding amounts of a hole transporting material, an electron transporting material, a hole injection material, an electron injection material and a light emitting material are each usually 1 to 400 parts by mass, preferably 5 to 150 parts by mass when the amount of the crosslinked body of the polymer compound of the second organic layer is taken as 100 parts by mass.

The examples and the preferable range of the antioxidant contained in the second composition are the same as the examples and the preferable range of the antioxidant contained in the first composition. In the second composition, the compounding amount of the antioxidant is usually 0.001 to 10 parts by mass when the amount of the crosslinked body of the polymer compound of the second organic layer is taken as 100 parts by mass.

A composition containing the polymer compound of the second organic layer and a solvent (hereinafter, referred to also as "second ink") can be suitably used in wet methods explained in the section of the first ink. The preferable range of the viscosity of the second ink is the same as the preferable range of the viscosity of the first ink. The examples and the preferable range of the solvent contained in the second ink are the same as the examples and the preferable range of the solvent contained in the first ink.

In the second ink, the compounding amount of the solvent is usually 1000 to 100000 parts by mass, preferably 2000 to 20000 parts by mass when the amount of the polymer compound of the second organic layer is taken as 100 parts by mass.

<Layer Constitution of Light Emitting Device>

The light emitting device of the present invention may have layers other than the anode, the cathode, the first organic layer and the second organic layer.

In the light emitting device of the present invention, the first organic layer is usually a light emitting layer (hereinafter, referred to as "first light emitting layer").

In the light emitting device of the present invention, the second organic layer is usually a hole transporting layer, a second light emitting layer or an electron transporting layer, preferably a hole transporting layer or a second light emitting layer, more preferably a hole transporting layer.

In the light emitting device of the present invention, it is preferable that the first organic layer and the second organic layer are adjacent, since the light emitting device of the present invention is more excellent in external quantum efficiency.

In the light emitting device of the present invention, the second organic layer is preferably a layer disposed between the anode and the first organic layer, more preferably a hole transporting layer or a second light emitting layer disposed between the anode and the first organic layer, further preferably a hole transporting layer disposed between the anode and the first organic layer, since the light emitting device of the present invention is more excellent in external quantum efficiency.

In the first organic layer of the light emitting device of the present invention, the compound (T) and the phosphorescent transition metal complex may each be contained singly or in combination of two or more kinds thereof. In the second organic layer of the light emitting device of the present invention, the crosslinked body of the polymer compound of the second organic layer may be contained singly or in combination of two or more kinds thereof.

In the light emitting device of the present invention, when the second organic layer is a hole transporting layer disposed between the anode and the first organic layer, it is preferable that a hole injection layer is further provided between the anode and the second organic layer, since the light emitting device of the present invention is more excellent in external quantum efficiency. When the second organic layer is a hole transporting layer disposed between the anode and the first organic layer, it is preferable that at least one of an electron injection layer and an electron transporting layer is further provided between the cathode and the first organic layer, since the light emitting device of the present invention is more excellent in external quantum efficiency.

In the light emitting device of the present invention, when the second organic layer is a second light emitting layer disposed between the anode and the first organic layer, it is preferable that at least one of a hole injection layer and a hole transporting layer is further provided between the anode and the second organic layer, since the light emitting device of the present invention is more excellent in external quantum efficiency. When the second organic layer is a second light emitting layer disposed between the anode and the first organic layer, it is preferable that at least one of an electron injection layer and an electron transporting layer is further provided between the cathode and the first organic layer, since the light emitting device of the present invention is more excellent in external quantum efficiency.

In the light emitting device of the present invention, when the second organic layer is a second light emitting layer disposed between the cathode and the first organic layer, it is preferable that at least one of a hole injection layer and a hole transporting layer is further provided between the anode and the first organic layer, since the light emitting device of the present invention is more excellent in external quantum efficiency. When the second organic layer is a second light emitting layer disposed between the cathode and the first organic layer, it is preferable that at least one of an electron injection layer and an electron transporting layer is further provided between the cathode and the second organic layer, since the light emitting device of the present invention is more excellent in external quantum efficiency.

In the light emitting device of the present invention, when the second organic layer is an electron transporting layer disposed between the cathode and the first organic layer, it is preferable that at least one of a hole injection layer and a hole transporting layer is further provided between the anode and the first organic layer, since the light emitting device of the present invention is more excellent in external quantum efficiency. When the second organic layer is an electron transporting layer disposed between the cathode and the first organic layer, it is preferable that an electron injection layer is further provided between the cathode and the second organic layer, since the light emitting device of the present invention is more excellent in external quantum efficiency.

The specific layer constitution of the light emitting device of the present invention includes, for example, layer constitutions represented by (D1) to (D15). The light emitting device of the present invention usually has a substrate, and an anode may be first laminated on the substrate, or a cathode may be first laminated on the substrate.

(D1) anode/second light emitting layer (second organic layer)/first light emitting layer (first organic layer)/cathode (D2) anode/hole transporting layer (second organic layer)/first light emitting layer (first organic layer)/cathode (D3) anode/hole injection layer/second light emitting layer (second organic layer)/first light emitting layer (first organic layer)/cathode (D4) anode/hole injection layer/second light emitting layer (second organic layer)/first light emitting layer (first organic layer)/electron transporting layer/cathode (D5) anode/hole injection layer/second light emitting layer (second organic layer)/first light emitting layer (first organic layer)/electron injection layer/cathode (D6) anode/hole injection layer/second light emitting layer (second organic layer)/first light emitting layer (first organic layer)/electron transporting layer/electron injection layer/cathode (D7) anode/hole injection layer/hole transporting layer (second organic layer)/first light emitting layer (first organic layer)/cathode (D8) anode/hole injection layer/hole transporting layer (second organic layer)/first light emitting layer (first organic layer)/electron transporting layer/cathode (D9) anode/hole injection layer/hole transporting layer (second organic layer)/first light emitting layer (first organic layer)/electron injection layer/cathode (D10) anode/hole injection layer/hole transporting layer (second organic layer)/first light emitting layer (first organic layer)/electron transporting layer/electron injection layer/cathode (D11) anode/hole injection layer/hole transporting layer/second light emitting layer (second organic layer)/first light emitting layer (first organic layer)/electron transporting layer/electron injection layer/cathode (D12) anode/hole injection layer/hole transporting layer (second organic layer)/first light emitting layer (first organic layer)/second light emitting layer/electron transporting layer/electron injection layer/cathode (D13) anode/hole injection layer/hole transporting layer/first light emitting layer (first organic layer)/second light emitting layer (second organic layer)/electron transporting layer/electron injection layer/cathode (D14) anode/hole injection layer/hole transporting layer/first light emitting layer (first organic layer)/electron transporting layer (second organic layer)/electron injection layer/cathode (D15) anode/hole injection layer/hole transporting layer (second organic layer)/second light emitting layer/first light emitting layer (first organic layer)/electron transporting layer/electron injection layer/cathode In (D1) to (D15) described above, "/" means that layers before and after are laminated adjacent to each other. Specifically, "second light emitting layer (second organic layer)/first light emitting layer (first organic layer)" means that a second light emitting layer (second organic layer) and a first light emitting layer (first organic layer) are laminated adjacent to each other.

Layer constitutions represented by (D3) to (D12) are preferable, layer constitutions represented by (D7) to (D10)

are more preferable, since the light emitting device of the present invention is more excellent in external quantum efficiency.

In the light emitting device of the present invention, two or more layers of the anode, the hole injection layer, the hole transporting layer, the second light emitting layer, the electron transporting layer, the electron injection layer and the cathode may be provided, respectively, as necessary.

When a plurality of anodes, hole injection layers, hole transporting layers, second light emitting layers, electron transporting layers, electron injection layers and cathodes are present, they may be the same or different at each occurrence.

The thicknesses of the anode, the hole injection layer, the hole transporting layer, the first light emitting layer, the second light emitting layer, the electron transporting layer, the electron injection layer and the cathode are each usually 1 nm to 1 µm, preferably 2 nm to 500 nm, further preferably 5 nm to 150 nm.

In the light emitting device of the present invention, the order, the number and the thickness of layers to be laminated may be adjusted in consideration of the light emission efficiency, the driving voltage and the device life of the light emitting device.

[Second Light Emitting Layer]

The second light emitting layer is usually a layer containing a second organic layer and a light emitting material, and preferably a layer containing a light emitting material. When the second light emitting layer is a layer containing a light emitting material, the light emitting material contained in the second light emitting layer includes, for example, light emitting materials which the first composition may contain described above. The light emitting material contained in the second light emitting layer may be contained singly or in combination of two or more kinds thereof.

When the light emitting device of the present invention has a second light emitting layer and when a hole transporting layer described later and an electron transporting layer described later are not a second organic layer, it is preferable that the second light emitting layer is a second organic layer.

[Hole Transporting Layer]

The hole transporting layer is usually a layer containing a second organic layer or a hole transporting material, and preferably a second organic layer. When the hole transporting layer is a layer containing a hole transporting material, the hole transporting material includes, for example, hole transporting materials which the first composition may contain described above. The hole transporting material contained in the hole transporting layer may be contained singly or in combination of two or more kinds thereof.

When the light emitting device of the present invention has a hole transporting layer and when a second light emitting layer described above and an electron transporting layer described later are not a second organic layer, it is preferable that the hole transporting layer is a second organic layer.

[Electron Transporting Layer]

The electron transporting layer is usually a layer containing a second organic layer or an electron transporting material, and is preferably a layer containing an electron transporting material. When the electron transporting layer is a layer containing an electron transporting material, the electron transporting material contained in the electron transporting layer includes, for example, electron transporting materials which the first composition may contain described above. The electron transporting material contained in the electron transporting layer may be contained singly or in combination of two or more kinds thereof.

When the light emitting device of the present invention has an electron transporting layer and when a second light emitting layer described above and a hole transporting layer described above are not a second organic layer, it is preferable that the electron transporting layer is a second organic layer.

[Hole Injection Layer and Electron Injection Layer]

The hole injection layer is a layer containing a hole injection material. The hole injection material contained in the hole injection layer includes, for example, hole injection materials which the first composition may contain described above. The hole injection material contained in the hole injection layer may be contained singly or in combination of two or more kinds thereof.

The electron injection layer is a layer containing an electron injection material. The electron injection material contained in the electron injection layer includes, for example, electron injection materials which the first composition may contain described above. The electron injection material contained in the electron injection layer may be contained singly or in combination of two or more kinds thereof.

[Substrate/Electrode]

The substrate in the light emitting device may advantageously be a substrate on which an electrode can be formed and which does not change chemically in forming an organic layer, and is, for example, a substrate made of a material such as glass, plastic, silicon and the like. When an opaque substrate is used, it is preferable that the electrode farthest from the substrate is transparent or semi-transparent.

The material of the anode includes, for example, electrically conductive metal oxides and semi-transparent metals, preferably includes indium oxide, zinc oxide, tin oxide; electrically conductive compounds such as indium-tin-oxide (ITO), indium-zinc-oxide and the like; argentine-palladium-copper (APC) complex; NESA, gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of at least one of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

In the light emitting device of the present invention, at least one of the anode and the cathode is usually transparent or semi-transparent, and it is preferable that the anode is transparent or semi-transparent.

The method for forming the anode and the cathode includes, for example, a vacuum vapor deposition method, a sputtering method, an ion plating method, a plating method and a lamination method.

[Production Method of Light Emitting Device]

The method for forming each of the first light emitting layer, the second light emitting layer, the hole transporting layer, the electron transporting layer, the hole injection layer, the electron injection layer and the like in the light emitting device of the present invention includes, when a low molecular compound is used, for example, a method of vacuum vapor deposition from a powder and a method of forming a film from a solution or melted state, and when a polymer compound is used, for example, a method of forming a film from a solution or melted state.

The first light emitting layer, the second light emitting layer, the hole transporting layer, the electron transporting layer, the hole injection layer and the electron injection layer can be formed by application methods such as a spin coat method, an inkjet printing method and the like using the first ink, the second ink, and inks containing the light emitting material, the hole transporting material, the electron transporting material, the hole injection material and the electron injection material described above, respectively.

[Application of Light Emitting Device]

In order to obtain planar light emission using a light emitting device, the planar anode and the planar cathode may be arranged so as to overlap each other. In order to obtain patterned light emission, there are a method of installing a mask having a patterned window on the surface of a planar light emitting device, a method in which a layer to be formed as a non-light emitting part is formed extremely thick so as to cause substantially non light emission and a method of forming an anode or a cathode, or both electrodes in a pattern. A segment type display capable of displaying numerals, letters and the like can be obtained by forming a pattern by any one of these methods and disposing several electrodes so that several electrodes can be turned on and off independently. In order to obtain a dot matrix display, both the anode and the cathode may be formed in a stripe shape and arranged so as to be orthogonal to each other. Partial color display and multicolor display become possible by a method of separately coating plural kinds of polymer compounds having different emission colors or a method using a color filter or a fluorescence conversion filter. The dot matrix display can be driven passively or can be driven actively in combination with a TFT and the like. These displays can be used for displays of computers, televisions, portable terminals, and the like. The planar light emitting device can be suitably used as a planar light source for backlight of a liquid crystal display, or as a planar light source for illumination. If a flexible substrate is used, it can be used as a curved light source and a curved display.

EXAMPLES

The present invention will be illustrated further in detail by examples below, but the present invention is not limited to these examples.

In examples, the polystyrene-equivalent number-average molecular weight (Mn) and the polystyrene-equivalent weight-average molecular weight (Mw) of a polymer compound were determined by size exclusion chromatography (SEC) using tetrahydrofuran as a mobile phase. The measurement conditions of SEC are as follows.

A polymer compound to be measured was dissolved at a concentration of about 0.05% by mass in tetrahydrofuran, and 10 µL of the solution was injected into SEC. The mobile phase was run at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

For calculation of the value of $\Delta E_{ST}$ a compound, the structure of the ground state of the compound was optimized by the B3LYP level density functional method. In this operation, 6-31G* was used as the base function. Then, $\Delta E_{ST}$ the compound was calculated by the B3LYP level time-dependent density functional method using the resultant optimized structure. As the quantum chemical calculation program, Gaussian09 was used for calculation.

The energy level of the lowest triplet excited state of a polymer compound was determined by measuring the phosphorescent emission spectrum of the polymer compound at 77 K.

Specifically, the polymer compound was dissolved in xylene at a concentration of 3.0% by mass. The resultant xylene solution was used to form a film on a glass substrate by a drop cast method, then, vacuum-dried at room temperature, to form a film of the polymer compound. The glass substrate carrying the polymer compound film formed thereon was placed in a glass tube containing a nitrogen atmosphere having an oxygen concentration of less than 5 ppm, then, the glass tube was sealed. The sealed glass tube was cooled to 77 K with liquid nitrogen, and used as a measurement sample. The resultant measurement sample was irradiated with excitation light (excitation wavelength: 325 nm), and the phosphorescent emission spectrum of the polymer compound was measured. A value obtained by converting the maximum peak wavelength of the shortest wavelength in the phosphorescent emission spectrum of the resultant polymer compound into energy was defined as the energy level of the lowest triplet excited state of the polymer compound.

In the measurement of the phosphorescent emission spectrum of the polymer compound, a rotary optical chopper was used. As an excitation light source, He—Cd laser (manufactured by Kimmon Koha Co., Ltd.) was used. As a detector, a multichannel spectrometer (trade name: PMA-12) manufactured by Hamamatsu Photonics K.K. was used.

<Synthesis Example M1> Synthesis of Compounds M1 to M20

A compound M1 was synthesized according to a method described in JP-A No. 2010-189630.

A compound M2 was synthesized according to a method described in JP-A No. 2008-106241.

A compound M3 was synthesized according to a method described in JP-A No. 2010-215886.

A compound M4 was synthesized with reference to a method described in International Publication WO 2002/045184.

A compound M5 was synthesized according to a method described in International Publication WO 2005/049546.

A compound M6 was synthesized according to a method described in International Publication WO 2011/049241.

A compound M7 was synthesized according to a method described in International Publication WO 2015/145871.

A compound M8 was synthesized according to a method described in International Publication WO 2013/146806.

A compound M9 was synthesized with reference to a method described in International Publication WO 2017/146083.

A compound M10 was synthesized with reference to a method described in JP-A No. 2010-215886.

A compound M11 was synthesized according to a method described in International Publication WO 2016/031639.

A compound M12 was synthesized according to a method described in JP-A No. 2011-174062.

A compound M13 was synthesized according to a method described in International Publication WO 2016/031639.

A compound M14 was synthesized according to a method described in JP-A No. 2011-174062.

A compound M15 was synthesized according to a method described in International Publication WO 2013/191088.

A compound M16 was synthesized according to a method described in International Publication WO 2013/191088.

A compound M17 was synthesized according to a method described in International Publication WO 2016/031639.

A compound M18 was synthesized according to a method described in International Publication WO 2013/146806.

A compound M19 was synthesized according to a method described in International Publication WO 2016/031639.

A compound M20 was synthesized with reference to a method described in International Publication WO 2002/045184.

[Chemical Formula 92]

compound M1
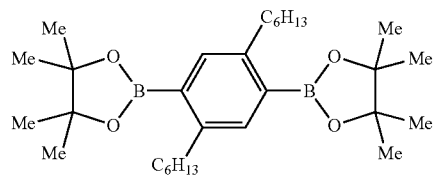

compound M2
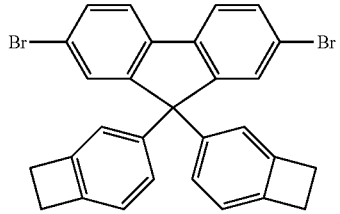

compound M3
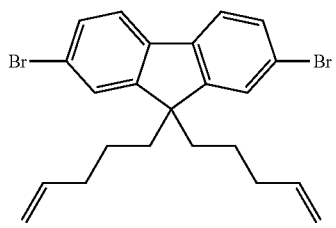

compound M4
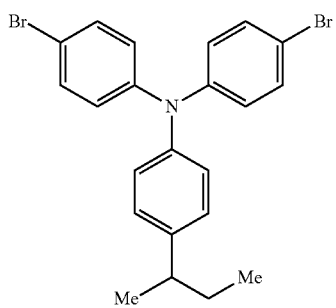

[Chemical Formula 93]

compound M5
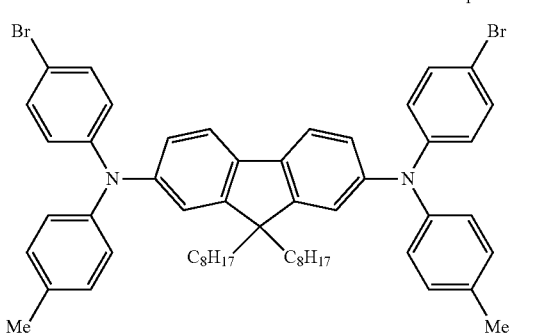

compound M6
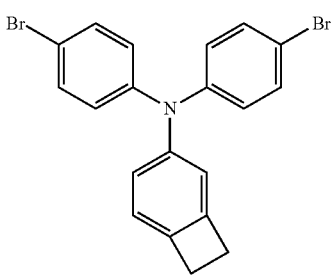

compound M7
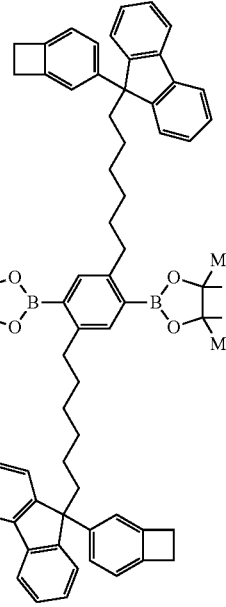

compound M8
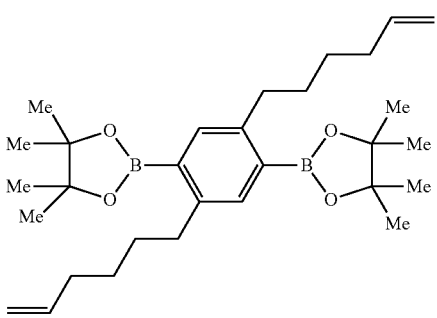

-continued
compound M9
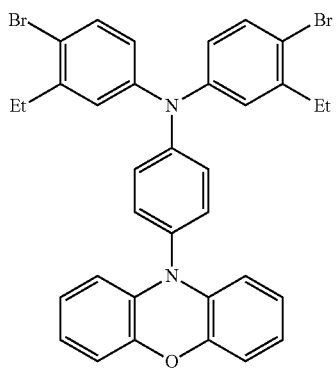
[Chemical Formula 94]
compound M10
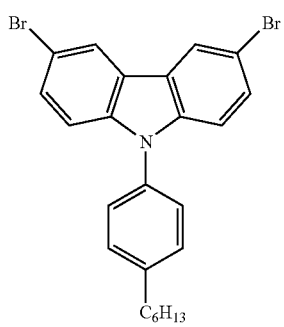
compound M11
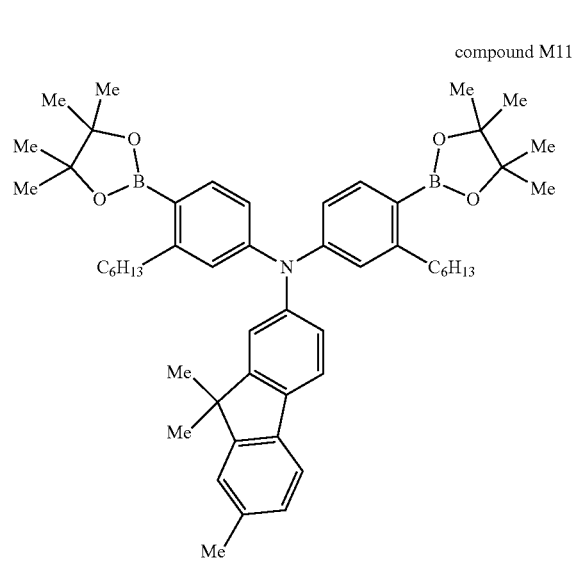
compound M12
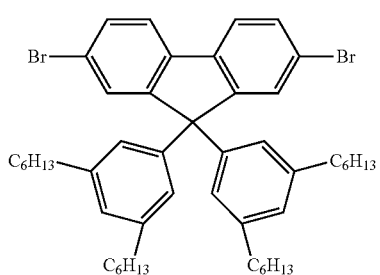
-continued
compound M13
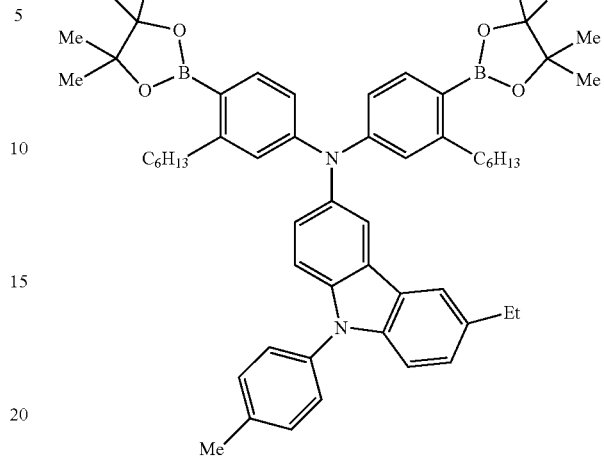
[Chemical Formula 95]
compound M14
compound M15
[Chemical Formula 96]
compound M16
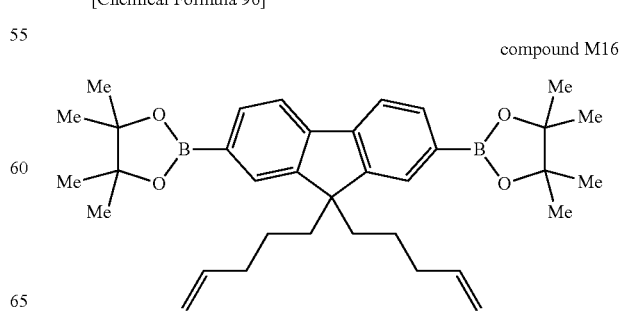

-continued

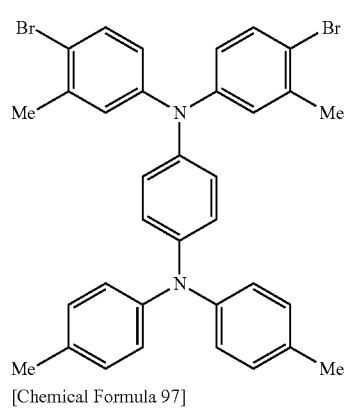

compound M17

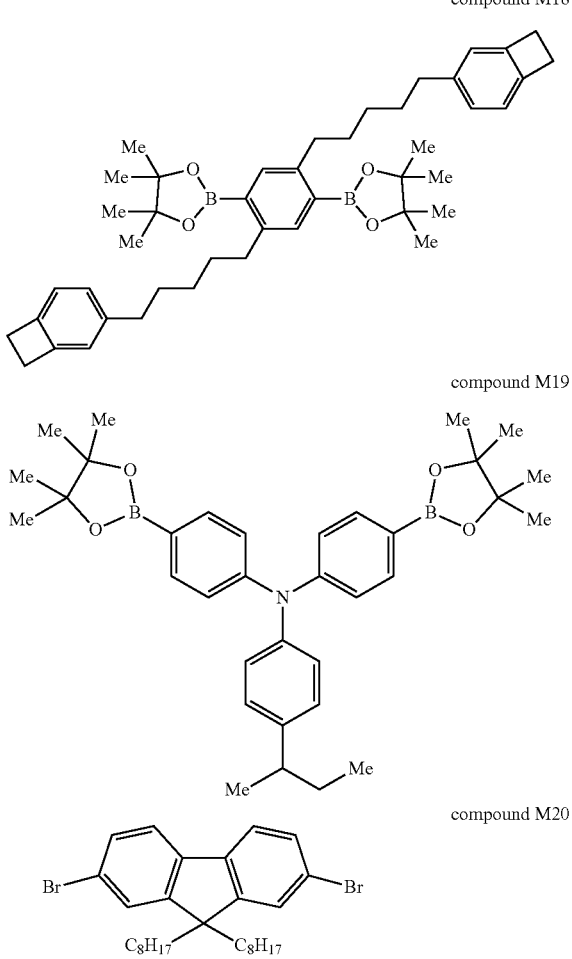

compound M18 compound M19 compound M20

<Synthesis Example HTL-1> Synthesis of Polymer Compound HTL-1

(Step 1) An inert gas atmosphere was prepared in a reaction vessel, then, the compound M1 (0.995 g), the compound M4 (0.736 g), the compound M2 (0.106 g), the compound M3 (0.0924 g), dichlorobis[tris(2-methoxyphenyl)phosphine]palladium (1.8 mg) and toluene (50 mL) were added, and the mixture was heated at 105° C.

(Step 2) Into the resultant reaction liquid, a 20% by mass tetraethyl ammonium hydroxide aqueous solution (6.6 mL) was dropped, and the solution was refluxed 5.5 hours.

(Step 3) Thereafter, to this were added phenylboronic acid (24.4 mg), a 20% by mass tetraethyl ammonium hydroxide aqueous solution (6.6 mL) and dichlorobis[tris(2-methoxyphenyl)phosphine]palladium (1.8 mg), and the solution was refluxed for 14 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with 3% by mass acetic acid aqueous solution twice, and with water twice, and the resultant solution was dropped into methanol, to generate a precipitate. The resultant precipitate was dissolved in toluene, and purified bypassing through an alumina column and a silica gel column in this order. The resultant solution was dropped into methanol, and stirred, to generate a precipitate. The resultant precipitate was collected by filtration and dried, to obtain 0.91 g of a polymer compound HTL-1. The polymer compound HTL-1 had an Mn of $5.2 \times 10^4$ and an Mw of $2.5 \times 10^5$.

The polymer compound HTL-1 is a copolymer constituted of a constitutional unit derived from the compound M1, a constitutional unit derived from the compound M4, a constitutional unit derived from the compound M2, a constitutional unit derived from the compound M3 at a molar ratio of 50:40:5:5, according to the theoretical values calculated from the amounts of the charged raw material.

The energy level of the lowest triplet excited state of polymer compound HTL-1 was 2.45 eV.

<Synthesis Example HTL-2> Synthesis of Polymer Compound HTL-2

A polymer compound HTL-2 was synthesized according to a method described in International Publication WO 2013/146806 using the compound M1, the compound M5 and the compound M6. The polymer compound HTL-2 had an Mn of $1.9 \times 10^4$ and an Mw of $9.9 \times 10^4$.

The polymer compound HTL-2 is a copolymer constituted of a constitutional unit derived from the compound M1, a constitutional unit derived from the compound M5, a constitutional unit derived from the compound M6 at a molar ratio of 50:42.5:7.5, according to the theoretical values calculated from the amounts of the charged raw materials.

The energy level of the lowest triplet excited state of the polymer compound HTL-2 was 2.33 eV.

<Synthesis Example HTL-3> Synthesis of Polymer Compound HTL-3

A polymer compound HTL-3 was synthesized with reference to a method described in International Publication WO 2015/145871 using the compound M7, the compound M8 and the compound M9. The polymer compound HTL-3 had an Mn of $2.8 \times 10^4$ and an Mw of $1.1 \times 10^5$.

The polymer compound HTL-3 is a copolymer constituted of a constitutional unit derived from the compound M7, a constitutional unit derived from the compound M8, a constitutional unit derived from the compound M9 at a molar ratio of 40:10:50, according to the theoretical values calculated from the amounts of the charged raw materials.

The energy level of the lowest triplet excited state of the polymer compound HTL-3 was 2.69 eV.

<Synthesis Example HTL-4> Synthesis of Polymer Compound HTL-4

A polymer compound HTL-4 was synthesized with reference to a method described in International Publication WO 2016/031639 using the compound M1, the compound M10, the compound M2 and the compound M3. The polymer compound HTL-4 had an Mn of $2.4 \times 10^4$ and an Mw of $1.7 \times 10^5$.

The polymer compound HTL-4 is a copolymer constituted of a constitutional unit derived from the compound M1, a constitutional unit derived from the compound M10, a constitutional unit derived from the compound M2, a constitutional unit derived from the compound M3 at a molar ratio of 50:40:5:5, according to the theoretical values calculated from the amounts of the charged raw materials.

The energy level of the lowest triplet excited state of the polymer compound HTL-4 was 2.49 eV.

<Synthesis Example HTL-5> Synthesis of Polymer Compound HTL-5

A polymer compound HTL-5 was synthesized according to a method described in International Publication WO 2016/031639 using the compound M11, the compound M12, the compound M2 and the compound M3. The polymer compound HTL-5 had an Mn of $5.3 \times 10^4$ and an Mw of $2.0 \times 10^5$.

The polymer compound HTL-5 is a copolymer constituted of a constitutional unit derived from the compound M11, a constitutional unit derived from the compound M12, a constitutional unit derived from the compound M2, a constitutional unit derived from the compound M3 at a molar ratio of 50:40:5:5, according to the theoretical values calculated from the amounts of the charged raw materials.

The energy level of the lowest triplet excited state of the polymer compound HTL-5 was 2.37 eV.

<Synthesis Example HTL-6> Synthesis of Polymer Compound HTL-6

A polymer compound HTL-6 was synthesized according to a method described in International Publication WO 2016/031639 using the compound M13, the compound M12, the compound M2 and the compound M3. The polymer compound HTL-6 had an Mn of $4.2 \times 10^4$ and an Mw of $1.2 \times 10^5$.

The polymer compound HTL-6 is a copolymer constituted of a constitutional unit derived from the compound M13, a constitutional unit derived from the compound M12, a constitutional unit derived from the compound M2, a constitutional unit derived from the compound M3 at a molar ratio of 50:40:5:5, according to the theoretical values calculated from the amounts of the charged raw materials.

The energy level of the lowest triplet excited state of the polymer compound HTL-6 was 2.36 eV.

<Synthesis Example HTL-7> Synthesis of Polymer Compound HTL-7

A polymer compound HTL-7 was synthesized according to a method described in International Publication WO 2016/031639 using the compound M14, the compound M15, the compound M16 and the compound M17. The polymer compound HTL-7 had an Mn of $5.1 \times 10^4$ and an Mw of $2.0 \times 10^5$.

The polymer compound HTL-7 is a copolymer constituted of a constitutional unit derived from the compound M14, a constitutional unit derived from the compound M15, a constitutional unit derived from the compound M16, a constitutional unit derived from the compound M17 at a molar ratio of 40:5:5:50, according to the theoretical values calculated from the amounts of the charged raw materials.

The energy level of the lowest triplet excited state of the polymer compound HTL-7 was 2.33 eV.

<Synthesis Example HTL-8> Synthesis of Polymer Compound HTL-8

A polymer compound HTL-8 was synthesized according to a method described in International Publication WO 2015/145871 using the compound M7, the compound M8 and the compound M5. The polymer compound HTL-8 had an Mn of $2.3 \times 10^4$ and an Mw of $1.2 \times 10^5$.

The polymer compound HTL-8 is a copolymer constituted of a constitutional unit derived from the compound M7, a constitutional unit derived from the compound M8, a constitutional unit derived from the compound M5 at a molar ratio of 45:5:50, according to the theoretical values calculated from the amounts of the charged raw materials.

The energy level of the lowest triplet excited state of the polymer compound HTL-8 was 2.33 eV.

<Synthesis Example HTL-9> Synthesis of Polymer Compound HTL-9

A polymer compound HTL-9 was synthesized according to a method described in International Publication WO 2016/125560 using the compound M18, the compound M8 and the compound M4. The polymer compound HTL-5 had an Mn of $3.6 \times 10^4$ and an Mw of $2.0 \times 10^5$.

The polymer compound HTL-9 is a copolymer constituted of a constitutional unit derived from the compound M18, a constitutional unit derived from the compound M8, a constitutional unit derived from the compound M4 at a molar ratio of 40:10:50, according to the theoretical values calculated from the amounts of the charged raw materials.

The energy level of the lowest triplet excited state of the polymer compound HTL-9 was 2.46 eV.

<Synthesis Example HTL-C1> Synthesis of Polymer Compound HTL-C1

A polymer compound HTL-C1 was synthesized with reference to a method described in International Publication WO 2016/031639 using the compound M19, the compound M4 and the compound M6. The polymer compound HTL-C1 had an Mn of $1.4 \times 10^4$ and an Mw of $2.7 \times 10^4$.

The polymer compound HTL-C1 is a copolymer constituted of a constitutional unit derived from the compound M19, a constitutional unit derived from the compound M4, a constitutional unit derived from the compound M6 at a molar ratio of 50:42.5:7.5, according to the theoretical values calculated from the amounts of the charged raw materials.

The energy level of the lowest triplet excited state of the polymer compound HTL-C1 was 2.28 eV.

<Synthesis Example HTL-C2> Synthesis of Polymer Compound HTL-C2

A polymer compound HTL-C2 was synthesized with reference to a method described in JP-A No. 2012-144722 using the compound M14, the compound M5, the compound M20 and the compound M3. The polymer compound HTL-C2 had an Mn of $5.0 \times 10^4$ and an Mw $2.5 \times 10^5$.

The polymer compound HTL-C2 is a copolymer constituted of a constitutional unit derived from the compound M14, a constitutional unit derived from the compound M5, a constitutional unit derived from the compound M20, a constitutional unit derived from the compound M3 at a molar ratio of 50:30:12.5:7.5, according to the theoretical values calculated from the amounts of the charged raw materials.

The energy level of the lowest triplet excited state of the polymer compound HTL-C2 was 2.16 eV.

<Synthesis Example G1> Synthesis of Metal Complexes G1 to G6

A metal complex G1 was synthesized according to a method described in JP-A No. 2013-237789.

A metal complex G2 was synthesized according to a method described in International Publication WO 2009/131255.

A metal complex G3 was synthesized with reference to a method described in International Publication WO 2011/032626.

A metal complex G4 was synthesized with reference to a method described in JP-A No. 2014-224101.

Metal complexes G5 and G6 were synthesized according to a method described in JP-A No. 2014-224101.

[Chemical Formula 98]

metal complex G1

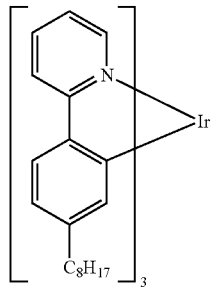

metal complex G2

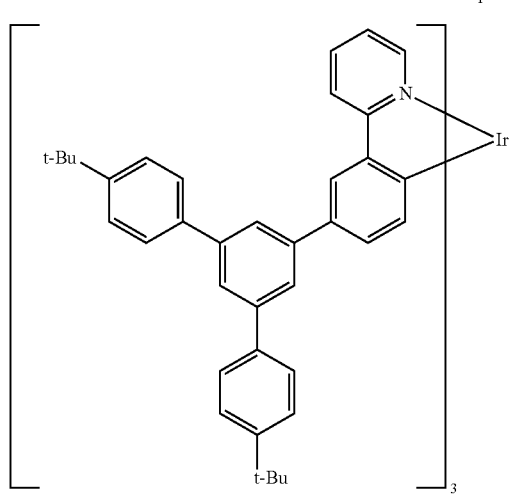

-continued metal complex G3

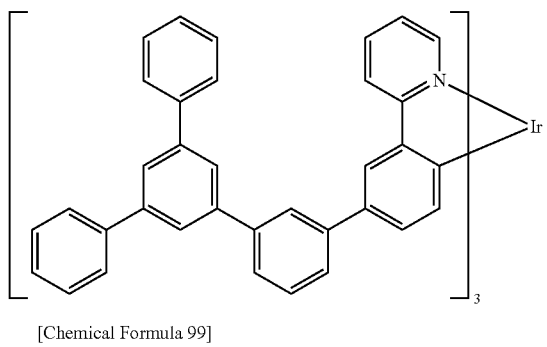

[Chemical Formula 99]

metal complex G4

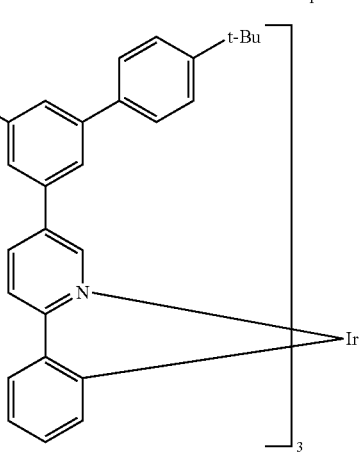

metal complex G5

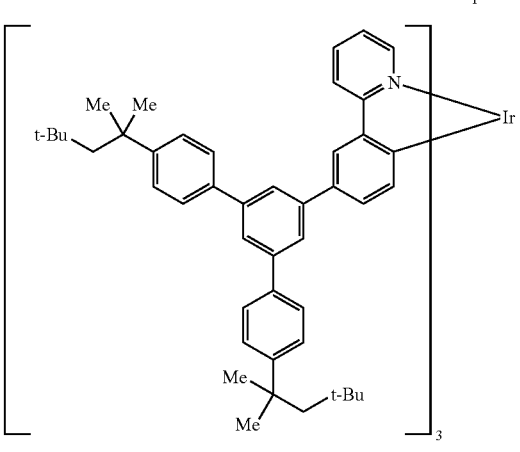

[Chemical Formula 100]

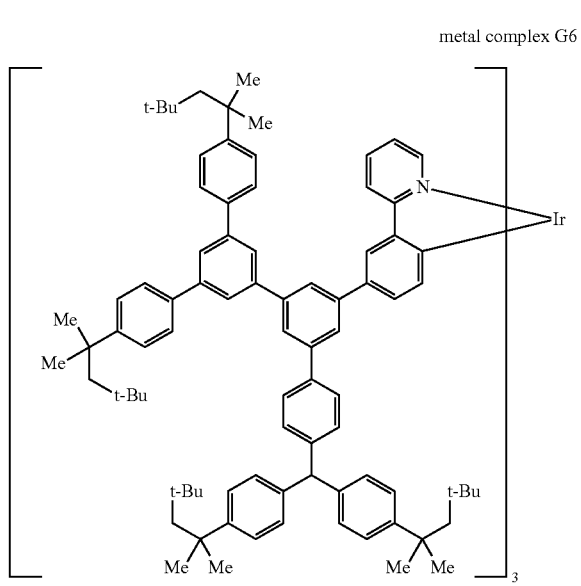

metal complex G6

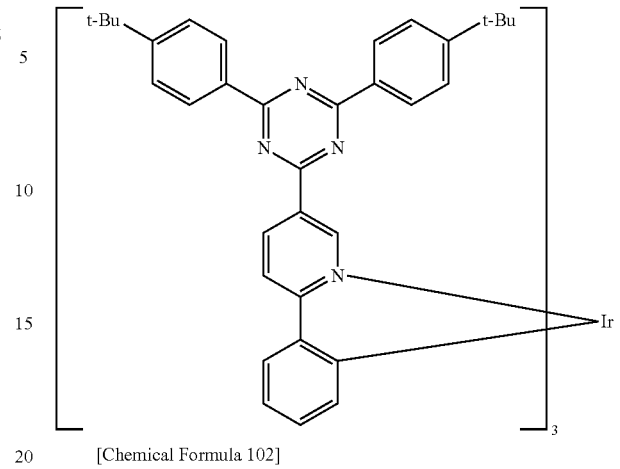

metal complex R2

[Chemical Formula 102]

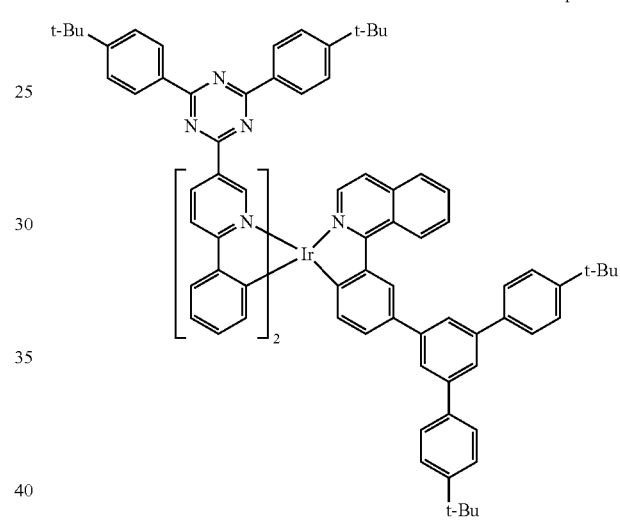

metal complex R3

<Synthesis Example R1> Synthesis of Metal Complexes R1 to R3

A metal complex R1 was synthesized with reference to a method described in JP-A No. 2006-188673.

A metal complex R2 was synthesized according to a method described in JP-A No. 2008-179617.

A metal complex R3 was synthesized according to a method described in JP-A No. 2011-105701.

[Chemical Formula 101]

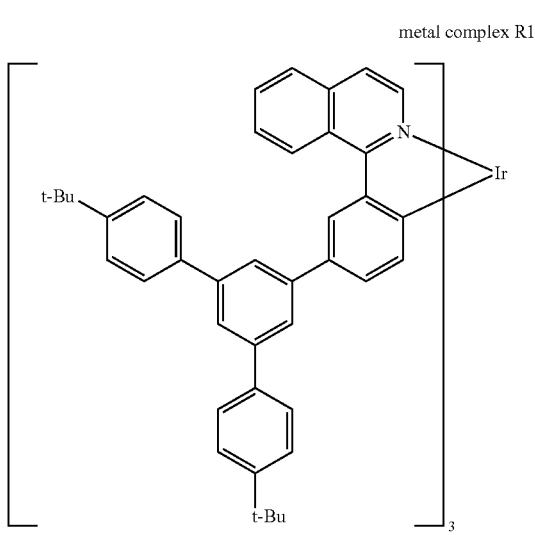

metal complex R1

<Synthesis Example H1> Synthesis and Acquisition of Compounds H1 to H6 and HC1 to HC4

A compound H1 was synthesized with reference to a method described in International Publication WO 2010/136109.

A compound H2 was synthesized with reference to a method described in International Publication WO 2014/115743.

A compound H3 was synthesized with reference to a method described in JP-A No. 2010-254676.

A compound H4 was synthesized with reference to a method described in International Publication WO 2011/070963.

A compound H5 was synthesized with reference to a method described in International Publication WO 2008/056746.

A compound H6 was purchased from Luminescence Technology Corp.

A compound H7 was synthesized with reference to a method described in International Publication WO 2006/114966.

Compounds HC1, HC3 and HC4 were purchased from Luminescence Technology Corp.

A compound HC2 was synthesized according to a method described in JP-A No. 2010-189630.
[Chemical Formula 103]
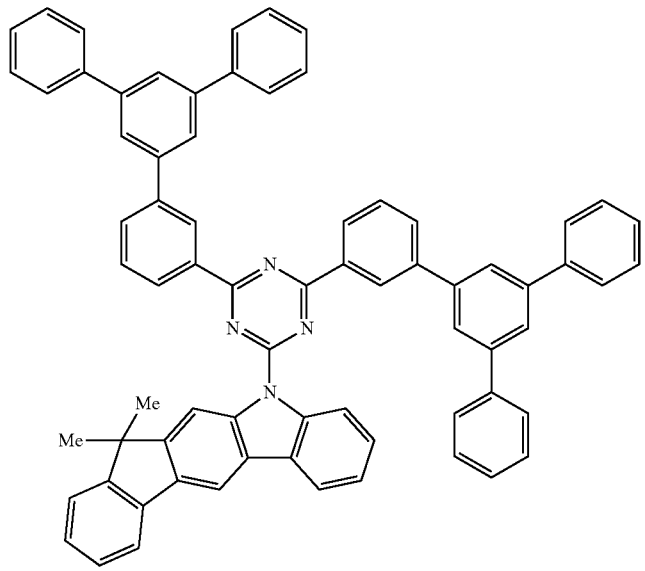
compound H1
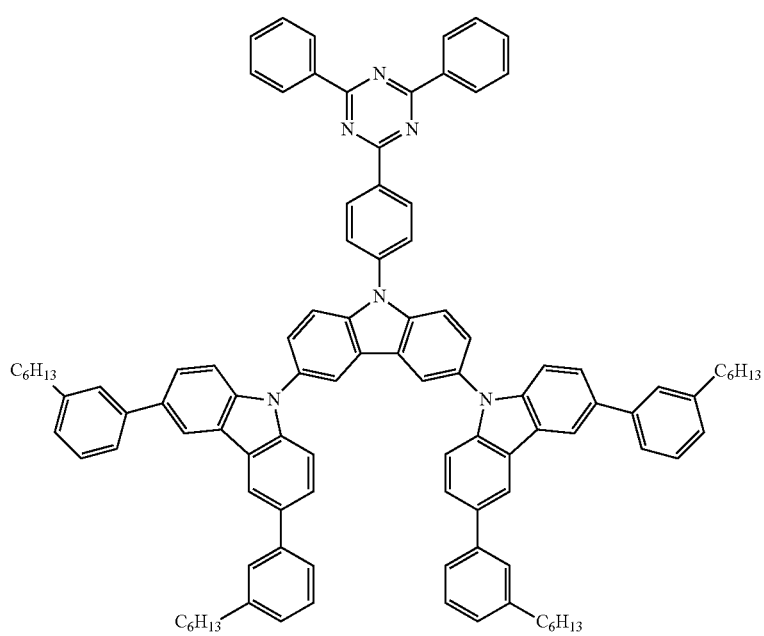
compound H2

[Chemical Formula 104]
compound H
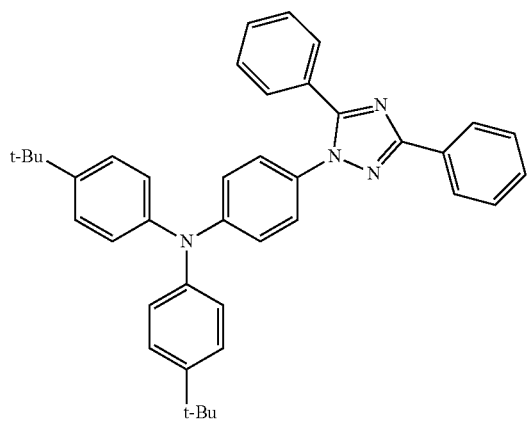
compound H4
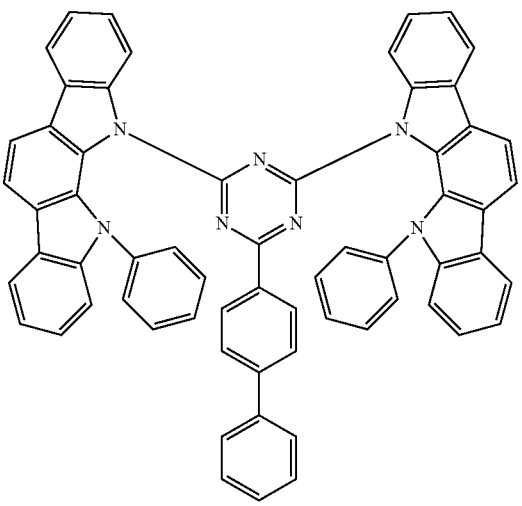
compound H5
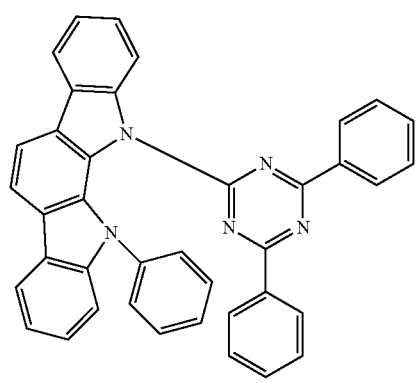
[Chemical Formula 105]
compound H6
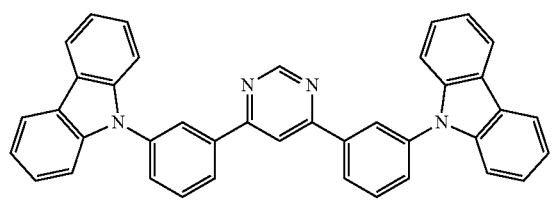
compound H7
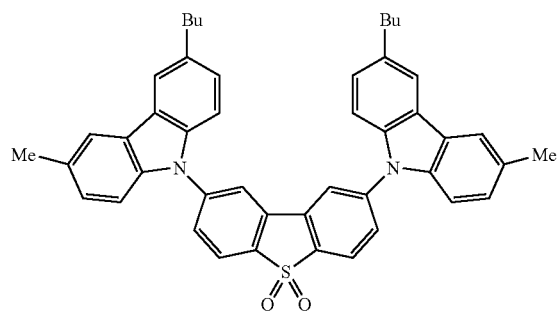

[Chemical Formula 106]

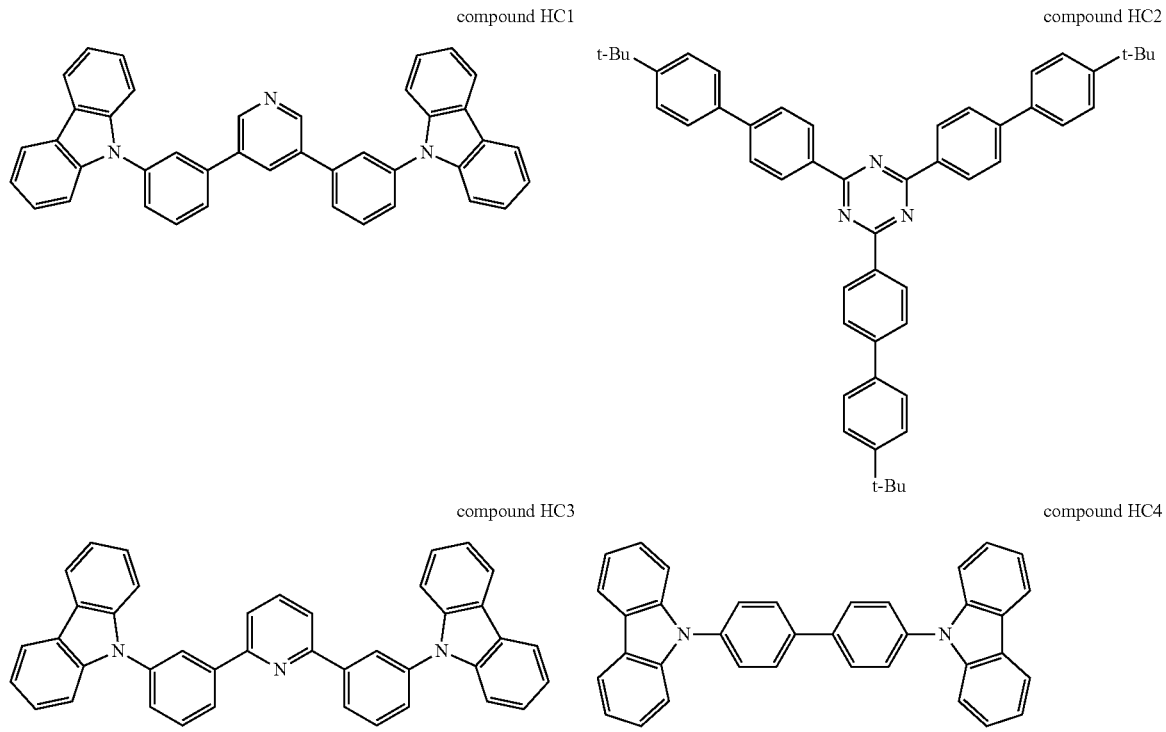

The value of ΔEST of the compound H1 was 0.130 eV.
The value of ΔEST of the compound H2 was 0.063 eV.
The value of ΔEST of the compound H3 was 0.576 eV.
The value of ΔEST of the compound H4 was 0.096 eV.
The value of ΔEST of the compound H5 was 0.066 eV.
The value of ΔEST of the compound H6 was 0.156 eV.
The value of ΔEST of the compound H7 was 0.322 eV.
The value of ΔEST of the compound HC1 was 0.448 eV.
The value of ΔEST of the compound HC2 was 0.872 eV.
The value of ΔEST of the compound HC3 was 0.451 eV.
The value of ΔEST of the compound HC4 was 0.591 eV.

<Example D1> Fabrication and Evaluation of Light Emitting Device D1

(Formation of Anode and Hole Injection Layer)

An ITO film was deposited with a thickness of 45 nm on a glass substrate by a sputtering method to form an anode. On the anode, a polythiophene-sulfonic acid type hole injection agent AQ-1200 (manufactured by Plextronics) was spin-coated to form a film with a thickness of 35 nm, and the film was heated on a hot plate at 170° C. for 15 minutes under an air atmosphere, to form a hole injection layer.

(Formation of Second Organic Layer)

The polymer compound HTL-1 was dissolved at a concentration of 0.6% by mass in xylene. The resultant xylene solution was spin-coated on the hole injection layer, to form a film with a thickness of 20 nm, and the film was heated on a hot plate at 180° C. for 60 minutes under a nitrogen gas atmosphere, to form a second organic layer. By this heating, the polymer compound HTL-1 became a crosslinked body.

(Formation of First Organic Layer)

The compound H1 and the metal complex G1 (compound H1/metal complex G1=70% by mass/30, by mass) were dissolved at a concentration of 1% by mass in toluene. The resultant toluene solution was spin-coated on the second organic layer to form a film with a thickness of 80 nm, and the film was heated at 130° C. for 10 minutes under a nitrogen gas atmosphere, to form a first organic layer.

(Formation of Cathode)

The substrate carrying the first organic layer formed was placed in a vapor deposition machine, and the pressure in the machine was reduced to 1.0×10−4 Pa or less, then, sodium fluoride was vapor-deposited with a thickness of about 4 nm on the first organic layer, then, aluminum was vapor-deposited with a thickness of about 80 nm on the sodium fluoride layer, as a cathode. After vapor deposition, sealing with a glass substrate was performed, to fabricate a light emitting device D1.

(Evaluation of Light Emitting Device)

Voltage was applied to the light emitting device D1, to observe EL emission. At a current density of 1 mA/cm$^2$, the external quantum efficiency was 10.0% and the CIE chromaticity coordinate (x,y)=(0.30,0.62). At a current density of 0.25 mA/cm$^2$, the external quantum efficiency was 10.3% and the CIE chromaticity coordinate (x,y)=(0.30,0.62).

<Example D2> Fabrication and Evaluation of Light Emitting Device D2

A light emitting device D2 was fabricated in the same manner as in Example D1, except that "the polymer compound HTL-2" was used instead of "the polymer compound HTL-1" in (Formation of second organic layer) of Example D1, and further, "the compound H1 and the metal complex G1 (compound H1/metal complex G1=70% by mass/30% by mass) were dissolved at a concentration of 3.3% by mass in xylene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device D2, to observe EL emission. At a current density of 1 mA/cm$^2$, the external quantum efficiency was 5.7% and the CIE chromaticity coordinate (x,y)=(0.33,0.61).

<Comparative Example CD1> Fabrication and Evaluation of Light Emitting Device CD1

A light emitting device CD1 was fabricated in the same manner as in Example D1, except that "the polymer compound HTL-C1" was used instead of "the polymer compound HTL-1" in (Formation of second organic layer) of Example D1, and further, "the compound H1 and the metal complex G1 (compound H1/metal complex G1=70% by mass/30, by mass) were dissolved at a concentration of 2.2% by mass in toluene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device CD1, to observe EL emission. At a current density of 1 mA/cm$^2$, the external quantum efficiency was 1.0% and the CIE chromaticity coordinate (x,y)=(0.35,0.58).

<Comparative Example CD2> Fabrication and Evaluation of Light Emitting Device CD2

A light emitting device CD2 was fabricated in the same manner as in Example D1, except that "the compound HC1 and the metal complex G1 (compound HC1/metal complex G1=70% by mass/30% by mass) were dissolved at a concentration of 2% by mass in chlorobenzene." instead of "the compound H1 and the metal complex G1 (compound H1/metal complex G1=70% by mass/30% by mass) were dissolved at a concentration of 2% by mass in toluene." in (Formation of first organic layer) of Example D1.

Voltage was applied to the light emitting device CD2, to observe EL emission. At a current density of 1 mA/cm$^2$, the external quantum efficiency was 1.4% and the CIE chromaticity coordinate (x,y)=(0.28,0.62).

<Example D3> Fabrication and Evaluation of Light Emitting Device D3

A light emitting device D3 was fabricated in the same manner as in Example D1, except that "the polymer compound HTL-3" was used instead of "the polymer compound HTL-1" in (Formation of second organic layer) of Example D1, and further, "the compound H1 and the metal complex G2 (compound H1/metal complex G2=70% by mass/30% by mass) were dissolved at a concentration of 2.2%, by mass in toluene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device D3, to observe EL emission. At a current density of 0.25 mA/cm$^2$, the external quantum efficiency was 18.0% and the CIE chromaticity coordinate (x,y)=(0.33,0.62).

<Example D4> Fabrication and Evaluation of Light Emitting Device D4

A light emitting device D4 was fabricated in the same manner as in Example D3, except that "the polymer compound HTL-4" was used instead of "the polymer compound HTL-3" in (Formation of second organic layer) of Example D3.

Voltage was applied to the light emitting device D4, to observe EL emission. At a current density of 0.25 mA/cm$^2$, the external quantum efficiency was 17.9% and the CIE chromaticity coordinate (x,y)=(0.32,0.63).

<Example D5> Fabrication and Evaluation of Light Emitting Device D5

A light emitting device D5 was fabricated in the same manner as in Example D3, except that "the polymer compound HTL-1" was used instead of "the polymer compound HTL-3" in (Formation of second organic layer) of Example D3.

Voltage was applied to the light emitting device D5, to observe EL emission. At a current density of 0.25 mA/cm$^2$, the external quantum efficiency was 22.5% and the CIE chromaticity coordinate (x,y)=(0.32,0.63).

TABLE 2

| | | second organic layer | | first organic layer | | | external quantum efficiency (%) (1 mA/cm$^2$) |
|---|---|---|---|---|---|---|---|
| | light emitting device | material | lowest triplet excited state | compound | metal complex | material ratio (% by mass) | |
| | | | $\Delta E_{ST}$ | | | | |
| Example D1 | D1 | crosslinked body of HTL-1 | 2.45 eV | H1 | 0.130 | G1 | 70/30 | 10.0 |
| Example D2 | D2 | crosslinked body of HTL-2 | 2.33 eV | H1 | 0.130 | G1 | 70/30 | 5.7 |
| Comparative Example CD1 | CD1 | crosslinked body of HTL-C1 | 2.28 eV | H1 | 0.130 | G1 | 70/30 | 1.0 |
| Comparative Example CD2 | CD2 | crosslinked body of HTL-2 | 2.33 eV | HC1 | 0.446 | G1 | 70/30 | 1.4 |

<Example D6> Fabrication and Evaluation of Light Emitting Device D6

A light emitting device D6 was fabricated in the same manner as in Example D3, except that "the polymer compound HTL-5" was used instead of "the polymer compound HTL-3" in (Formation of second organic layer) of Example D3.

Voltage was applied to the light emitting device D6, to observe EL emission. At a current density of 0.25 mA/cm², the external quantum efficiency was 20.3% and the CIE chromaticity coordinate (x,y)=(0.32,0.63).

<Example D7> Fabrication and Evaluation of Light Emitting Device D7

A light emitting device D7 was fabricated in the same manner as in Example D3, except that "the polymer compound HTL-6" was used instead of "the polymer compound HTL-3" in (Formation of second organic layer) of Example D3.

Voltage was applied to the light emitting device D7, to observe EL emission. At a current density of 0.25 mA/cm², the external quantum efficiency was 19.7% and the CIE chromaticity coordinate (x,y)=(0.32,0.63).

<Example D8> Fabrication and Evaluation of Light Emitting Device D8

A light emitting device D8 was fabricated in the same manner as in Example D3, except that "the polymer compound HTL-7" was instead of "the polymer compound HTL-3" in (Formation of second organic layer) of Example D3.

Voltage was applied to the light emitting device D8, to observe EL emission. At a current density of 0.25 mA/cm², the external quantum efficiency was 14.3% and the CIE chromaticity coordinate (x,y)=(0.32,0.63).

<Example D9> Fabrication and Evaluation of Light Emitting Device D9

A light emitting device D9 was fabricated in the same manner as in Example D3, except that "the polymer compound HTL-8" was used instead of "the polymer compound HTL-3" in (Formation of second organic layer) of Example D3.

Voltage was applied to the light emitting device D9, to observe EL emission. At a current density of 0.25 mA/cm², the external quantum efficiency was 14.8% and the CIE chromaticity coordinate (x,y)=(0.32,0.63).

<Example D10> Fabrication and Evaluation of Light Emitting Device D10

A light emitting device D10 was fabricated in the same manner as in Example D3, except that "the polymer compound HTL-2" was used instead of "the polymer compound HTL-3" in (Formation of second organic layer) of Example D3.

Voltage was applied to the light emitting device D10, to observe EL emission. At a current density of 0.25 mA/cm², the external quantum efficiency was 15.4% and the CIE chromaticity coordinate (x,y)=(0.32,0.63).

<Comparative Example CD3> Fabrication and Evaluation of Light Emitting Device CD3

A light emitting device DCD3 was fabricated in the same manner as in Example D3, except that "the polymer compound HTL-C2" was used instead of "the polymer compound HTL-3" in (Formation of second organic layer) of Example D3.

Voltage was applied to the light emitting device CD3, to observe EL emission. At a current density of 0.25 mA/cm², the external quantum efficiency was 6.4% and the CIE chromaticity coordinate (x,y)=(0.32,0.64).

<Comparative Example CD4> Fabrication and Evaluation of Light Emitting Device CD4

A light emitting device CD4 was fabricated in the same manner as in Example D1, except that "the polymer compound HTL-2" was instead of "the polymer compound HTL-1" in (Formation of second organic layer) of Example D1, and further, "the compound HC2 and the metal complex G2 (compound HC2/metal complex G2=70% by mass/30% by mass) were dissolved at a concentration of 2.5% by mass in chlorobenzene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device CD4, to observe EL emission. At a current density of 0.25 mA/cm², the external quantum efficiency was 3.3% and the CIE chromaticity coordinate (x,y)=(0.33,0.63).

TABLE 3

| | | second organic layer | | first organic layer | | | external |
|---|---|---|---|---|---|---|---|
| | light emitting device | material | lowest triplet excited state | compound $\Delta E_{ST}$ | metal complex | material ratio (% by mass) | quantum efficiency (%) (0.25 mA/cm²) |
| Example D3 | D3 | crosslinked body of HTL-3 | 2.69 eV | H1  0.130 | G2 | 70/30 | 18.0 |
| Example D4 | D4 | crosslinked body of HTL-4 | 2.49 eV | H1  0.130 | G2 | 70/30 | 17.9 |
| Example D5 | D5 | crosslinked body of HTL-1 | 2.45 eV | H1  0.130 | G2 | 70/30 | 22.5 |
| Example D6 | D6 | crosslinked body of HTL-5 | 2.37 eV | H1  0.130 | G2 | 70/30 | 20.3 |
| Example D7 | D7 | crosslinked body of HTL-6 | 2.36 eV | H1  0.130 | G2 | 70/30 | 19.7 |

TABLE 3-continued

| | light emitting device | second organic layer | | first organic layer | | | external quantum efficiency (%) |
|---|---|---|---|---|---|---|---|
| | | material | lowest triplet excited state $\Delta E_{ST}$ | compound | metal complex | material ratio (% by mass) | (0.25 mA/cm²) |
| Example D8 | D8 | crosslinked body of HTL-7 | 2.33 eV | H1 | 0.130 | G2 | 70/30 | 14.3 |
| Example D9 | D9 | crosslinked body of HTL-8 | 2.33 eV | H1 | 0.130 | G2 | 70/30 | 14.8 |
| Example D10 | D10 | crosslinked body of HTL-2 | 2.33 eV | H1 | 0.130 | G2 | 70/30 | 15.4 |
| Comparative Example CD3 | CD3 | crosslinked body of HTL-C2 | 2.16 eV | H1 | 0.130 | G2 | 70/30 | 6.4 |
| Comparative Example CD4 | CD4 | crosslinked body of HTL-2 | 2.33 eV | HC2 | 0.872 | G2 | 70/30 | 3.3 |

<Example D11> Fabrication and Evaluation of Light Emitting Device D11

A light emitting device D11 was fabricated in the same manner as in Example D1, except that "the compound H1 and the metal complex G3 (compound H1/metal complex G3=70-% by mass/30-*by mass) were dissolved at a concentration of 2.2% by mass in chlorobenzene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device D11, to observe EL emission. At a current density of 0.25 mA/cm², the external quantum efficiency was 19.3% and the CIE chromaticity coordinate (x,y)=(0.33,0.63).

<Example D12> Fabrication and Evaluation of Light Emitting Device D12

A light emitting device D12 was fabricated in the same manner as in Example D1, except that "the compound H1 and the metal complex G4 (compound H1/metal complex G4=70% by mass/30% by mass)" were used instead of "the compound H1 and the metal complex G3 (compound H1/metal complex G3=70% by mass/30% by mass)" in (Formation of first organic layer) of Example D11.

Voltage was applied to the light emitting device D12, to observe EL emission. At a current density of 0.25 mA/cm², the external quantum efficiency was 20.8% and the CIE chromaticity coordinate (x,y)=(0.43,0.56).

<Example D13> Fabrication and Evaluation of Light Emitting Device D13

A light emitting device D13 was fabricated in the same manner as in Example D1, except that "the compound H1 and the metal complex G5 (compound H1/metal complex G5=70% by mass/30% by mass)" were used instead of "the compound H1 and the metal complex G3 (compound H1/metal complex G3=70% by mass/30% by mass)" in (Formation of first organic layer) of Example D11.

Voltage was applied to the light emitting device D13, to observe EL emission. At a current density of 0.25 mA/cm, the external quantum efficiency was 22.3% and the CIE chromaticity coordinate (x,y)=(0.32,0.63).

<Example D14> Fabrication and Evaluation of Light Emitting Device D14

A light emitting device D14 was fabricated in the same manner as in Example D1, except that "the compound H1 and the metal complex G6 (compound H1/metal complex G6=70% by mass/30% by mass)" were used instead of "the compound H1 and the metal complex G3 (compound H1/metal complex G3=70% by mass/30% by mass)" in (Formation of first organic layer) of Example D11.

Voltage was applied to the light emitting device D14, to observe EL emission. At a current density of 0.25 mA/cm², the external quantum efficiency was 24.5% and the CIE chromaticity coordinate (x,y)=(0.30,0.64).

<Example D15> Fabrication and Evaluation of Light Emitting Device D15

A light emitting device D15 was fabricated in the same manner as in Example D1, except that "the compound H2 and the metal complex G2 (compound H2/metal complex G2=70% by mass/30% by mass) were dissolved at a concentration of 3.2% by mass in toluene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device D15, to observe EL emission. At a current density of 0.25 mA/cm², the external quantum efficiency was 14.2% and the CIE chromaticity coordinate (x,y)=(0.30,0.64).

<Example D16> Fabrication and Evaluation of Light Emitting Device D16

A light emitting device D16 was fabricated in the same manner as in Example D1, except that "the compound H3 and the metal complex G2 (compound H3/metal complex G2=70% by mass/30% by mass) were dissolved at a concentration of 2.2% by mass in toluene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device D16, to observe EL emission. At a current density of 0.25 mA/cm², the external quantum efficiency was 7.3% and the CIE chromaticity coordinate (x,y)=(0.29,0.65).

<Example D17> Fabrication and Evaluation of Light Emitting Device D17

A light emitting device D17 was fabricated in the same manner as in Example D1, except that "the compound H4 and the metal complex G2 (compound H4/metal complex G2=70% by mass/30% by mass) were dissolved at a concentration of 2.2% by mass in chlorobenzene." instead of "the compound H1 and the metal complex G1 (compound H1/metal complex G1=70% by mass/30% by mass) were dissolved at a concentration of 1 h by mass in toluene." in (Formation of second organic layer) of Example D1.

Voltage was applied to the light emitting device D17, to observe EL emission. At a current density of 0.25 mA/cm$^2$, the external quantum efficiency was 22.4% and the CIE chromaticity coordinate (x,y)=(0.32,0.63).

<Example D18> Fabrication and Evaluation of Light Emitting Device D18

A light emitting device D18 was fabricated in the same manner as in Example D1, except that "the compound H5 and the metal complex G2 (compound H5/metal complex G2=70% by mass/30% by mass) were dissolved at a concentration of 2.2% by mass in chlorobenzene." instead of "the compound H1 and the metal complex G1 (compound H1/metal complex G1=70% by mass/30% by mass) were dissolved at a concentration of 1, by mass in toluene." in (Formation of second organic layer) of Example D1.

Voltage was applied to the light emitting device D18, to observe EL emission. At a current density of 0.25 mA/cm$^2$, the external quantum efficiency was 14.8% and the CIE chromaticity coordinate (x,y)=(0.31,0.63).

<Example D19> Fabrication and Evaluation of Light Emitting Device D19

A light emitting device D19 was fabricated in the same manner as in Example D1, except that "the compound H6 and the metal complex G2 (compound H6/metal complex G2=70% by mass/30% by mass) were dissolved at a concentration of 2.2% by mass in toluene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device D19, to observe EL emission. At a current density of 0.25 mA/cm$^2$, the external quantum efficiency was 16.4% and the CIE chromaticity coordinate (x,y)=(0.32,0.63).

<Comparative Example CD5> Fabrication and Evaluation of Light Emitting Device CD5

A light emitting device CD5 was fabricated in the same manner as in Example D1, except that "the compound HC2 and the metal complex G3 (compound HC2/metal complex G3=70% by mass/30% by mass) were dissolved at a concentration of 2.2% by mass in chlorobenzene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device CD5, to observe EL emission. At a current density of 0.25 mA/cm$^2$, the external quantum efficiency was 1.3% and the CIE chromaticity coordinate (x,y)=(0.33,0.61).

<Example D20> Fabrication and Evaluation of Light Emitting Device D20

A light emitting device D20 was fabricated in the same manner as in Example D1, except that "the polymer compound HTL-8" was used instead of "the polymer compound HTL-1" in (Formation of second organic layer) of Example D1, and further, "the compound H5 and the metal complex G2 (compound H5/metal complex G2=70% by mass/30% by mass) were dissolved at a concentration of 2.2% by mass in chlorobenzene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device D20, to observe EL emission. At a current density of 0.25 mA/cm$^2$, the external quantum efficiency was 13.0% and the CIE chromaticity coordinate (x,y)=(0.31,0.64).

<Example D21> Fabrication and Evaluation of Light Emitting Device D21

A light emitting device D21 was fabricated in the same manner as in Example D1, except that "the polymer compound HTL-8" was used instead of "the polymer compound HTL-1" in (Formation of second organic layer) of Example D1, and further, "the compound H6 and the metal complex G2 (compound H6/metal complex G2=70% by mass/30% by mass) were dissolved at a concentration of 2% by mass in toluene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device D21, to observe EL emission. At a current density of 0.25 mA/cm$^2$, the external quantum efficiency was 11.4% and the CIE chromaticity coordinate (x,y)=(0.32,0.64).

<Comparative Example CD6> Fabrication and Evaluation of Light Emitting Device CD6

A light emitting device CD6 was fabricated in the same manner as in Example D1, except that "the polymer compound HTL-8" was used instead of "the polymer compound HTL-1" in (Formation of second organic layer) of Example D1, and further, "the compound HC3 and the metal complex G2 (compound HC3/metal complex G2=70% by mass/30% by mass) were dissolved at a concentration of 2% by mass in toluene." instead of "the compound H1 and the metal complex G1 (compound H1/metal complex G1=70% by mass/30% by mass) were dissolved at a concentration of 1% by mass in toluene." in (Formation of second organic layer) of Example D1.

Voltage was applied to the light emitting device CD6, to observe EL emission. At a current density of 0.25 mA/cm$^2$, the external quantum efficiency was 5.0% and the CIE chromaticity coordinate (x,y)=(0.31,0.64).

TABLE 4

| | light emitting device | second organic layer | | first organic layer | | | external quantum efficiency (%) (0.25 mA/cm²) |
|---|---|---|---|---|---|---|---|
| | | material | lowest triplet excited state | compound $\Delta E_{ST}$ | metal complex | material ratio (% by mass) | |
| Example D1 | D1 | crosslinked body of HTL-1 | 2.45 eV | H1 0.130 | G1 | 70/30 | 10.3 |
| Example D5 | D5 | crosslinked body of HTL-1 | 2.45 eV | H1 0.130 | G2 | 70/30 | 22.5 |
| Example D11 | D11 | crosslinked body of HTL-1 | 2.45 eV | H1 0.130 | G3 | 70/30 | 19.3 |
| Example D12 | D12 | crosslinked body of HTL-1 | 2.45 eV | H1 0.130 | G4 | 70/30 | 20.8 |
| Example D13 | D13 | crosslinked body of HTL-1 | 2.45 eV | H1 0.130 | G5 | 70/30 | 22.3 |
| Example D14 | D14 | crosslinked body of HTL-1 | 2.45 eV | H1 0.130 | G6 | 70/30 | 24.5 |
| Example D15 | D15 | crosslinked body of HTL-1 | 2.45 eV | H2 0.063 | G2 | 70/30 | 14.2 |
| Example D16 | D16 | crosslinked body of HTL-1 | 2.45 eV | H3 0.576 | G2 | 70/30 | 7.3 |
| Example D17 | D17 | crosslinked body of HTL-1 | 2.45 eV | H4 0.096 | G2 | 70/30 | 22.4 |
| Example D18 | D18 | crosslinked body of HTL-1 | 2.45 eV | H5 0.066 | G2 | 70/30 | 14.8 |
| Example D19 | D19 | crosslinked body of HTL-1 | 2.45 eV | H6 0.156 | G2 | 70/30 | 16.4 |
| Comparative Example CD5 | CD5 | crosslinked body of HTL-1 | 2.45 eV | HC2 0.872 | G3 | 70/30 | 1.3 |
| Example D9 | D9 | crosslinked body of HTL-8 | 2.33 eV | H1 0.130 | G2 | 70/30 | 14.8 |
| Example D20 | D20 | crosslinked body of HTL-8 | 2.33 eV | H5 0.066 | G2 | 70/30 | 13.0 |
| Example D21 | D21 | crosslinked body of HTL-8 | 2.33 eV | H6 0.156 | G2 | 70/30 | 11.4 |
| Comparative Example CD6 | CD6 | crosslinked body of HTL-8 | 2.33 eV | HC3 0.451 | G2 | 70/30 | 5.0 |

<Example D22> Fabrication and Evaluation of Light Emitting Device D22

(Formation of Anode and Hole Injection Layer)

An ITO film was deposited with a thickness of 45 nm on a glass substrate by a sputtering method to form an anode. On the anode, a polythiophene-sulfonic acid type hole injection agent AQ-1200 (manufactured by Plextronics) was spin-coated to form a film with a thickness of 65 nm, and the film was heated on a hot plate at 170° C. for 15 minutes under an air atmosphere, to form a hole injection layer.

(Formation of Second Organic Layer)

The polymer compound HTL-2 was dissolved at a concentration of 0.6% by mass in xylene. The resultant xylene solution was spin-coated on the hole injection layer, to form a film with a thickness of 20 nm, and the film was heated on a hot plate at 180° C. for 60 minutes under a nitrogen gas atmosphere, to form a second organic layer. By this heating, the polymer compound HTL-2 became a crosslinked body.

(Formation of First Organic Layer)

The compound H1 and the metal complex R1 (compound H1/metal complex R1=90% by weight/10% by mass) were dissolved at a concentration of 3.3% by mass in xylene. The resultant xylene solution was spin-coated on the second organic layer to form a film with a thickness of 80 nm, and the film was heated at 130° C. for 10 minutes under a nitrogen gas atmosphere, to form a first organic layer.

(Formation of Cathode)

The substrate carrying the first organic layer formed was placed in a vapor deposition machine, and the pressure in the machine was reduced to 1.0×10−4 Pa or less, then, sodium fluoride was vapor-deposited with a thickness of about 4 nm on the first organic layer, then, aluminum was vapor-deposited with a thickness of about 80 nm on the sodium fluoride layer, as a cathode. After vapor deposition, sealing with a glass substrate was performed, to fabricate a light emitting device D22.

(Evaluation of Light Emitting Device)

Voltage was applied to the light emitting device D22, to observe EL emission. At a current density of 1 mA/cm², the external quantum efficiency was 10.6% and the CIE chromaticity coordinate (x,y)=(0.67,0.33).

<Example D23> Fabrication and Evaluation of Light Emitting Device D23

A light emitting device D23 was fabricated in the same manner as in Example D22, except that "the polymer compound HTL-9" was used instead of "the polymer compound HTL-2" in (Formation of second organic layer) of Example D22.

Voltage was applied to the light emitting device D23, to observe EL emission. At a current density of 1 mA/cm², the external quantum efficiency was 12.3% and the CIE chromaticity coordinate (x,y)=(0.67,0.33).

<Example D24> Fabrication and Evaluation of Light Emitting Device D24

A light emitting device D24 was fabricated in the same manner as in Example D22, except that "the polymer compound HTL-1" was used instead of "the polymer compound HTL-2" in (Formation of second organic layer) of Example D22.

Voltage was applied to the light emitting device D24, to observe EL emission. At a current density of 1 mA/cm$^2$, the external quantum efficiency was 12.8% and the CIE chromaticity coordinate (x,y)=(0.67,0.33).

<Example D25> Fabrication and Evaluation of Light Emitting Device D25

A light emitting device D25 was fabricated in the same manner as in Example D22, except that "the polymer compound HTL-1" was used instead of "the polymer compound HTL-2" in (Formation of second organic layer) of Example D22, and further, "the compound H1 and the metal complex R2 (compound H1/metal complex R2=90% by mass/10% by mass)" were used instead of "the compound H1 and the metal complex R1 (compound H1/metal complex R1=90% by mass/10% by mass)" in (Formation of first organic layer) of Example D22.

Voltage was applied to the light emitting device D25, to observe EL emission. At a current density of 1 mA/cm$^2$, the external quantum efficiency was 20.4% and the CIE chromaticity coordinate (x,y)=(0.61,0.39).

<Example D26> Fabrication and Evaluation of Light Emitting Device D26

A light emitting device D26 was fabricated in the same manner as in Example D22, except that "the polymer compound HTL-1" was used instead of "the polymer compound HTL-2" in (Formation of second organic layer) of Example D22, and further, "the compound H1 and the metal complex R3 (compound H1/metal complex R3=90% by mass/10% by mass)" were used instead of "the compound H1 and the metal complex R1 (compound H1/metal complex R1=90% by mass/10% by mass)" in (Formation of first organic layer) of Example D22.

Voltage was applied to the light emitting device D26, to observe EL emission. At a current density of 1 mA/cm$^2$, the external quantum efficiency was 15.8% and the CIE chromaticity coordinate (x,y)=(0.65,0.35).

<Example D27> Fabrication and Evaluation of Light Emitting Device D27

A light emitting device D27 was fabricated in the same manner as in Example D22, except that "the polymer compound HTL-1" was used instead of "the polymer compound HTL-2" in (Formation of second organic layer) of Example D22, and further, "the compound H7 and the metal complex R1 (compound H7/metal complex R1=90$ by mass/10% by mass) were dissolved at a concentration of 2.2% by mass in toluene." instead of "the compound H1 and the metal complex R1 (compound H1/metal complex R1=90% by mass/10% by mass) were dissolved at a concentration of 3.3% by mass in xylene." in (Formation of first organic layer) of Example D22.

Voltage was applied to the light emitting device D27, to observe EL emission. At a current density of 1 mA/cm$^2$, the external quantum efficiency was 8.0% and the CIE chromaticity coordinate (x,y)=(0.67,0.33).

<Comparative Example CD7> Fabrication and Evaluation of Light Emitting Device CD7

A light emitting device CD7 was fabricated in the same manner as in Example D22, except that "the compound HC4 and the metal complex R1 (compound HC4/metal complex R1=90% by mass/10% by mass) were dissolved at a concentration of 2.5% by mass in chlorobenzene." instead of "the compound H1 and the metal complex R1 (compound H1/metal complex R1=90% by mass/10% by mass) were dissolved at a concentration of 3.3% by mass in xylene." in (Formation of first organic layer) of Example D22.

Voltage was applied to the light emitting device CD7, to observe EL emission. At a current density of 1 mA/cm$^2$, the external quantum efficiency was 2.0% and the CIE chromaticity coordinate (x,y)=(0.67,0.33).

<Comparative Example CD8> Fabrication and Evaluation of Light Emitting Device CD8

A light emitting device CD8 was fabricated in the same manner as in Example D22, except that "the compound HC2 and the metal complex R1 (compound HC2/metal complex R1=90% by mass/10% by mass) were dissolved at a concentration of 2.5% by mass in chlorobenzene." instead of "the compound H1 and the metal complex R1 (compound H1/metal complex R1=90% by mass/10% by mass) were dissolved at a concentration of 3.3% by mass in xylene." in (Formation of first organic layer) of Example D22.

Voltage was applied to the light emitting device CD8, to observe EL emission. At a current density of 1 mA/cm$^2$, the external quantum efficiency was 0.9% and the CIE chromaticity coordinate (x,y)=(0.66,0.34).

TABLE 5

| | light emitting device | second organic layer material | lowest triplet excited state | first organic layer compound | $\Delta E_{ST}$ | metal complex | material ratio (% by mass) | external quantum efficiency (%) (1 mA/cm$^2$) |
|---|---|---|---|---|---|---|---|---|
| Example D22 | D22 | crosslinked body of HTL-2 | 2.33 eV | H1 | 0.130 | R1 | 90/10 | 10.6 |
| Example D23 | D23 | crosslinked body of HTL-9 | 2.46 eV | H1 | 0.130 | R1 | 90/10 | 12.3 |
| Example D24 | D24 | crosslinked body of HTL-1 | 2.45 eV | H1 | 0.130 | R1 | 90/10 | 12.8 |
| Example D25 | D25 | crosslinked body of HTL-1 | 2.45 eV | H1 | 0.130 | R2 | 90/10 | 20.4 |
| Example D26 | D26 | crosslinked body of HTL-1 | 2.45 eV | H1 | 0.130 | R3 | 90/10 | 15.8 |

TABLE 5-continued

| | | second organic layer | | first organic layer | | | external quantum efficiency (%) |
|---|---|---|---|---|---|---|---|
| | light emitting device | material | lowest triplet excited state | compound | $\Delta E_{ST}$ | metal complex | material ratio (% by mass) | (1 mA/cm²) |
| Example D27 | D27 | crosslinked body of HTL-1 | 2.45 eV | H7 | 0.322 | R1 | 90/10 | 8.0 |
| Comparative Example CD7 | CD7 | crosslinked body of HTL-2 | 2.33 eV | HC4 | 0.591 | R1 | 90/10 | 2.0 |
| Comparative Example CD8 | CD8 | crosslinked body of HTL-2 | 2.33 eV | HC2 | 0.872 | R1 | 90/10 | 0.9 |

INDUSTRIAL APPLICABILITY

According to the present invention, a light emitting device excellent in external quantum efficiency can be provided.

The invention claimed is:

1. A light emitting device having an anode, a cathode, a first organic layer disposed between the anode and the cathode, and a second organic layer disposed between the anode and the cathode, wherein
the first organic layer is a layer containing a phosphorescent transition metal complex and a low molecular weight compound, wherein the low molecular weight compound contains no transition metal and satisfies at least one requirement selected from the group consisting of Requirement (I) and Requirement (II),
the second organic layer is a layer containing a cross-linked body of a polymer compound containing a constitutional unit having a crosslinking group, and the energy level of the lowest triplet excited state of the polymer compound is 2.30 eV or more:
(I) the absolute value of the difference between the energy level of the lowest triplet excited state and the energy level of the lowest singlet excited state is less than 0.25 eV,
(II) represented by the formula (T-1),

(T-1)

wherein,
$n^{T1}$ represents an integer of 0 or more and 5 or less, and when a plurality of $n^{T1}$ are present, they may be the same or different,
$n^{T2}$ represents an integer of 1 or more and 10 or less,
$Ar^{T1}$ represents a substituted amino group or a monovalent hetero ring group, and the monovalent hetero ring group is a monovalent hetero ring group containing a nitrogen atom having no double bond in the ring and not containing a group represented by =N—, a group represented by —C(=O)—, a group represented by —S(=O)— and a group represented by —S(=O)$_2$— in the ring, and the foregoing groups optionally have a substituent, and when a plurality of $Ar^{T1}$ are present, they may be the same or different,
$L^{T1}$ represents an alkylene group, a cycloalkylene group, an arylene group, a divalent hetero ring group, a group represented by —NR$^{T1'}$—, an oxygen atom or a sulfur atom, and the foregoing groups optionally have a substituent, R$^{T1'}$ represents a hydrogen atom, an alkyl group, a cycloalkyl group, an aryl group or a monovalent hetero ring group, and the foregoing groups optionally have a substituent, and when a plurality of $L^{T1}$ are present, they may be the same or different,
$Ar^{T2}$ represents an aromatic hydrocarbon group or a hetero ring group, and the foregoing groups optionally have a substituent,
when all of $Ar^{T1}$ are each a substituted amino group or a group represented by the formula (T1-1A), $Ar^{T2}$ is a monocyclic hetero ring group containing two or more groups represented by =N— in the ring, a condensed-cyclic hetero ring group containing at least one group selected from the group consisting of a group represented by —C(=O)—, a group represented by —S(=O)—, a group represented by —S(=O)$_2$— and a group represented by =N— in the ring, an aromatic hydrocarbon group containing a group represented by —C(=O)— in the ring or an aromatic hydrocarbon group having an electron attracting group, and the foregoing groups optionally have a substituent,

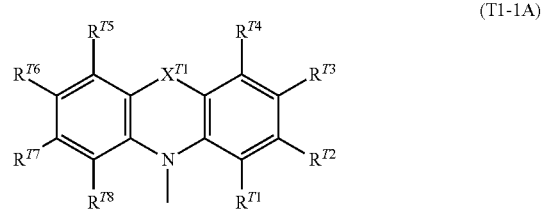

(T1-1A)

wherein,
$X^{T1}$ represents a single bond, an oxygen atom, a sulfur atom, a group represented by —N(R$^{XT1}$)— or a group represented by —C(R$^{XT1'}$)$_2$—, R$^{XT1}$ and R$^{XT1'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and the foregoing groups optionally have a substituent, and a plurality of R$^{XT1'}$ may be the same or different and may be combined together to form a ring together with atoms to which they are attached,
$R^{T1}$, $R^{T2}$, $R^{T3}$, $R^{T4}$, $R^{T5}$, $R^{T6}$, $R^{T7}$ and $R^{T8}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and the foregoing groups optionally have a substituent.

2. The light emitting device according to claim 1, wherein the energy level of the lowest triplet excited state of said polymer compound is 2.34 eV or more.

3. The light emitting device according to claim 1, wherein said crosslinking group is a crosslinking group selected from Group A of crosslinking group:

(Group A of crosslinking group)

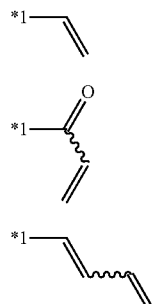
(XL-1)
(XL-2)
(XL-3)

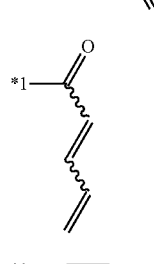
(XL-4)
(XL-5)
(XL-6)

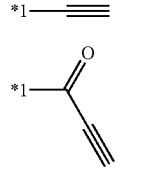
(XL-7)

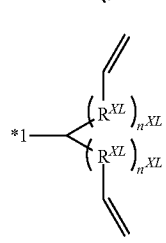
(XL-8)

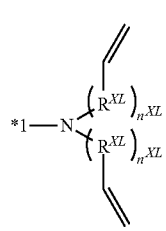
(XL-9)

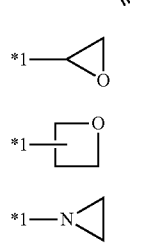
(XL-10)
(XL-11)

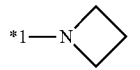
(XL-12)

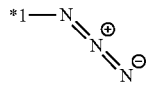
(XL-13)

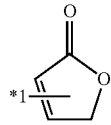
(XL-14)

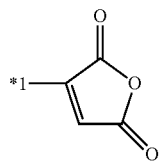
(XL-15)

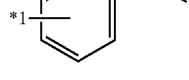
(XL-16)

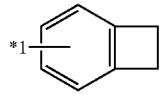
(XL-17)

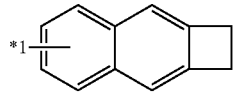
(XL-18)

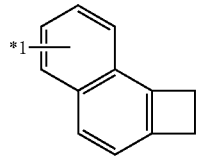
(XL-19)

wherein, $R^{XL}$ represents a methylene group, an oxygen atom or a sulfur atom, and $n^{XL}$ represents an integer of 0 to 5, and when a plurality of $R^{XL}$ are present, they may be the same or different, and when a plurality of $n^{XL}$ are present, they may be the same or different, *1 represents a binding position, the foregoing crosslinking groups optionally have a substituent, and when a plurality of the substituents are present, they may be combined together to form a ring together with carbon atoms to which they are attached.

4. The light emitting device according to claim 3, wherein said constitutional unit having a crosslinking group is a constitutional unit represented by the formula (2) or the formula (2'):

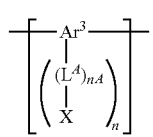
(2)

wherein, nA represents an integer of 0 to 5 and n represents 1 or 2, and when a plurality of nA are present, they may be the same or different, Ar³ represents an aromatic hydrocarbon group or a hetero ring group, and the foregoing groups optionally have a substituent, $L^A$ represents an alkylene group, a cycloalkylene group, an arylene group, a divalent hetero ring group, a group represented by —NR'—, an oxygen atom or a sulfur atom, and the foregoing groups optionally have a substituent, R' represents a hydrogen atom, an alkyl group, a cycloalkyl group, an aryl group or a monovalent hetero ring group, and the foregoing groups optionally have a substituent, and when a plurality of $L^A$ are present, they may be the same or different, X represents a crosslinking group selected from said Group A of crosslinking group, and when a plurality of X are present, they may be the same or different,

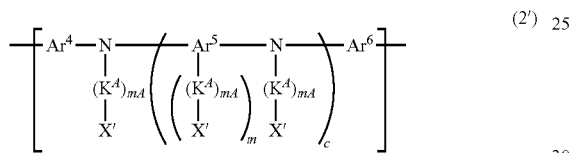

(2')

wherein, mA represents an integer of 0 to 5, m represents an integer of 1 to 4 and c represents 0 or 1, and when a plurality of mA are present, they may be the same or different, Ar⁵ represents an aromatic hydrocarbon group, a hetero ring group or a group in which at least one aromatic hydrocarbon ring and at least one hetero ring are bonded directly, and the foregoing groups optionally have a substituent, Ar⁴ and Ar⁶ each independently represent an arylene group or a divalent hetero ring group, and the foregoing groups optionally have a substituent, Ar⁴, Ar⁵ and Ar⁶ may be bonded directly or via an oxygen atom or a sulfur atom to groups other than these groups bonded to a nitrogen atom to which these groups are attached, to form a ring, respectively, $K^A$ represents an alkylene group, a cycloalkylene group, an arylene group, a divalent hetero ring group, a group represented by —NR'—, an oxygen atom or a sulfur atom, and the foregoing groups optionally have a substituent, R' represents the same meaning as described above, and when a plurality of $K^A$ are present, they may be the same or different, X' represents a crosslinking group selected from said Group A of crosslinking group, a hydrogen atom, an alkyl group, a cycloalkyl group, an aryl group or a monovalent hetero ring group, and the foregoing groups optionally have a substituent, and when a plurality of X' are present, they may be the same or different, and at least one X' is a crosslinking group selected from said Group A of crosslinking group.

5. The light emitting device according to claim 1, wherein at least one of said $Ar^{T1}$ is a group represented by the formula (T1-1):

(T1-1)

wherein, $X^{T1}$ represents the same meaning as described above,

Ring $R^{T1}$ and Ring $R^{T2}$ each independently represent an aromatic hydrocarbon ring not containing a group represented by —C(=O)— in the ring or a hetero ring not containing a group represented by =N—, a group represented by —C(=O)—, a group represented by —S(=O)— and a group represented by —S(=O)₂— in the ring, and the foregoing rings optionally have a substituent.

6. The light emitting device according to claim 5, wherein said group represented by the formula (T1-1) is a group represented by the formula (T1-1A), the formula (T1-1B), the formula (T1-1C) or the formula (T1-1D):

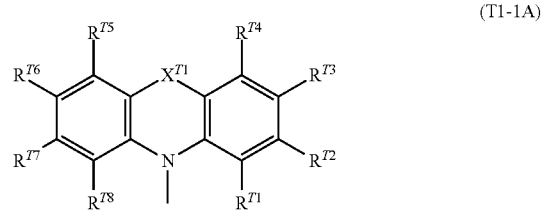

(T1-1A)

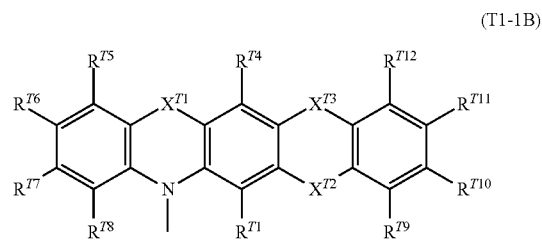

(T1-1B)

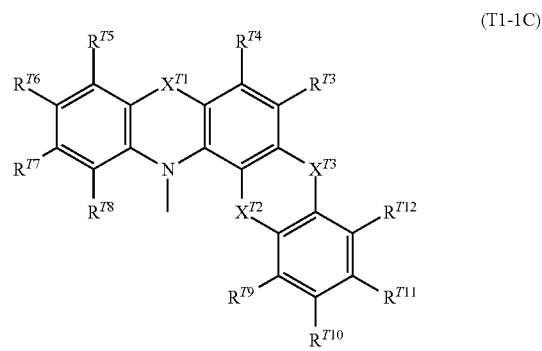

(T1-1C)

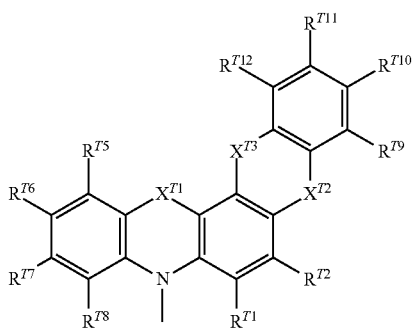

(T1-1D)

wherein, $X^{T1}$ represents the same meaning as described above, $X^{T2}$ and $X^{T3}$ each independently represent a single bond, an oxygen atom, a sulfur atom, a group represented by —N($R^{XT2}$)— or a group represented by —C($R^{XT2'}$)$_2$—, and $R^{XT2}$ and $R^{XT2'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and the foregoing groups optionally have a substituent, and a plurality of $R^{XT2'}$ may be the same or different and may be combined together to form a ring together with atoms to which they are attached, $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and the foregoing groups optionally have a substituent.

7. The light emitting device according to claim 1, wherein said $Ar^{T2}$ is a monocyclic hetero ring group containing two or more groups represented by =N— in the ring and optionally having a substituent.

8. The light emitting device according to claim 1, wherein said low molecular weight compound containing no transition metal satisfies said Requirement (I) and said Requirement (II).

9. The light emitting device according to claim 1, wherein said phosphorescent transition metal complex is a metal complex represented by the formula (1):

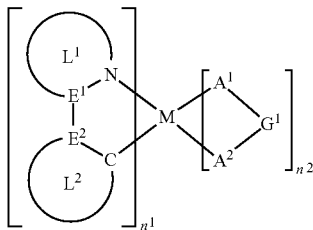

(1)

wherein,

M represents a ruthenium atom, a rhodium atom, a palladium atom, an iridium atom or a platinum atom, $n^1$ represents an integer of 1 or more, $n^2$ represents an integer of 0 or more, $n^1+n^2$ is 3 when M is a ruthenium atom, a rhodium atom or an iridium atom, while $n^1+n^2$ is 2 when M is a palladium atom or a platinum atom, $E^1$ and $E^2$ each independently represent a carbon atom or a nitrogen atom, at least one of $E^1$ and $E^2$ is a carbon atom, and when a plurality of $E^1$ and $E^2$ are present, they may be the same or different at each occurrence, Ring $L^1$ represents an aromatic hetero ring, and this ring optionally has a substituent, and when a plurality of the substituents are present, they may be combined together to form a ring together with atoms to which they are attached, and when a plurality of Ring $L^1$ are present, they may be the same or different, Ring $L^2$ represents an aromatic hydrocarbon ring or an aromatic hetero ring, and the foregoing rings optionally have a substituent, and when a plurality of the substituents are present, they may be combined together to form a ring together with atoms to which they are attached, and when a plurality of Ring $L^2$ are present, they may be the same or different, the substituent which Ring $L^1$ optionally has and the substituent which Ring $L^2$ optionally has may be combined together to form a ring together with atoms to which they are attached, $A^1$-$G^1$-$A^2$ represents an anionic bidentate ligand, $A^1$ and $A^2$ each independently represent a carbon atom, an oxygen atom or a nitrogen atom, and these atoms may be ring-constituent atoms, $G^1$ represents a single bond or an atomic group constituting a bidentate ligand together with $A^1$ and $A^2$, and when a plurality of $A^1$-$G^1$-$A^2$ are present, they may be the same or different.

10. The light emitting device according to claim 9, wherein said metal complex represented by the formula (1) is a metal complex represented by the formula (1-A):

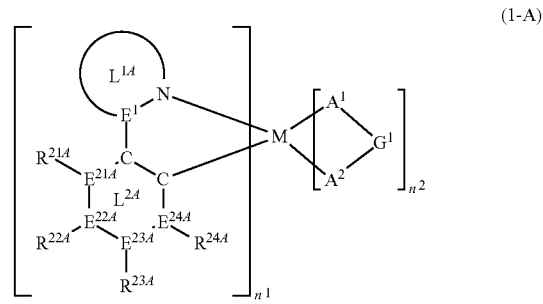

(1-A)

wherein,

M, $n^1$, $n^2$, $E^1$ and $A^1$-$G^1$-$A^2$ represent the same meaning as described above, Ring $L^{1A}$ represents a pyridine ring, a diazabenzene ring, an azanaphthalene ring, a diazanaphthalene ring, a triazole ring or a diazole ring, and the foregoing rings optionally have a substituent, and when a plurality of the substituents are present, they may be combined together to form a ring together with atoms to which they are attached, and when a plurality of Ring $L^{1A}$ are present, they may be the same or different, $E^{21A}$, $E^{22A}$, $E^{23A}$ and $E^{24A}$ each independently represent a nitrogen atom or a carbon atom, and when a plurality of $E^{21A}$, $E^{22A}$, $E^{23A}$ and $E^{24A}$ are present, they may be the same or different at each occurrence, and when $E^{21A}$ is a nitrogen atom, $R^{21A}$ is absent, and when $E^{22A}$ is a nitrogen atom, $R^{22A}$ is absent, and when $E^{23A}$ is a nitrogen atom, $R^{23A}$ is absent, and when $E^{24A}$ is a nitrogen atom, $R^{24A}$ is absent, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and the foregoing groups optionally have a substituent, and when a plurality of $R^{21A}$, $R^{22A}$, $R^{23A}$ and $R^{24A}$ are present, they may be the same or different at each occurrence, $R^{21A}$ and $R^{22A}$, $R^{22A}$ and $R^{23A}$, $R^{23A}$ and $R^{24A}$, and, the substituent which Ring $L^{1A}$ optionally has and $R^{21A}$ each may be combined together to form a ring together with atoms to which they are attached, and Ring $L^{2A}$ represents a benzene ring, a pyridine ring or a diazabenzene ring.

11. The light emitting device according to claim 10, wherein said metal complex represented by the formula (1-A) is a metal complex represented by the formula (1-B1), the formula (1-B2), the formula (1-B3), the formula (1-B4) or the formula (1-B5):

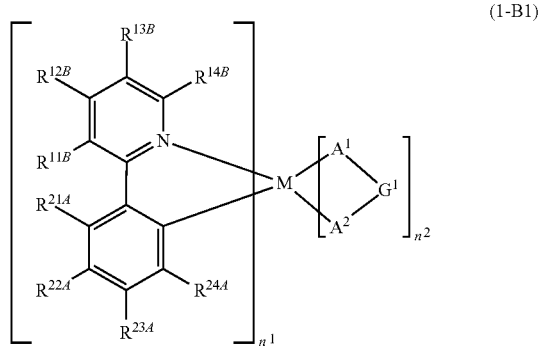
(1-B1)

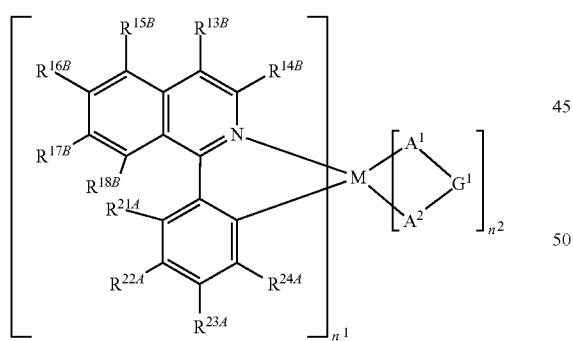
(1-B2)

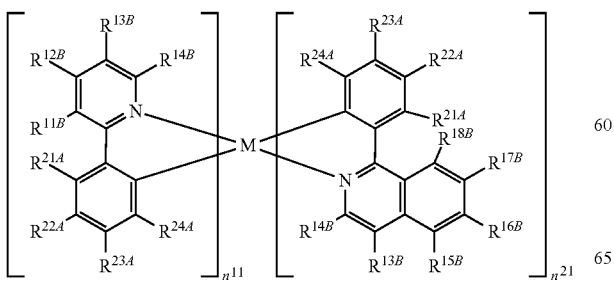
(1-B3)

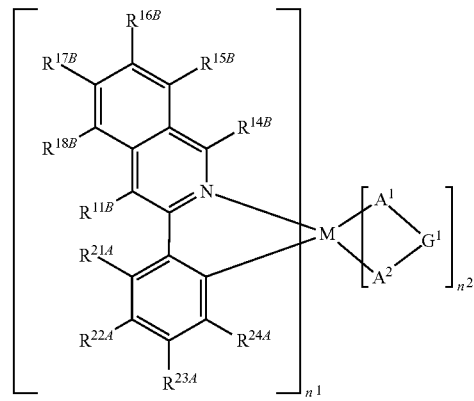
(1-B4)

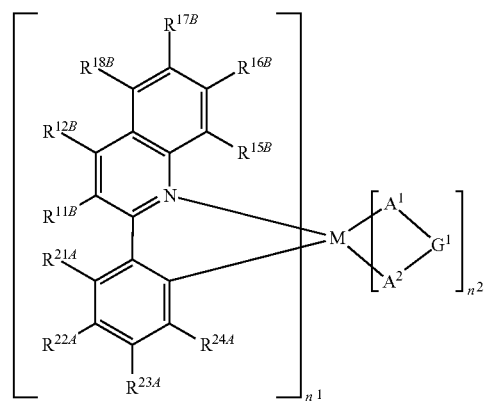
(1-B5)

wherein,

M, $n^1$, $n^2$, $R^{21A}$, $R^{22A}$, $R^{23A}$, $R^{24A}$ and $A^1$-$G^1$-$A^2$ represent the same meaning as described above, $n^{11}$ and $n^{12}$ each independently represent 1 or 2, $n^{11}$+$n^{12}$ is 3 when M is a ruthenium atom, a rhodium atom or an iridium atom, while $n^{11}$+$n^{12}$ is 2 when M is a palladium atom or a platinum atom, $R^{11B}$, $R^{12B}$, $R^{13B}$, $R^{14B}$, $R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and the foregoing groups optionally have a substituent, and when a plurality of $R^{11B}$, $R^{12B}$, $R^{13B}$, $R^{14B}$, $R^{15B}$, $R^{16B}$, $R^{17B}$ and $R^{18B}$ are present, they may be the same or different at each occurrence, and in the formula (1-B1), $R^{11B}$ and $R^{12B}$, $R^{12B}$ and $R^{13B}$, $R^{13B}$ and $R^{14B}$, and, $R^{11B}$ and $R^{21A}$ each may be combined together to form a ring together with atoms to which they are attached, and in the formula (1-B2), $R^{13B}$ and $R^{14B}$, $R^{13B}$ and $R^{15B}$, $R^{15B}$ and $R^{16B}$, $R^{16B}$ and $R^{17B}$, $R^{17B}$ and $R^{18B}$, and, $R^{18B}$ and $R^{21A}$ each may be combined together to form a ring together with atoms to which they are attached, and in the formula (1-B3), $R^{11B}$ and $R^{12B}$, $R^{12B}$ and $R^{13B}$, $R^{13B}$ and $R^{14B}$, $R^{11B}$ and $R^{21A}$, $R^{13B}$ and $R^{15B}$, $R^{15B}$ and $R^{16B}$, $R^{16B}$ and $R^{17B}$, $R^{17B}$ and $R^{18B}$, and, $R^{18B}$ and $R^{21A}$ each may be combined together to form a ring together with atoms to which they are attached, and in the formula (1-B4), $R^{11B}$ and $R^{18B}$, $R^{14B}$ and $R^{15B}$, $R^{15B}$ and $R^{16B}$, $R^{16B}$ and $R^{17B}$, $R^{17B}$ and $R^{18B}$, and, $R^{11B}$ and $R^{21A}$ each may be combined together to form a ring together with atoms to which they are attached, and in the formula (1-B5), $R^{11B}$ and $R^{12B}$, $R^{12B}$ and $R^{18B}$, $R^{15B}$ and $R^{16B}$, $R^{16B}$ and $R^{17B}$, $R^{17B}$ and $R^{18B}$, and, $R^{11B}$ and $R^{21A}$ each may be combined together to form a ring together with atoms to which they are attached.

12. The light emitting device according to claim 1, wherein said first organic layer further contains at least one selected from the group consisting of a hole transporting material, a hole injection material, an electron transporting material, an electron injection material, a fluorescent compound and an antioxidant.

13. The light emitting device according to claim 1, wherein said first organic layer and said second organic layer are adjacent.

14. The light emitting device according to claim 1, wherein said second organic layer is a layer disposed between said anode and said first organic layer.

\* \* \* \* \*